(12) United States Patent
Choi et al.

(10) Patent No.: US 12,148,861 B2
(45) Date of Patent: Nov. 19, 2024

(54) DISPLAY DEVICE AND METHOD OF FABRICATING THE SAME

(71) Applicant: Samsung Display Co., LTD., Yongin-si (KR)

(72) Inventors: Jin Woo Choi, Seoul (KR); Sung Kook Park, Suwon-si (KR); Sung Eun Baek, Suwon-si (KR); Byung Choon Yang, Seoul (KR); So Yeon Yoon, Uijeongbu-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 415 days.

(21) Appl. No.: 17/718,869

(22) Filed: Apr. 12, 2022

(65) Prior Publication Data

US 2023/0048544 A1 Feb. 16, 2023

(30) Foreign Application Priority Data

Aug. 12, 2021 (KR) .......................... 10-2021-0106378

(51) Int. Cl.
| | | |
|---|---|---|
| *H01L 33/38* | (2010.01) | |
| *H01L 27/15* | (2006.01) | |
| *H01L 33/00* | (2010.01) | |
| *H01L 33/42* | (2010.01) | |
| *H01L 33/62* | (2010.01) | |

(52) U.S. Cl.
CPC .......... *H01L 33/382* (2013.01); *H01L 27/156* (2013.01); *H01L 33/005* (2013.01); *H01L 33/42* (2013.01); *H01L 33/62* (2013.01); *H01L 2933/0016* (2013.01); *H01L 2933/0066* (2013.01)

(58) Field of Classification Search
CPC ... H01L 33/382; H01L 33/005; H01L 27/156; H01L 33/42; H01L 33/62; H01L 33/0016; H01L 2933/0066
USPC ........................................................ 257/211
See application file for complete search history.

(56) References Cited

U.S. PATENT DOCUMENTS

| 9,356,076 B2 * | 5/2016 | Wang .................. H10K 59/121 |
| 2021/0384180 A1 | 12/2021 | Choi et al. |
| 2022/0199725 A1 | 6/2022 | Choi et al. |

FOREIGN PATENT DOCUMENTS

| JP | 2005-173037 | 6/2005 |
| JP | 2020-80361 | 5/2020 |
| KR | 10-2022-0087669 | 6/2022 |

* cited by examiner

*Primary Examiner* — Tu-Tu V Ho
(74) *Attorney, Agent, or Firm* — KILE PARK REED & HOUTTEMAN PLLC

(57) ABSTRACT

A display device includes a pixel electrode disposed on a substrate and including a reflective electrode layer and an upper electrode layer, a contact electrode disposed on the pixel electrode, light-emitting elements disposed on the contact electrode and disposed perpendicular to the pixel electrode, a planarization layer disposed on the pixel electrode, the planarization layer filling a space between the light-emitting elements, and a common electrode disposed on the planarization layer and the light-emitting elements, and a size of the contact electrode is equal to a size of each of the light-emitting elements in a plan view, and the upper electrode layer is disposed on the reflective electrode layer and is in a polycrystalline phase.

20 Claims, 47 Drawing Sheets

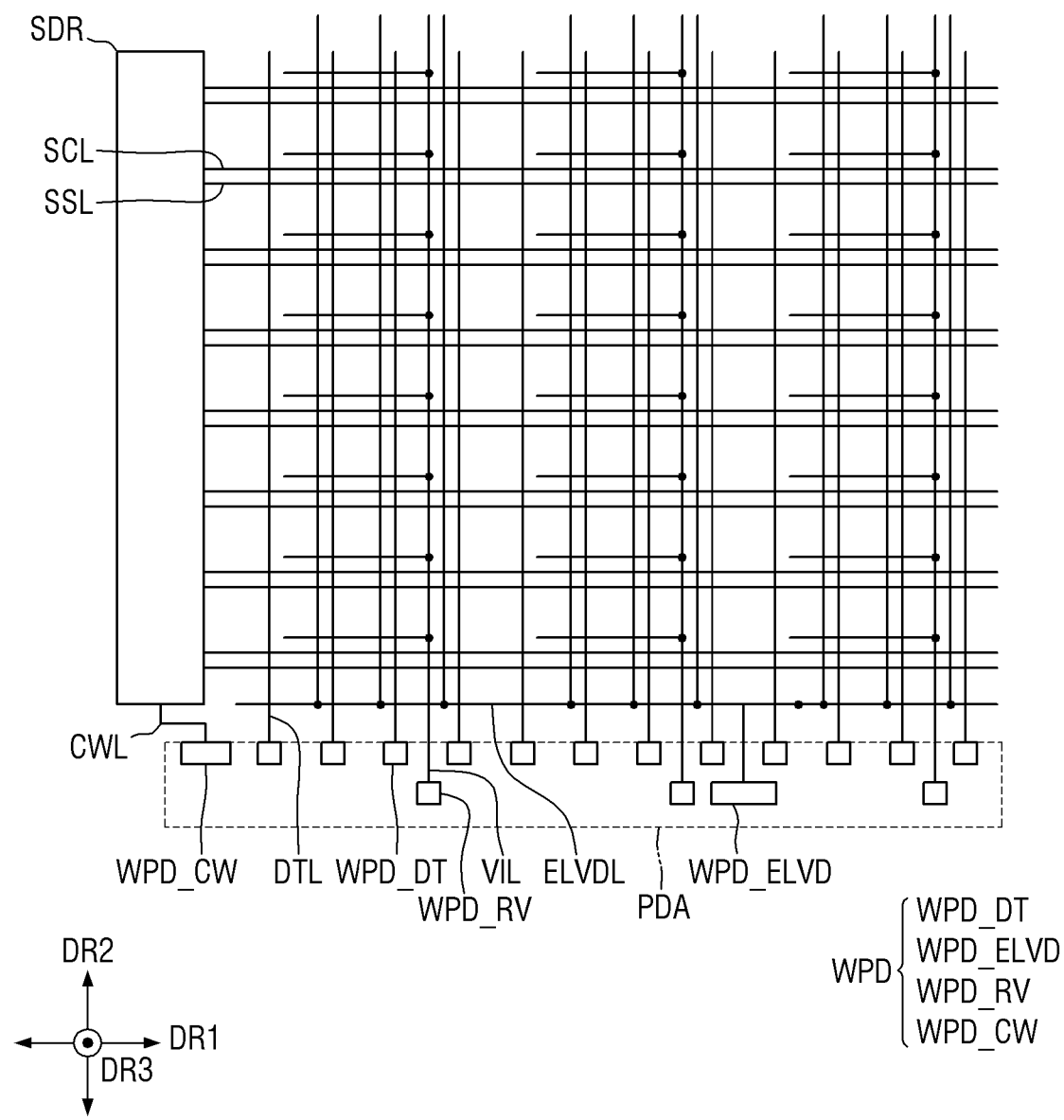

FIG. 9
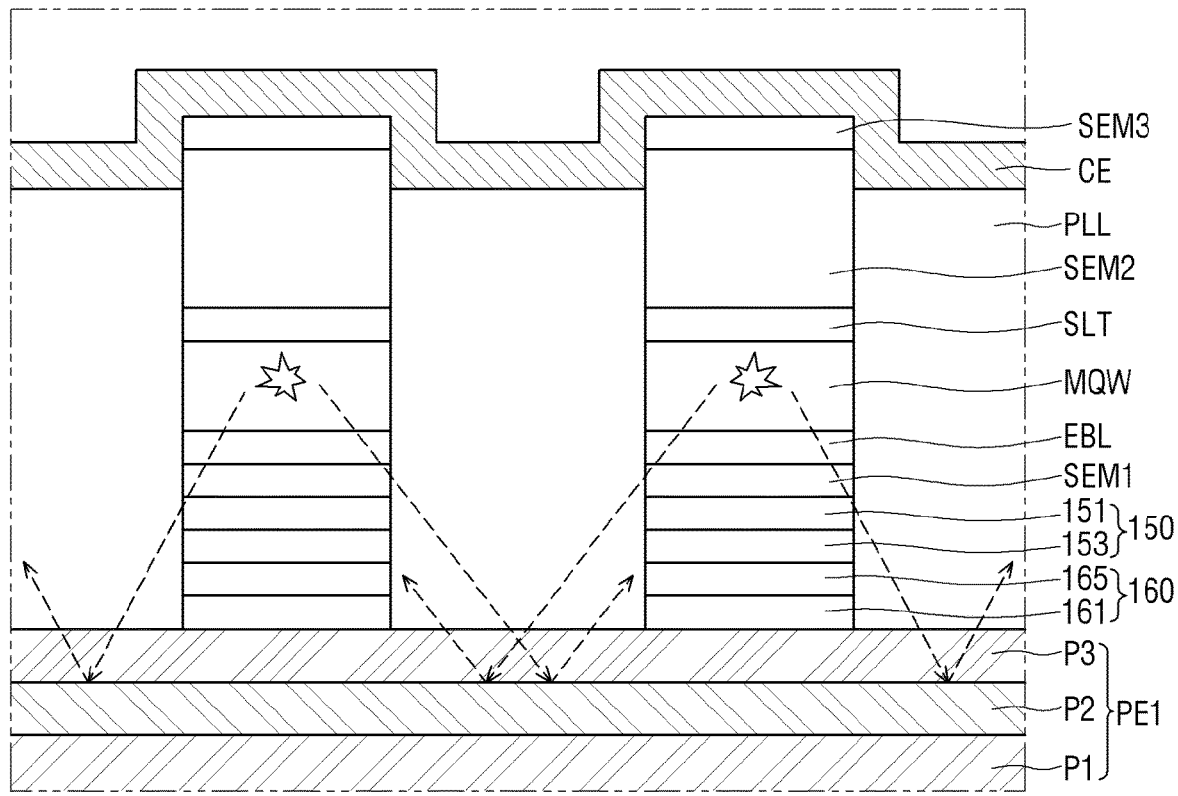
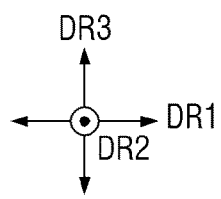

FIG. 19
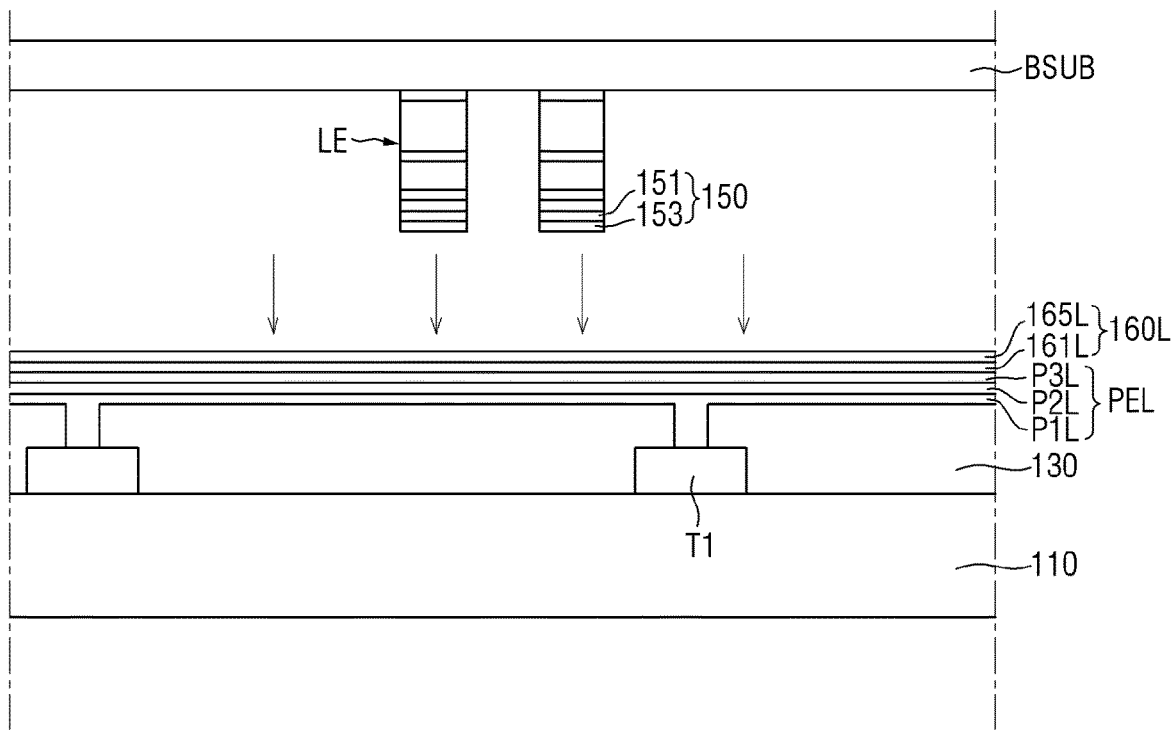
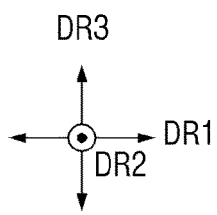

FIG. 22
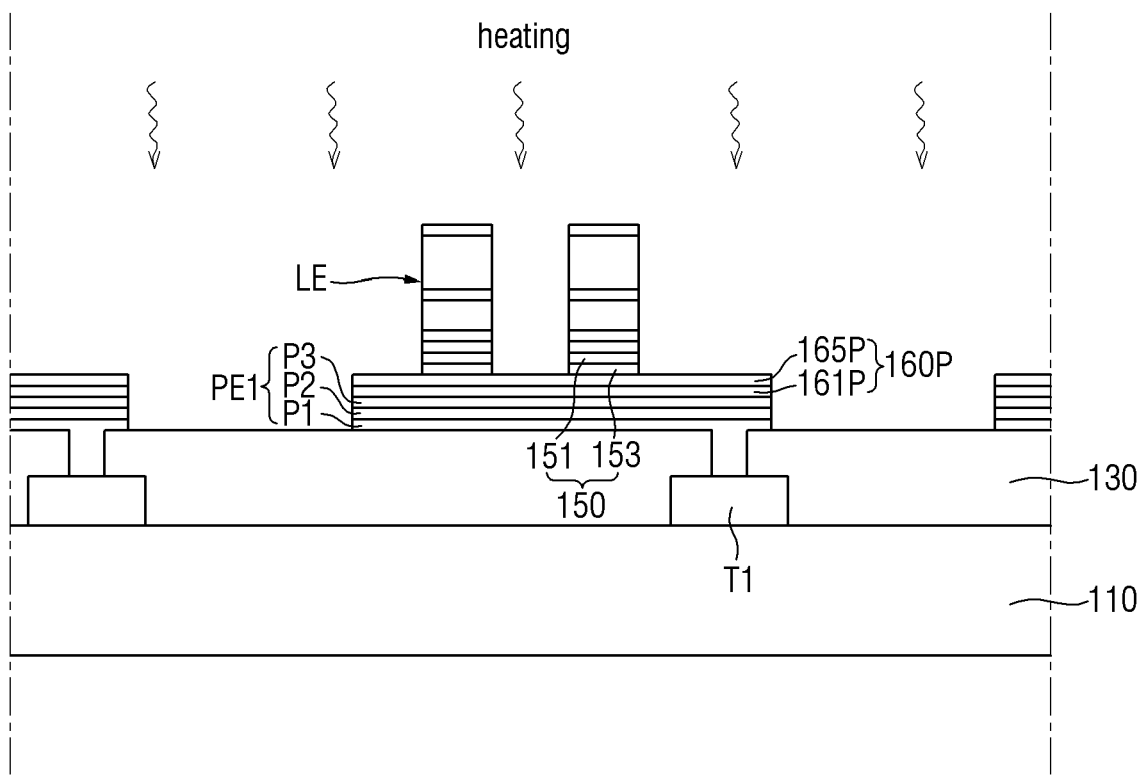
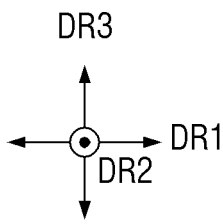

FIG. 24
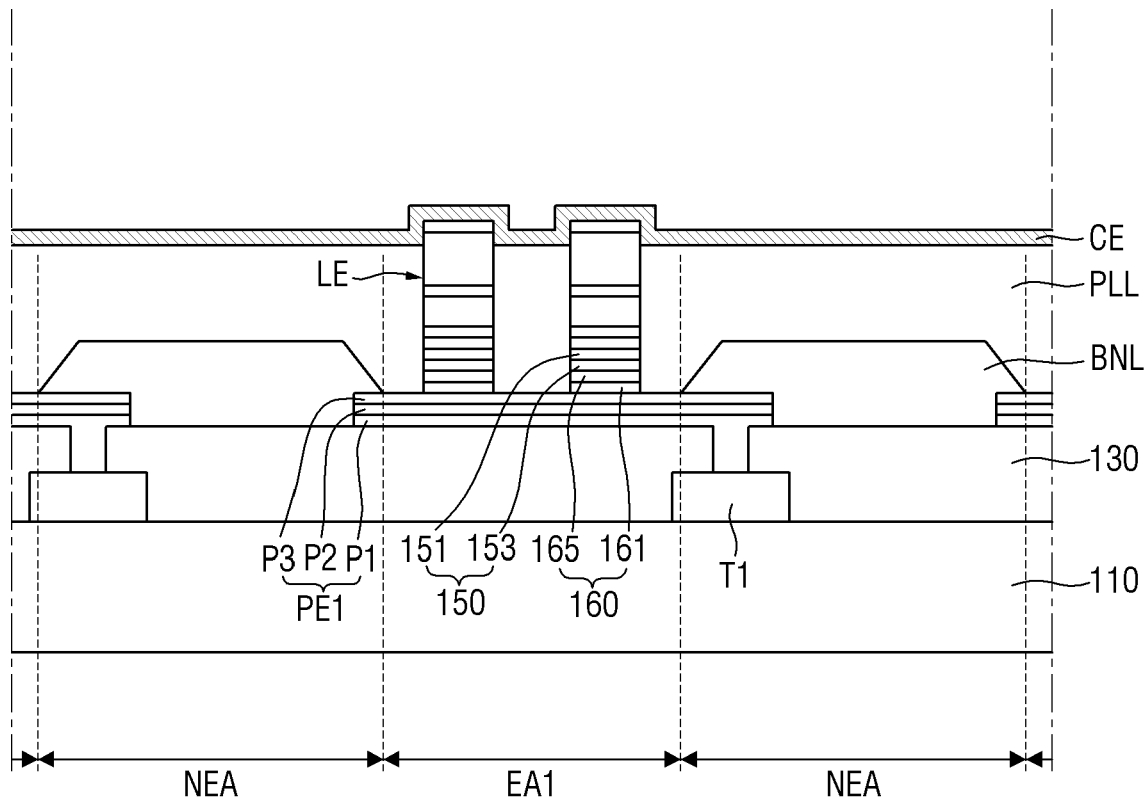
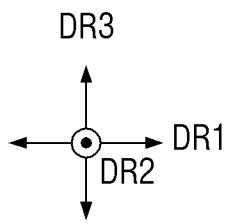

FIG. 25
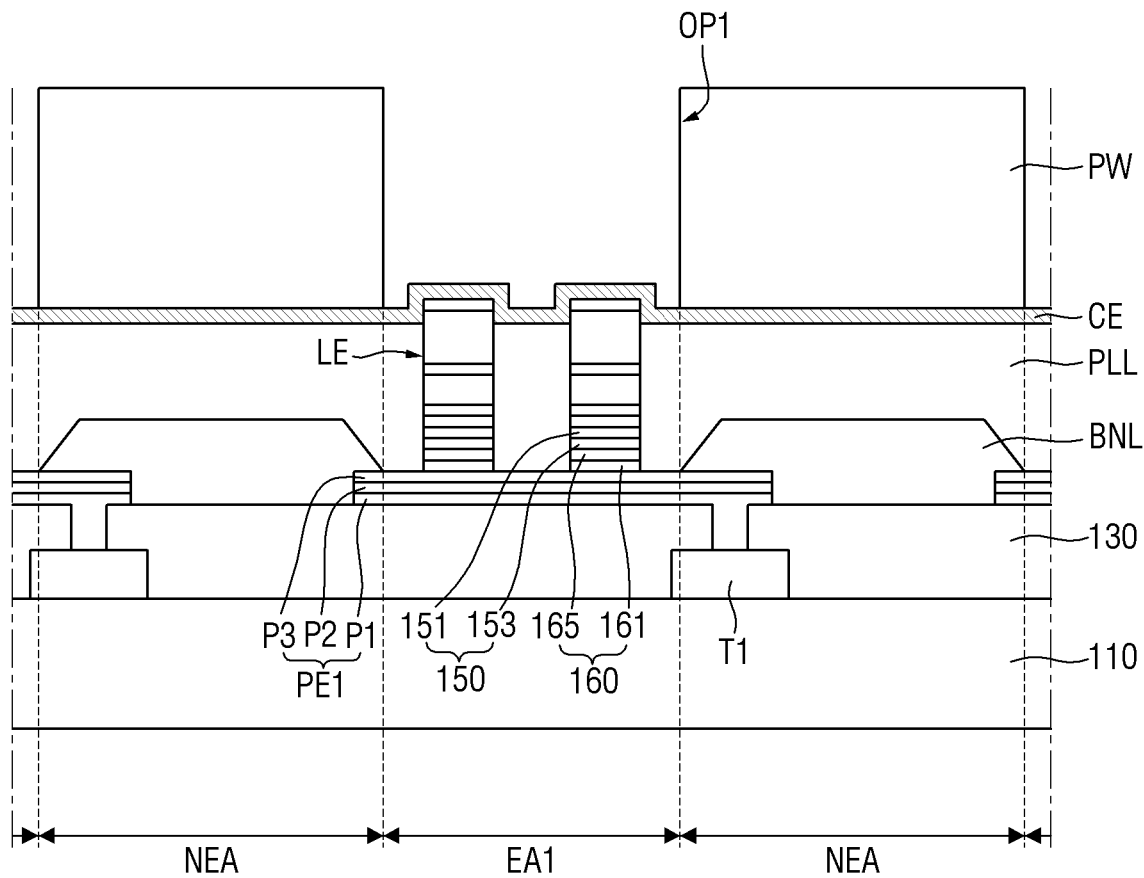
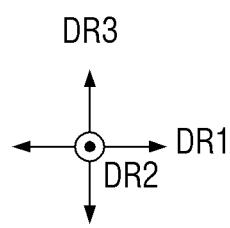

DISPLAY DEVICE AND METHOD OF FABRICATING THE SAME

CROSS-REFERENCE TO RELATED APPLICATION(S)

This application claims priority to and benefits of Korean Patent Application No. 10-2021-0106378 under 35 U.S.C. § 119 filed on Aug. 12, 2021 in the Korean Intellectual Property Office, the entire contents of which are incorporated herein by reference.

BACKGROUND

1. Technical Field

The disclosure relates to a display device and a method of fabricating the same.

2. Description of the Related Art

Display devices become more and more important as multimedia technology evolves. Accordingly, a variety of types of display devices such as organic light-emitting display (OLED) devices and liquid-crystal display (LCD) devices are currently used.

Display devices may include a display panel such as an organic light-emitting display panel and a liquid-crystal display panel for displaying images. Among them, light-emitting display panel may include light-emitting elements. For example, light-emitting diodes (LEDs) may include an organic light-emitting diode (OLED) using an organic material as a luminescent material, and an inorganic light-emitting diode using an inorganic material as a luminescent material.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a display device capable of preventing damage to a pixel electrode and improving out-coupling efficiency, and a method of fabricating the same.

It should be noted that objects of the disclosure are not limited to the above-mentioned objects; and other objects will be apparent to those skilled in the art from the following descriptions.

According to an embodiment, the display device may include a pixel electrode disposed on a substrate and comprising a reflective electrode layer; and an upper electrode layer; a contact electrode disposed on the pixel electrode; light-emitting elements disposed on the contact electrode and disposed perpendicular to the pixel electrode; a planarization layer disposed on the pixel electrode, the planarization layer filling a space between the light-emitting elements; and a common electrode disposed on the planarization layer and the light-emitting elements, wherein a size of the contact electrode may be equal to a size of each of the light-emitting elements in a plan view, and the upper electrode layer is disposed on the reflective electrode layer and may be in a polycrystalline phase.

In an embodiment, the contact electrode may include a first contact layer electrically contacting the upper electrode layer; and a second contact layer disposed on the first contact layer and electrically contacting the light-emitting elements.

In an embodiment, the upper electrode layer may include at least one of polycrystalline ITO, polycrystalline IZO, polycrystalline ZnO, polycrystalline ITZO, polycrystalline MgO and polycrystalline $TiO_2$, and the first contact layer may include titanium, and the second contact layer may include copper or gold.

In an embodiment, each of the light-emitting elements may include a connection electrode, and the connection electrode may include a connection layer electrically contacting the contact electrode and a reflective layer disposed on the connection layer.

In an embodiment, the connection layer may include an alloy of copper, silver and tin, and the reflective layer may include aluminum.

In an embodiment, a size of the connection electrode may be equal to a size of the contact electrode in a plan view.

In an embodiment, the display device may further include a bank overlapping an edge of the pixel electrode in a plan view and partitioning between an emission area and a non-emission area.

In an embodiment, sides of the contact electrode may be aligned with and coincide with sides of the light-emitting elements.

In an embodiment, the pixel electrode may include a lower electrode layer disposed below the reflective electrode layer, and the lower electrode layer and the upper electrode layer may include a same material.

According to an embodiment, the display device may include a pixel electrode disposed on a substrate and comprising a reflective electrode layer; and an upper electrode layer; a contact electrode disposed on the pixel electrode and comprising a first contact layer; and a second contact layer; light-emitting elements disposed on the contact electrode and disposed perpendicular to the pixel electrode; a planarization layer disposed on the pixel electrode, the planarization layer filling a space between the light-emitting elements; and a common electrode disposed on the planarization layer and the light-emitting elements, wherein a size of the first contact layer may be equal to a size of the pixel electrode in a plan view, and a size of the second contact layer may be equal to a size of each of the light-emitting elements in a plan view.

In an embodiment, the upper electrode layer may be disposed on the reflective electrode layer and may be in a polycrystalline phase.

In an embodiment, the first contact layer may electrically contact the upper electrode layer, and the second contact layer may electrically contact the light-emitting elements.

In an embodiment, the upper electrode layer may include at least one of polycrystalline ITO, polycrystalline IZO, polycrystalline ZnO, polycrystalline ITZO, polycrystalline MgO and polycrystalline $TiO_2$, and wherein the first contact layer may include titanium, and the second contact layer may include copper or gold.

In an embodiment, each of the light-emitting elements may include a connection electrode, and the connection electrode may include a connection layer electrically contacting the contact electrode and a reflective layer disposed on the connection layer.

In an embodiment, each of the light-emitting elements may include a first semiconductor layer disposed on the reflective layer; an active layer disposed on the first semiconductor layer; a second semiconductor layer disposed on the active layer; and a third semiconductor layer disposed on the second semiconductor layer.

In an embodiment, the light-emitting elements may at least partially protrude above the planarization layer.

According to an embodiment, a method of fabricating a display device may include forming light-emitting elements on a base substrate; forming a first substrate comprising a pixel electrode layer and a contact electrode layer; adhering the light-emitting elements to the contact electrode layer by attaching the base substrate to the first substrate; separating the base substrate from the light-emitting elements by irradiating the base substrate with a laser; forming a pixel electrode comprising a reflective electrode layer and an upper electrode layer and a contact electrode pattern by patterning the pixel electrode layer and the contact electrode layer, and converting the upper electrode layer into a polycrystalline phase; forming a contact electrode by etching the contact electrode pattern using the light-emitting elements as a mask; forming a planarization layer on the pixel electrode; and forming a common electrode on the planarization layer.

In an embodiment, the converting the upper electrode layer into the polycrystalline phase may include performing heat treatment on the first substrate at a temperature in a range of about 150 to about 200 degrees Celsius.

In an embodiment, the forming of the contact electrode may include masking the reflective electrode layer from an etchant using the polycrystalline upper electrode layer.

In an embodiment, the light-emitting elements may at least partially protrude above the planarization layer and may be electrically connected to the common electrode.

According to embodiments, each pixel electrode may include a reflective electrode layer in a display device, and thus light emitted from light-emitting elements can be reflected upward, to improve out-coupling efficiency.

A contact electrode is formed between a light-emitting element and a pixel electrode, and the contact electrode has the same size as that of the light-emitting element when viewed from the top (or in a plan view), so that it is possible to prevent light emitted from the light-emitting elements being absorbed by the contact electrode.

By forming an upper electrode layer in a polycrystalline phase in each pixel electrode, it is possible to prevent a reflective electrode layer of each pixel electrode from being etched by an etchant.

It should be noted that effects of the disclosure are not limited to those described above and other effects of the disclosure will be apparent to those skilled in the art from the following descriptions.

BRIEF DESCRIPTION OF THE DRAWINGS

The above and other aspects and features of the disclosure will become more apparent by describing in detail embodiments thereof with reference to the attached drawings, in which:

FIG. 2 is a schematic plan view of a circuit of a display substrate of a display device according to an embodiment.

FIG. 9 is a schematic cross-sectional view schematically showing light-emitting elements.

FIGS. 17 to 27 are schematic cross-sectional views for illustrating the method of fabricating a display device according to an embodiment.

DETAILED DESCRIPTION OF THE EMBODIMENTS

Figure 1:
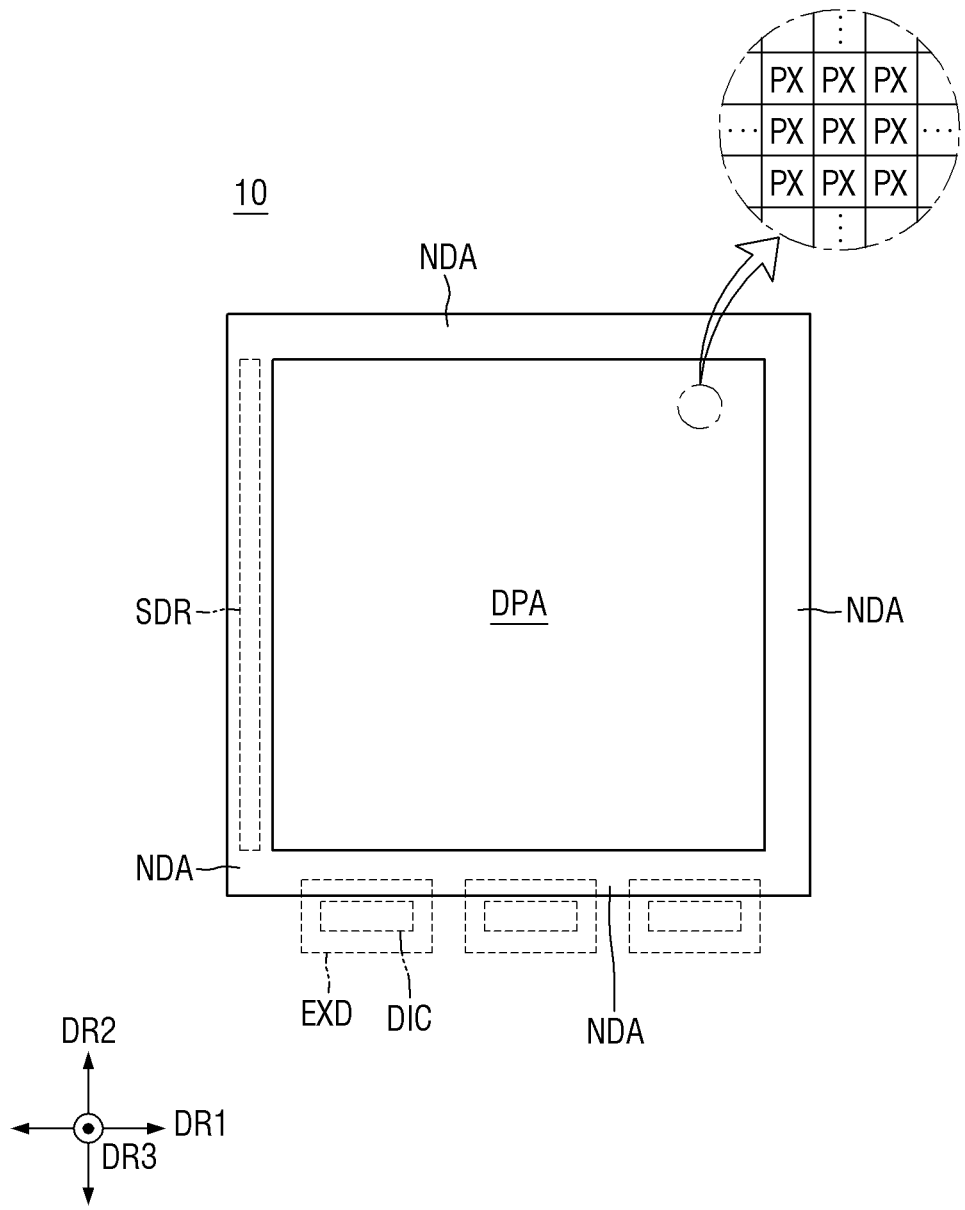
FIG. 1 is a schematic plan view of a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, sizes, thicknesses, ratios, and dimensions of the elements may be exaggerated for ease of description and for clarity. Like numbers refer to like elements throughout.

It will also be understood that when a layer is referred to as being "on" another layer or substrate, it can be directly on the other layer or substrate, or intervening layers may also be present. The same reference numbers indicate the same components throughout the specification.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Each of the features of the various embodiments of the disclosure may be combined or combined with each other, in part or in whole, and embodiments are possible. Each embodiment may be implemented independently of each other or may be implemented together in an association.

Hereinafter, embodiments of the disclosure will be described with reference to the accompanying drawings.

FIG. 1 is a schematic plan view of a display device according to an embodiment.

Referring to FIG. 1, a display device 10 according to an embodiment may be applied to, a smart phone, a mobile phone, a tablet PC, a personal digital assistant (PDA), a portable multimedia player (PMP), a television set, a game machine, a wristwatch-type electronic device, a head-mounted display, a personal computer monitor, a laptop computer, a car navigation system, a car instrument cluster, a digital camera, a camcorder, an outdoor billboard, an electronic billboard, various medical apparatuses, various home appliances such as a refrigerator and a laundry machine, Internet of things (IoT) devices, within the spirit and the scope of the disclosure. In the following description, a television is described as an example of the display device. TV may have a high resolution or ultra high resolution such as HD, UHD, 4K and 8K.

The display device 10 according to embodiments may be variously classified by the way in which images are displayed. Examples of the classification of display devices may include an organic light-emitting display device (OLED), an inorganic light-emitting display device (inorganic EL), a quantum-dot light-emitting display device (QED), a micro LED display device (micro-LED), a nano LED display device (nano-LED), a plasma display device (PDP), a field emission display device (FED) and a cathode ray display device (CRT), a liquid-crystal display device (LCD), an electrophoretic display device (EPD), within the spirit and the scope of the disclosure. In the following description, an organic light-emitting display device will be described as an example of the display device, and the organic light-emitting display device will be simply referred to as a display device unless it is necessary to discern it from others. It is, however, to be understood that embodiments are not limited to the organic light-emitting display device, and one of the above-listed display devices or any other display device may be employed without departing from the scope of the disclosure.

In the drawings, a first direction DR1 refers to the horizontal direction of a display device 10, a second direction DR2 refers to the vertical direction of the display device 10, and a third direction DR3 refers to the thickness direction of the display device 10. As used herein, the terms "left," "right," "upper" and "lower" sides refer to relative positions in case that the display device 10 is viewed from the top (or in a plan view). For example, the right side refers to one side or a side in the first direction DR1, the left side refers to the other side in the first direction DR1, the upper side refers to one side or a side in the second direction DR2, and the lower side refers to the other side in the second direction DR2. The upper portion refers to the side indicated by the arrow of the third direction DR3, while the lower portion refers to the opposite side in the third direction DR3.

According to an embodiment, the display device 10 may have a quadrate shape, for example, a square shape when viewed from the top (or in a plan view). In case that the display device 10 is a television, it may have a rectangular shape in which the longer sides are located in the horizontal direction. It should be understood, however, that the disclosure is not limited thereto. The longer side may be positioned in the vertical direction. For example, the display device 10 may be installed rotatably so that the longer sides are positioned in the horizontal or vertical direction variably. The display device 10 may have a circular or elliptical shape. It is to be understood that the shapes disclosed herein may include shapes substantially identical or similar to the shapes.

The display device 10 may include a display area DPA and a non-display area NDA. The display area DPA may be an active area where images are displayed. The display area DPA may have, but is not limited to, a square shape similar to the general shape of the display device 10 when viewed from the top (or in a plan view).

The display area DPA may include pixels PX. The pixels PX may be arranged (or disposed) in a matrix. The shape of each of the pixels PX may be, but is not limited to, a rectangle or a square when viewed from the top (or in a plan view). Each of the pixels PX may have a diamond shape having sides inclined with respect to a side of the display device 10. The pixels PX may include different color pixels PX. For example, the pixels PX may include, but is not limited to, a red first color pixel PX, a green second color pixel PX, and a blue third color pixel PX. The color pixels PX may be arranged alternately in a RGB stripe pattern or a PENTILE™ matrix.

The non-display area NDA may be disposed around the display area DPA. The non-display area NDA may surround or may be adjacent to the display area DPA entirely or partially. The display area DPA may have a square shape, and the non-display area NDA may be disposed to be adjacent to the four sides of the display area DPA. The non-display area NDA may form the bezel of the display device 10.

In the non-display areas NDA, a driving circuit or a driving element for driving the display area DPA may be disposed. According to an embodiment, pad areas may be located (or disposed) on the display substrate of the display device 10 in the non-display area NDA adjacent to a first side (the lower side in FIG. 1) of the display device 10, and external devices EXD may be mounted on pad electrodes of the pad areas. Examples of the external devices EXD may include a connection film, a printed circuit board, a driver chip DIC, a connector, a line connection film, within the spirit and the scope of the disclosure. A scan driver SDR formed on or directly formed on the display substrate of the display device 10 or the like may be disposed in the non-display area NDA adjacent to a second side (the left side in FIG. 1) of the display device 10.

FIG. 2 is a schematic plan view of a circuit of a display substrate of a display device according to an embodiment.

Referring to FIG. 2, lines is disposed on the first substrate. The lines may include a scan line SCL, a sensing signal line SSL, a data line DTL, an initialization voltage line VIL, a first supply voltage line ELVDL, within the spirit and the scope of the disclosure.

The scan line SCL and the sensing signal line SSL may be extended in the first direction DR1. The scan line SCL and the sensing signal line SSL may be connected to the scan driver SDR. The scan driver SDR may include a driving circuit. The scan driver SDR may be disposed on one side or a side of the non-display area NDA on the display substrate, but the disclosure is not limited thereto. The scan driver SDR may be disposed on both sides of the non-display area NDA. The scan driver SDR may be connected to a signal connection line CWL. At least one end or an end of the signal connection line CWL may form a pad WPD_CW on the first non-display area NDA and/or the second non-display area NDA and may be connected to an external device EXD (see FIG. 1).

The data line DTL and the initialization voltage line VIL may be extended in the second direction DR2 crossing or intersecting the first direction DR1. A first supply voltage line ELVDL may include a portion extending in the second direction DR2. The first supply voltage line ELVDL may further include a portion extending in the first direction DR1. The first supply voltage line ELVDL may have, but is not limited to, a mesh structure.

The wire pads WPD may be disposed at at least one end of the data line DTL, the initialization voltage line VIL, and the first supply voltage line ELVDL. The wire pads WPD may be disposed in the pad area PDA of the non-display area NDA. According to an embodiment, a wire pad WPD_DT of the data line DTL (hereinafter, referred to as a data pad), a wire pad WPD_RV of the initialization voltage line VIL (hereinafter referred to as the initialization voltage pad), and a wire pad WPD_ELVD of the first supply voltage line ELVDL (hereinafter referred to as a first supply voltage pad) may be disposed in the pad area PDA of the non-display area NDA. As another example, the data pad WPD_DT, the initialization voltage pad WPD_RV and the first supply voltage pad WPD_ELVD may be disposed in different non-display areas NDA. As described above, the external devices EXD (see FIG. 1) may be mounted on the wire pad WPD. The external devices EXD may be mounted on the wire pads WPD by an anisotropic conductive film, ultrasonic bonding, within the spirit and the scope of the disclosure.

Each of the pixels PX on the display substrate may include a pixel driving circuit. The above-described lines may pass through each of the pixels PX or the periphery thereof to apply a driving signal to the pixel driving circuit. The pixel driving circuit may include a transistor and a capacitor. The numbers of transistors and capacitors of each pixel driving circuit may be changed in a variety of ways. In the following description, the pixel driving circuit having a 3T1C structure including three transistors and one capacitor will be described as an example. It is, however, to be understood that the disclosure is not limited thereto. A variety of modified pixel structure may be employed such as a 2T1C structure, a 7T1C structure and a 6T1C structure.

Figure 3A:
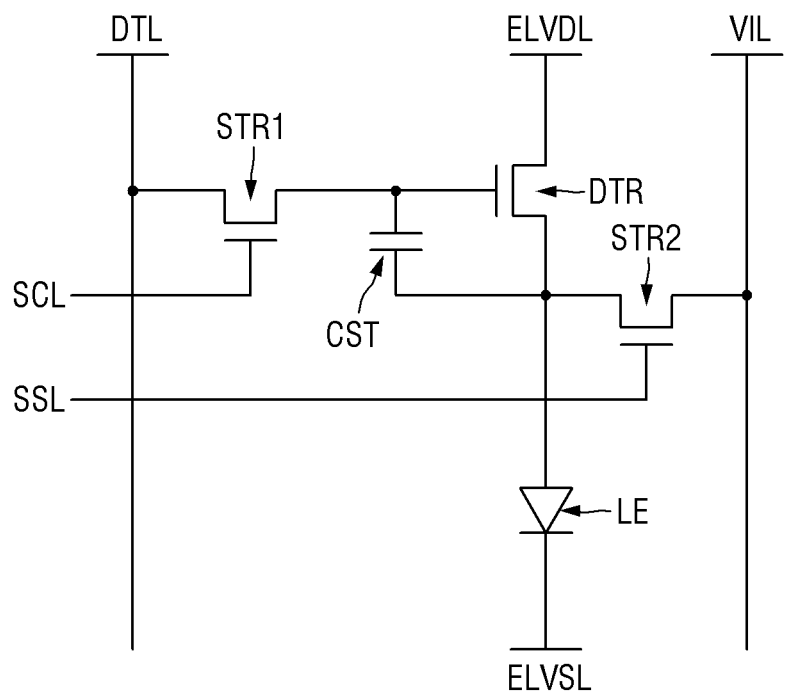
FIGS. 3A to 3C are schematic diagrams of equivalent circuits of a pixel of a display device according to an embodiment.

FIG. 3A is schematic diagram of an equivalent circuit of a pixel of a display device according to an embodiment.

Referring to FIG. 3A, each of the pixels PX of the display device according to an embodiment may include three transistors DTR, STR1 and STR2 and one capacitor for storage CST in addition to a light-emitting element LE.

The light-emitting element LE emits light in proportional to the current supplied through the driving transistor DTR. The light-emitting element LE may be implemented as an inorganic light-emitting diode, an organic light-emitting diode, a micro light-emitting diode, a nano light-emitting diode, within the spirit and the scope of the disclosure.

The first electrode (for example, the anode electrode) of the light-emitting element LE may be connected to the source electrode of the driving transistor DTR, and the second electrode (for example, the cathode electrode) thereof may be connected to a second supply voltage line ELVSL, from which a low-level voltage (second supply voltage) is applied, lower than a high-level voltage (first supply voltage) of a first supply voltage line ELVDL.

The driving transistor DTR adjusts a current flowing from the first supply voltage line ELVDL from which the first supply voltage is applied to the light-emitting element LE according to the voltage difference between a gate electrode and a source electrode. The gate electrode of the driving transistor DTR may be connected to a first electrode of the first transistor STR1, the source electrode may be connected to a first electrode of the light-emitting element LE, and the drain electrode may be connected to the first supply voltage line ELVDL from which the first supply voltage is applied.

The first transistor STR1 is turned on by a scan signal of a scan line SCL to connect a data line DTL with the gate electrode of the driving transistor DTR. A gate electrode of the first transistor STR1 may be connected to the scan line SCL, the first electrode thereof may be connected to the gate electrode of the driving transistor DTR, and a second electrode thereof may be connected to the data line DTL.

The second transistor STR2 may be turned on by a sensing signal of a sensing signal line SSL to connect the initialization voltage line VIL to the source electrode of the driving transistor DTR. A gate electrode of the second transistor ST2 may be connected to the sensing signal line SSL, a first electrode thereof may be connected to the initialization voltage line VIL, and a second electrode thereof may be connected to the source electrode of the driving transistor DTR.

According to an embodiment, the first electrode of each of the first and second transistors STR1 and STR2 may be a source electrode while the second electrode thereof may be a drain electrode. It is, however, to be understood that the disclosure is not limited thereto. The first electrode of each of the first and second switching transistors STR1 and STR2 may be a drain electrode while the second electrode thereof may be a source electrode.

The capacitor CST may be formed between the gate electrode and the source electrode of the driving transistor DTR. The storage capacitor CST stores a voltage difference between the gate voltage and the source voltage of the driving transistor DTR.

The driving transistor DTR and the first and second transistors STR1 and STR2 may be formed as thin-film transistors. Although FIG. 3A shows that each of the driving transistor DTR and the first and second switching transistors STR1 and STR2 is implemented as an n-type MOSFET (metal oxide semiconductor field effect transistor), it is to be noted that the disclosure is not limited thereto. For example, the driving transistor DTR and the first and second switching transistors STR1 and STR2 may be implemented as p-type MOSFETs, or some or a number of them may be implemented as n-type MOSFETs while the others may be implemented as p-type MOSFETs.

Figure 3B:
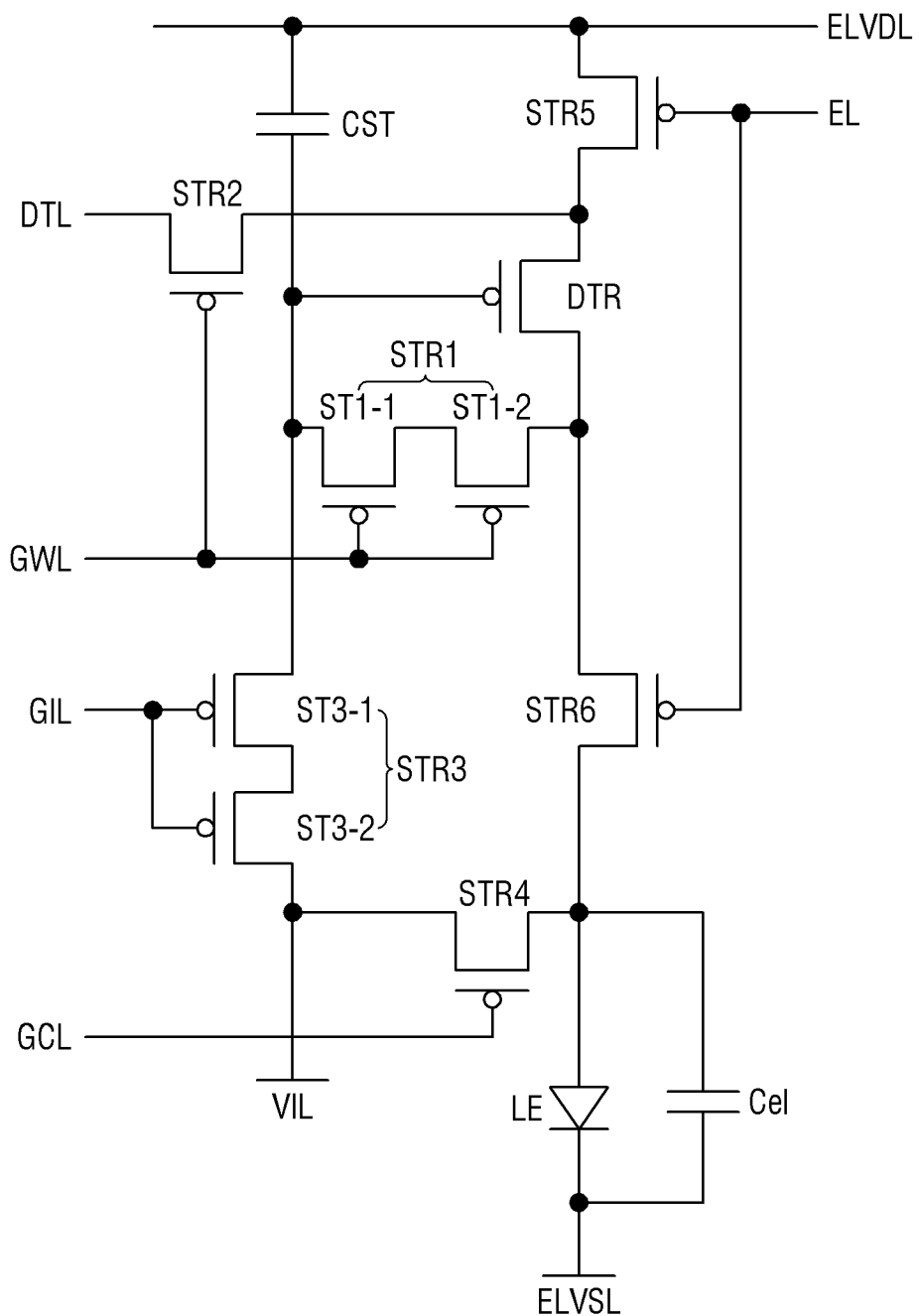

FIG. 3B is a schematic diagram of an equivalent circuit of a pixel of a display device according to an embodiment. Referring to FIG. 3B, the first electrode of the light-emitting element LE may be connected to the first electrode of the fourth transistor STR4 and the second electrode of the sixth transistor STR6, while the second electrode may be connected to the second supply voltage line ELVSL. A parasitic capacitance Cel may be formed between the first electrode and the second electrode of the light-emitting element LE. The first switching transistor STR1 may include two transistors ST1-1 and ST1-2, and the third switching transistor STR3 may include two transistors ST3-1 and ST3-2.

Each of the pixels PX may include a driving transistor DTR, switch elements, and a capacitor CST. The switch elements include first to sixth transistors STR1, STR2, STR3, STR4, STR5 and STR6.

The driving transistor DTR may include a gate electrode, a first electrode, and a second electrode. A drain-source current Ids (hereinafter referred to as "driving current") of driving transistor DTR flowing between the first electrode and the second electrode is controlled according to the data voltage applied to the gate electrode.

The capacitor CST is formed between the second electrode of the driving transistor DTR and the second supply voltage line ELVSL. One electrode of the capacitor CST may be connected to the gate electrode of the driving transistor DTR while the other electrode thereof may be connected to the first supply voltage line ELVDL.

In case that the first electrode of each of the first to sixth transistors STR1, STR2, STR3, STR4, STR5 and STR6 and the driving transistor DTR is the source electrode, the second electrode thereof may be the drain electrode. For example, in case that the first electrode of each of the first to sixth transistors STR1, STR2, STR3, STR4, STR5 and STR6 and the driving transistor DTR is the drain electrode, the second electrode thereof may be the source electrode.

The active layer of each of the first to sixth transistors STR1, STR2, STR3, STR4, STR5 and STR6 and the driving transistor DTR may be made of one of poly silicon, amorphous silicon and oxide semiconductor. In case that the semiconductor layer of each of the first to sixth transistors STR1 to STR6 and the driving transistor DTR is made of poly silicon, a low-temperature poly silicon (LTPS) process may be employed.

Although the first to sixth transistors STR1, STR2, STR3, STR4, STR5 and STR6 and the driving transistor DTR are of p-type metal oxide semiconductor field effect transistors (MOSFETs) in FIG. 3B, this is merely illustrative. They may be of n-type MOSFETs.

Moreover, a first supply voltage from the first voltage supply line ELVDL, a second supply voltage from the second voltage supply line ELVSL, and a third supply voltage from a third voltage supply line VIL may be determined based on the characteristics of the driving transistor DTR, the characteristics of the light-emitting element LE, within the spirit and the scope of the disclosure.

Figure 3C:
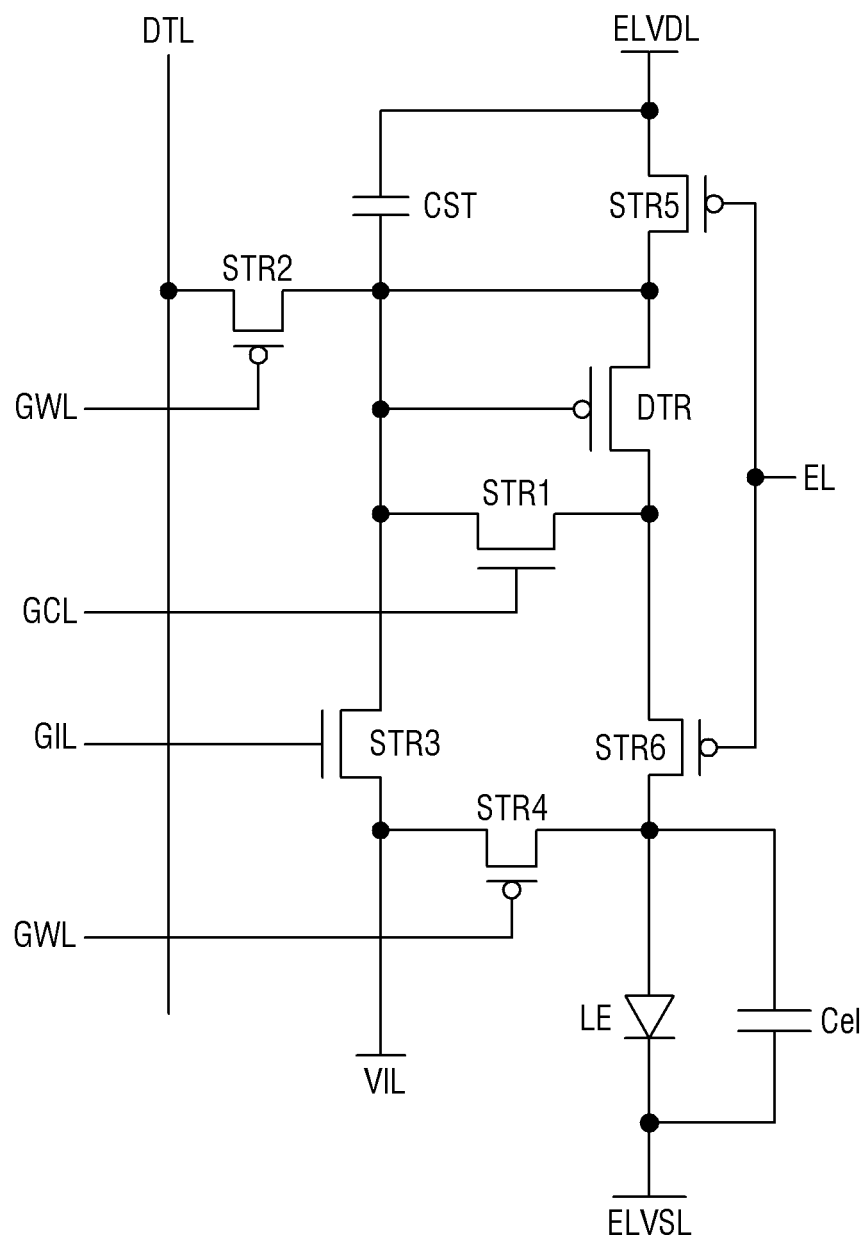

FIG. 3C is a schematic diagram of an equivalent circuit of a pixel of a display device according to an embodiment.

An embodiment of FIG. 3C may be different from an embodiment of FIG. 3B in that the driving transistor DTR, the second transistor STR2, the fourth transistor STR4, the fifth transistor STR5 and the sixth transistor STR6 may be implemented as p-type MOSFETs while the first transistor STR1 and the third transistor STR3 may be implemented as n-type MOSFETs.

Referring to FIG. 3C, the active layer of each of the driving transistor DTR, the second transistor STR2, the fourth transistor STR4, the fifth transistor STR5 and the sixth transistor STR6 implemented as p-type MOSFETs may be made of polysilicon, and the active layer of the first transistor STR1 and the third transistor STR3 implemented as n-type MOSFETs may be made of oxide semiconductor.

An embodiment of FIG. 3C may be different from an embodiment of FIG. 3B in that the gate electrode of the second transistor STR2 and the gate electrode of the fourth transistor STR4 may be connected to a write scan line GWL, and the gate electrode of the first transistor STR1 may be connected to a control scan line GCL. In FIG. 3C, since the first transistor STR1 and the third transistor STR3 are formed of n-type MOSFETs, a scan signal of a gate-high voltage may be applied to the control scan line GCL and an initialization scan line GIL. In contrast, since the second transistor STR2, the fourth transistor STR4, the fifth transistor STR5 and the sixth transistor STR6 are formed of p-type MOSFETs, a scan signal of a gate-low voltage may be applied to the write scan line GWL and an emission line EL.

It should be noted that the equivalent circuit diagrams of the pixels according to embodiments are not limited to those illustrated in FIGS. 3A to 3C. The equivalent circuit diagrams of the pixels according to embodiments may be implemented as other circuit structures in addition to embodiments shown in FIGS. 3A to 3C.

Figure 4:
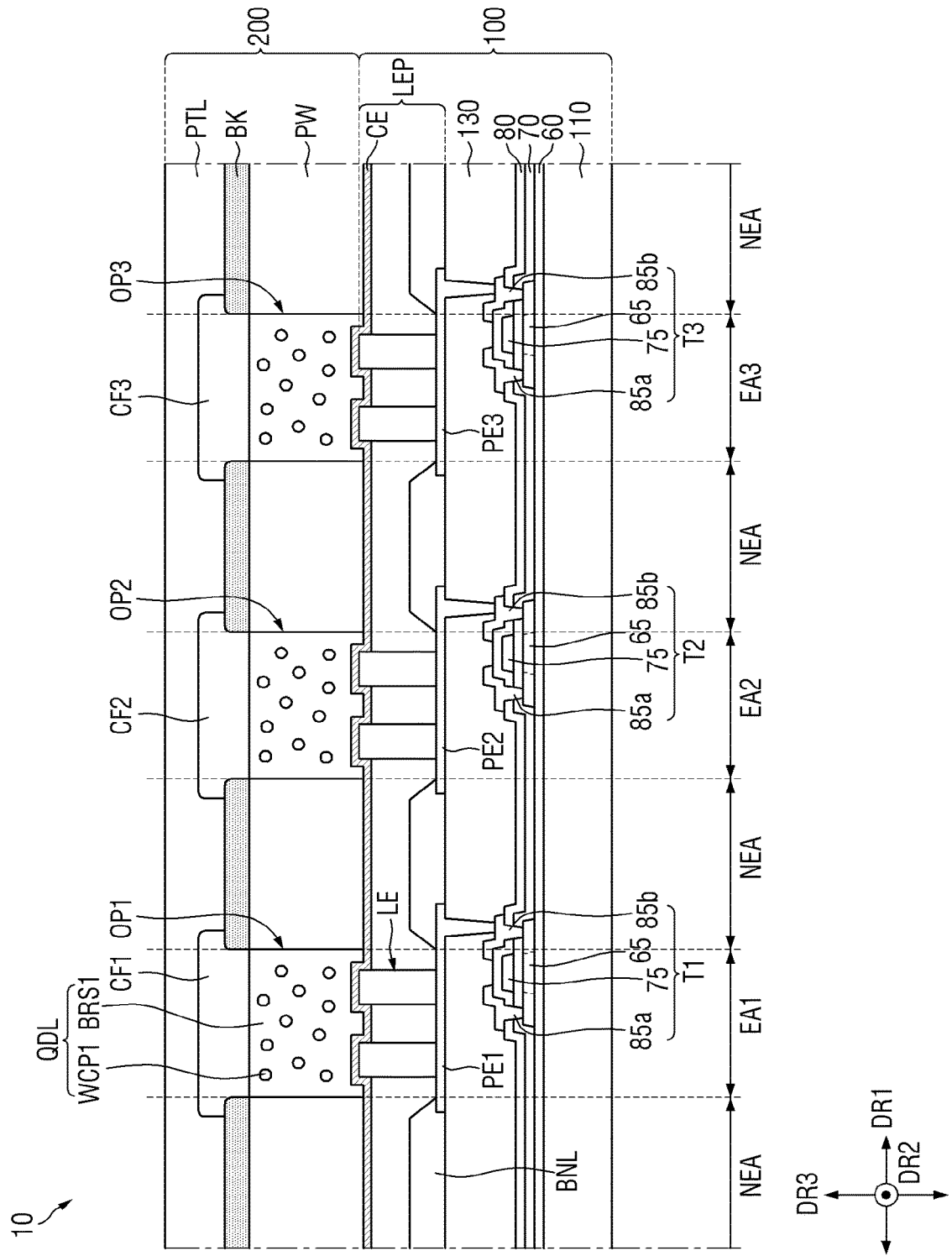
FIG. 4 is a schematic cross-sectional view schematically showing a display device according to an embodiment.
Figure 5:
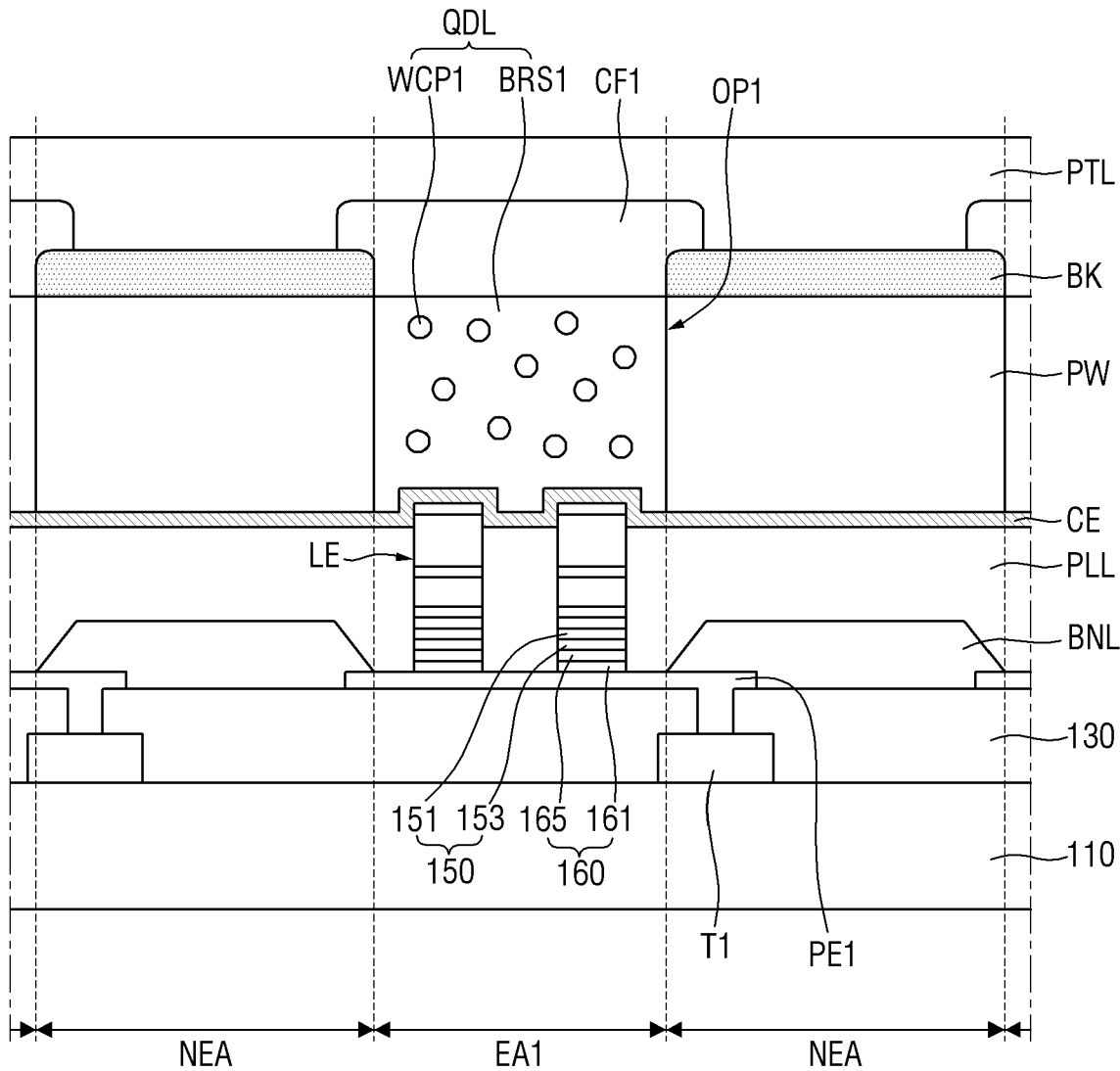
FIG. 5 is an enlarged view schematically showing a first emission area according to an embodiment.
Figure 6:
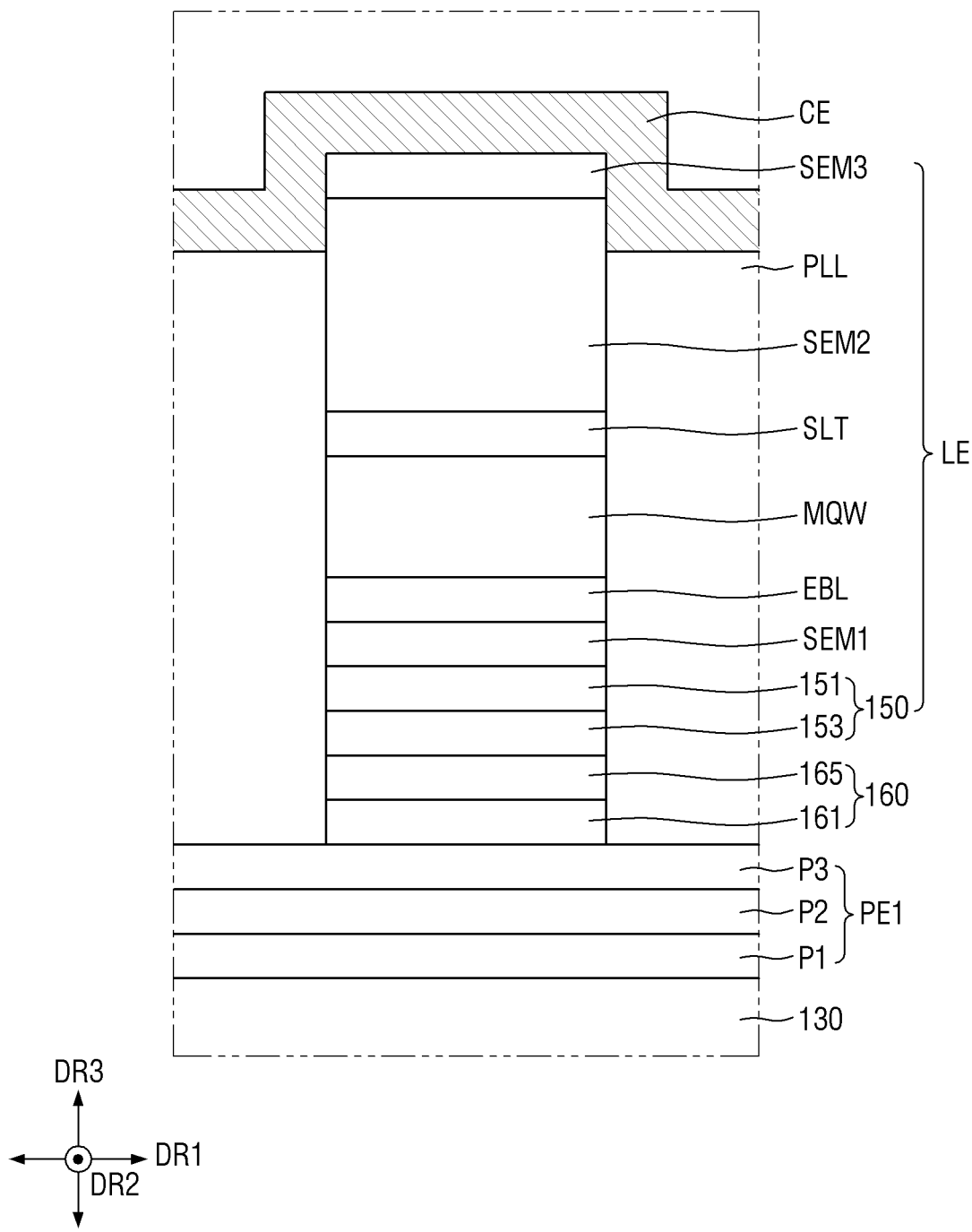
FIG. 6 is a schematic cross-sectional view showing a pixel electrode and a light-emitting element according to an embodiment.
Figure 7:
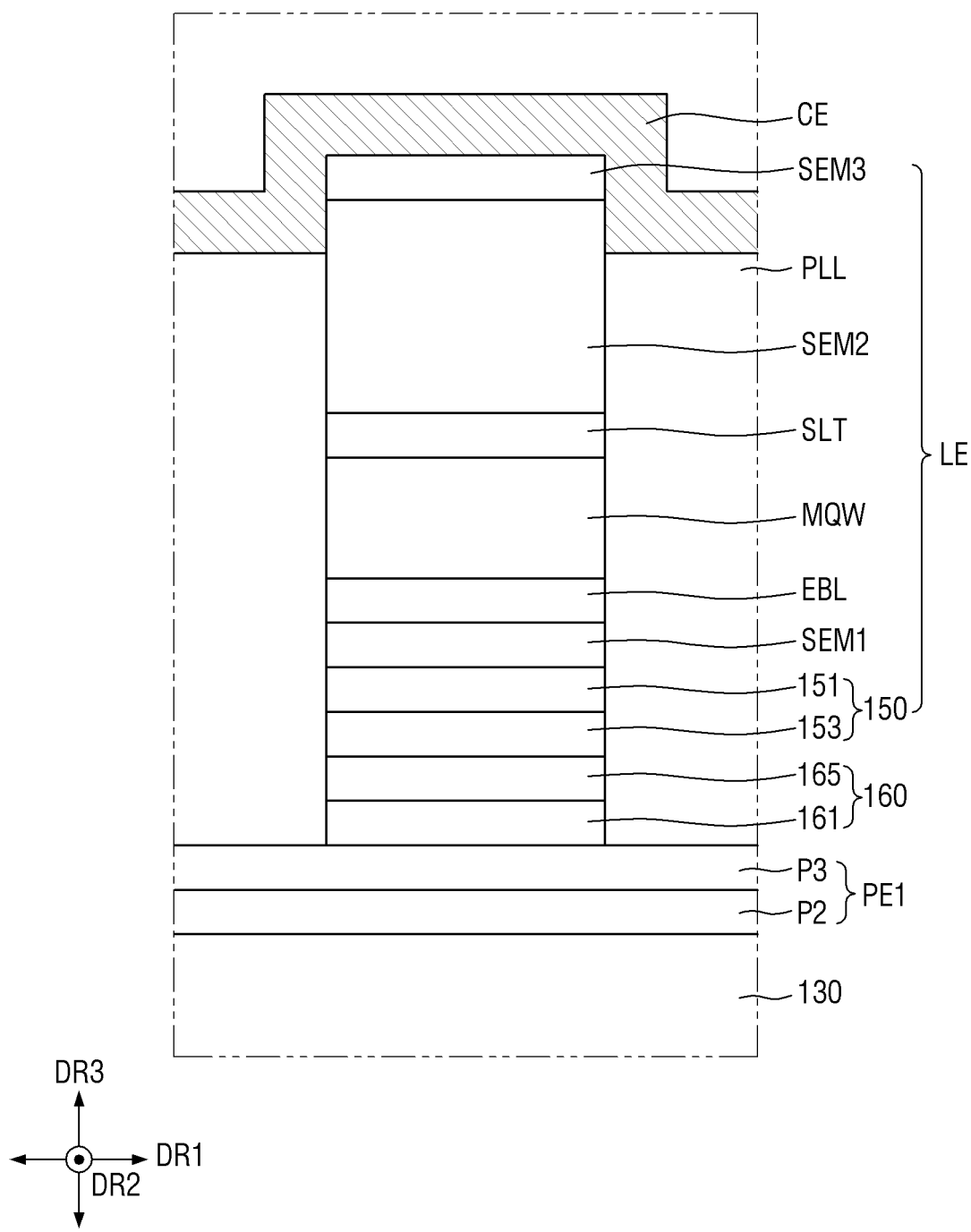
FIG. 7 is a schematic cross-sectional view showing a modification of the pixel electrode and the light-emitting element according to embodiment.
Figure 8:
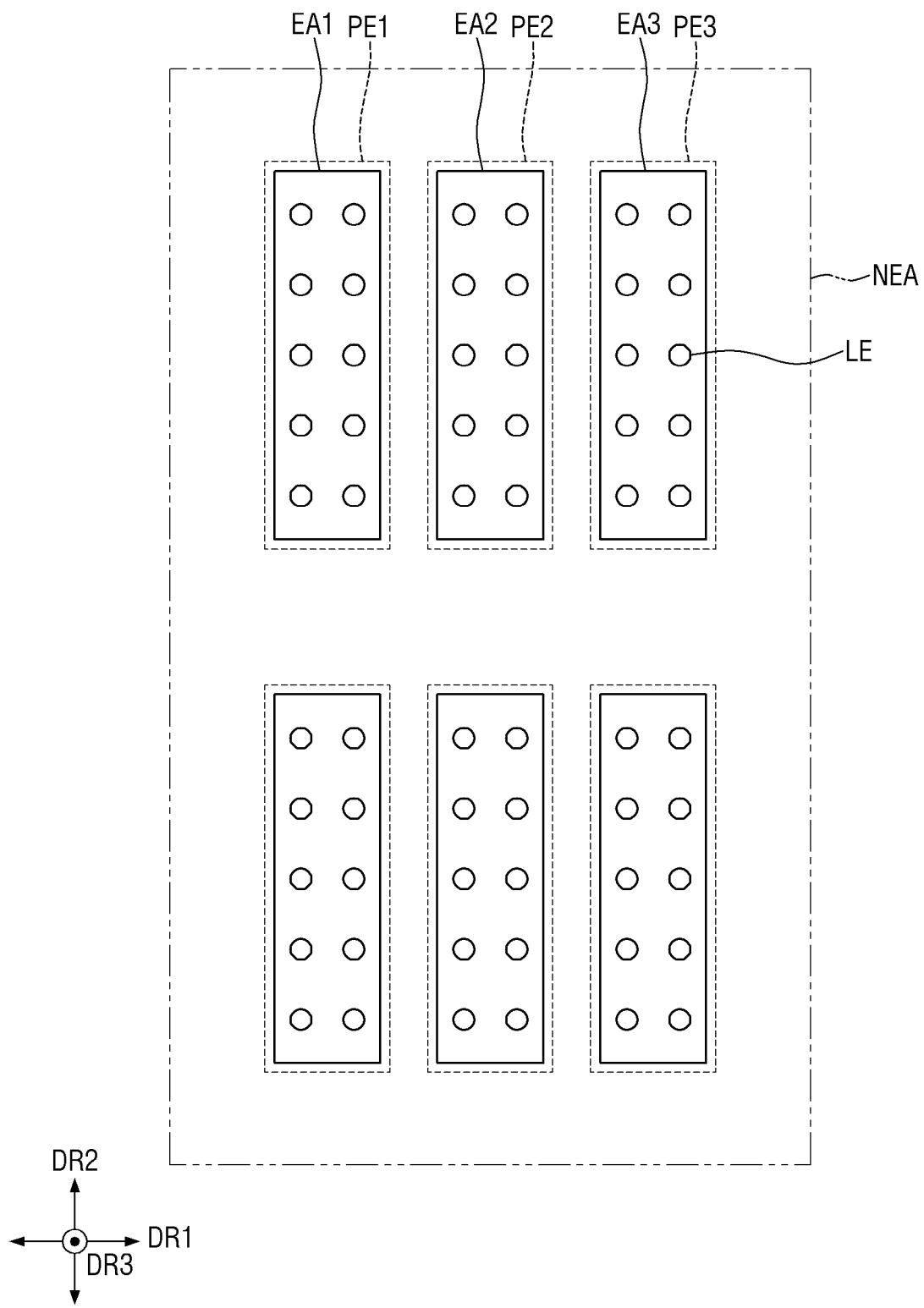
FIG. 8 is a schematic plan view schematically showing emission areas according to an embodiment.
Figure 10:
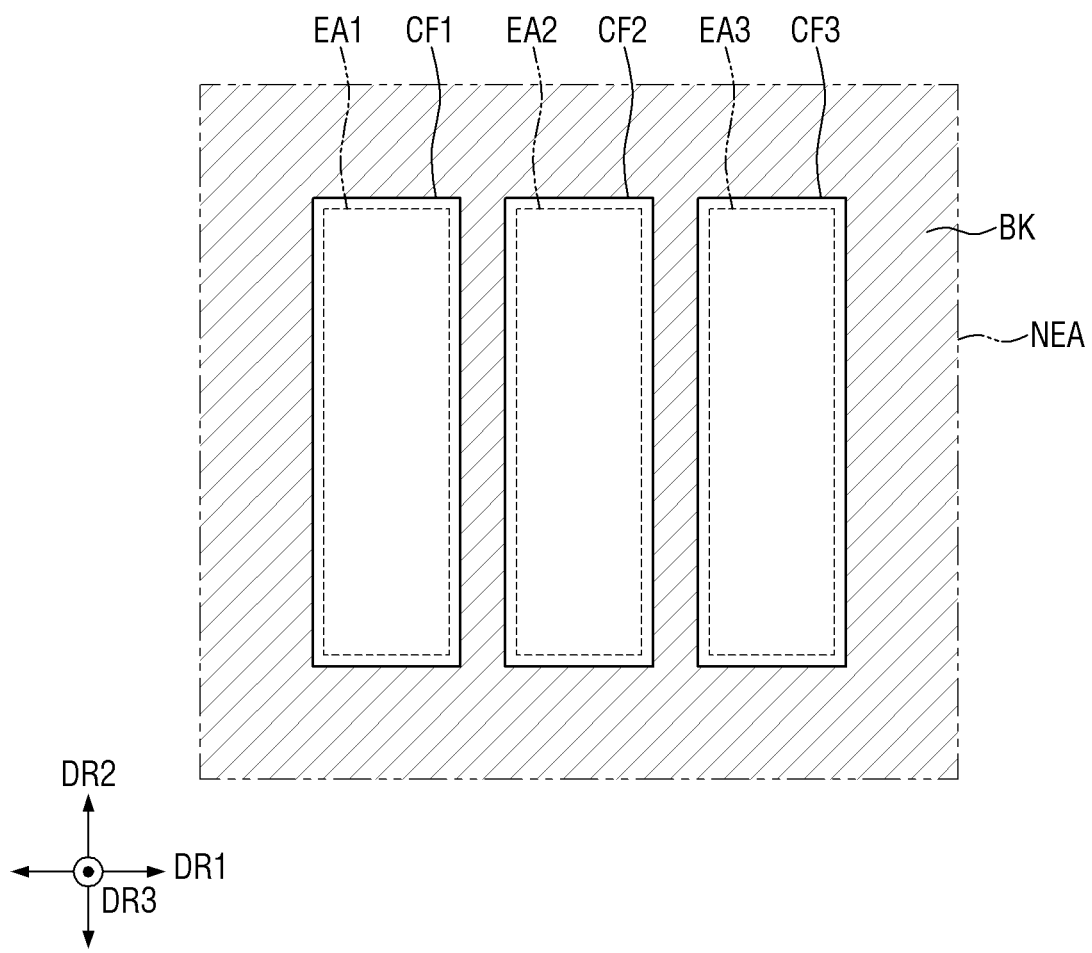
FIG. 10 is a schematic plan view schematically showing emission areas and color filters.

FIG. 4 is a schematic cross-sectional view schematically showing a display device according to an embodiment. FIG. 5 is an enlarged view schematically showing a first emission area according to an embodiment. FIG. 6 is a schematic cross-sectional view showing a pixel electrode and a light-emitting element according to an embodiment. FIG. 7 is a schematic cross-sectional view showing a modification of the pixel electrode and the light-emitting element according to an embodiment. FIG. 8 is a schematic plan view schematically showing emission areas according to an embodiment. FIG. 9 is a schematic cross-sectional view schematically showing light-emitting elements. FIG. 10 is a schematic plan view showing emission areas and color filters.

Referring to FIGS. 4 to 10, the display device 10 may include a display substrate 100 and a wavelength converting portion 200 disposed on the display substrate 100.

The display substrate 100 may include a first substrate 110 and a light-emitting element portion LEP disposed on the first substrate 110. The first substrate 110 may be an insulating substrate. The first insulating layer 110 may include a transparent material. For example, the first substrate 110 may include a transparent insulating material such as glass and quartz. The first substrate 110 may be a rigid substrate. However, the first substrate 110 is not limited to those described above. The first substrate SUB 110 may include a plastic such as polyimide or may be flexible so that it can be curved, bent, folded or rolled. emission areas EA1, EA2 and EA3 and a non-emission area NEA may be defined in the first substrate 110.

On the first substrate 110, switching elements T1, T2 and T3 may be disposed. According to an embodiment, the first switching element T1 may be located in the first emission area EA1, the second switching element T2 may be located in the second emission area EA2, and the third switching element T3 may be located in the third emission area EA3. It is, however, to be understood that the disclosure is not limited thereto. In other embodiments, at least one of the first switching device T1, the second switching device T2 and the third switching device T3 may be located in the non-emission area NEA.

According to an embodiment, each of the first switching element T1, the second switching element T2 and the third switching element T3 may be a thin-film transistor including amorphous silicon, polysilicon, or an oxide semiconductor. Although not shown in the drawings, signal lines (for example, gate lines, data lines, power lines, within the spirit and the scope of the disclosure.) for transmitting signals to the switching elements may be further disposed on the first substrate 110.

Each of the switching elements T1, T2 and T3 may include a semiconductor layer 65, a gate electrode 75, a source electrode 85a and a drain electrode 85b. A buffer layer 60 may be disposed on the first substrate 110. The buffer layer 60 may be disposed to cover or overlap the entire surface of the first substrate 110. The buffer layer 60 image silicon nitride, silicon oxide, silicon oxynitride, within the spirit and the scope of the disclosure, and may be made up of a single layer or a double layer thereof.

The semiconductor layer 65 may be disposed on the buffer layer 60. The semiconductor layer 65 may form a channel of each of the switching elements T1, T2 and T3. The semiconductor layer 60 may include amorphous silicon, polycrystalline silicon or oxide semiconductor. The oxide semiconductor may include, for example, a binary compound (Abx), a ternary compound (AbxCy) and a quaternary compound (AbxCyDz) containing indium, zinc, gallium, tin, titanium, aluminum, hafnium (Hf), zirconium (Zr), magnesium (Mg), within the spirit and the scope of the disclosure. According to an embodiment, the semiconductor layer 65 may include indium tin zinc oxide (IGZO).

The gate insulating layer 70 may be disposed on the semiconductor layer 65. The gate insulator 70 may include a silicon compound, a metal oxide, within the spirit and the scope of the disclosure. For example, the gate insulator 70 may include silicon oxide, silicon nitride, silicon oxynitride, aluminum oxide, tantalum oxide, hafnium oxide, zirconium oxide, titanium oxide, within the spirit and the scope of the disclosure. According to an embodiment, the gate insulating layer 70 may include silicon oxide.

The gate electrode 75 may be disposed on the gate insulating layer 70. The gate electrode 75 may be disposed to overlap the semiconductor layer 65. The gate electrode 75 may include a conductive material. The gate electrode 75 may include a metal oxide such as ITO, IZO, ITZO and $In_2O_3$, or a metal such as copper (Cu), titanium (Ti), aluminum (Al), molybdenum (Mo), tantalum (Ta), calcium (Ca), chromium (Cr), magnesium (Mg) and nickel (Ni). For example, the gate electrode 75 may be made up of, but is not limited to, a double layer of Cu/Ti in which an upper layer of copper may be stacked on a lower layer of titanium.

An interlayer dielectric layer 80 may be disposed on the gate electrode 75. The interlayer dielectric layer 80 may include an inorganic insulating material such as silicon oxide, silicon nitride, silicon oxynitride, hafnium oxide, aluminum oxide, titanium oxide, tantalum oxide and zinc oxide.

A source electrode 85a and a drain electrode 85b may be disposed on the interlayer dielectric layer 80. The source electrode 85a and the drain electrode 85b may be in contact with the semiconductor layer 65 through contact holes penetrating the interlayer dielectric layer 80 and the gate insulating layers 70. The source electrode 85*a* and the drain electrode 85*b* may include a metal oxide such as ITO, IZO, ITZO and In$_2$O$_3$, or a metal such as copper (Cu), titanium (Ti), aluminum (Al), molybdenum (Mo), tantalum (Ta), calcium (Ca), chromium (Cr), magnesium (Mg) and nickel (Ni). For example, the source electrode 85*a* and the drain electrode 85*b* may be made up of, but is not limited to, a double layer of Cu/Ti in which an upper layer of copper may be stacked on a lower layer of titanium.

An insulating layer 130 may be disposed over the first switching element T1, the second switching element T2 and the third switching element T3. According to an embodiment, the insulating layer 130 may be a planarization layer and may include an organic material. For example, the insulating layer 130 may include an acrylic resin, an epoxy resin, an imide resin, an ester resin, within the spirit and the scope of the disclosure. According to an embodiment, the insulating layer 130 may include a positive photosensitive material or a negative photosensitive material.

The light-emitting element portion LEP may be disposed on the insulating layer 130. The light-emitting element portion LEP may include pixel electrodes PE1, PE2 and PE3, light-emitting elements LE, and a common electrode CE.

The pixel electrodes PE1, PE2 and PE3 may include a first pixel electrode PE1, a second pixel electrode PE2 and a third pixel electrode PE3. The first pixel electrode PE1, the second pixel electrode PE2 and the third pixel electrode PE3 may work as a first electrode of the light-emitting element LE and may be an anode electrode or a cathode electrode. The first pixel electrode PE1 may be disposed in the first emission area EA1 and may be extended to the non-emission area NEA at least partially. The second pixel electrode PE2 may be disposed in the second emission area EA2 and may be extended to the non-emission area NEA at least partially. The third pixel electrode PE3 may be disposed in the third emission area EA3 and may be extended to the non-emission area NEA at least partially. The first pixel electrode PE1 may be connected to the first switching element T1 through the insulating layer 130, the second pixel electrode PE2 may be connected to the second switching element T2 through the insulating layer 130, and the third pixel electrode PE3 may be connected to the third switching element T3 through the insulating layer 130.

The first pixel electrode PE1, the second pixel electrode PE2 and the third pixel electrode PE3 may be reflective electrodes. The first pixel electrode PE1, the second pixel electrode PE2 and the third pixel electrode PE3 may have a structure of films in which a material layer having a high work function of TiO$_2$ (titanium oxide), ITO (indium tin oxide), IZO (indium zinc oxide), ZnO (zinc oxide), ITZO (indium tin zinc oxide) or MgO (magnesium oxide), and a reflective material layer of silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca) or a mixture thereof may be stacked each other. A material layer having a higher work function may be disposed higher than a reflective material layer so that it may be closer to the light-emitting element LE. The first pixel electrode PE1, the second pixel electrode PE2 and the third pixel electrode PE3 may have, but is not limited to, a multilayer structure of ITO/Mg, ITO/MgF, ITO/Ag, and ITO/Ag/ITO.

According to this embodiment, each of the pixel electrodes PE1, PE2 and PE3 may include a lower electrode layer P1, a reflective electrode layer P2, and an upper electrode layer P3. In the following description, the first pixel electrode PE1 will be described as an example.

The lower electrode layer P1 may be disposed at the bottom of the first pixel electrode PE1 and may be electrically connected from the switching element. The lower electrode layer P1 may include a metal oxide, for example, titanium oxide (TiO$_2$), indium tin oxide (ITO), indium zinc oxide (IZO), zinc oxide (ZnO), indium tin zinc oxide (ITZO), or magnesium oxide (MgO).

The reflective electrode layer P2 may be disposed on the lower electrode layer P1 to reflect light emitted from the light-emitting element LE upward. The reflective electrode layer P2 may include a metal having a high reflectance, for example, silver (Ag), magnesium (Mg), aluminum (Al), platinum (Pt), lead (Pb), gold (Au), nickel (Ni), neodymium (Nd), iridium (Ir), chrome (Cr), lithium (Li), calcium (Ca) or a mixture thereof.

The upper electrode layer P3 may be disposed on the reflective electrode layer P2 and may be in direct contact with the light-emitting element LE. The upper electrode layer P3 may be disposed between the reflective electrode layer P2 and the connection electrode 150 of the light-emitting element LE. The upper electrode layer P3 may include a metal oxide, for example, titanium oxide (TiO$_2$), indium tin oxide (ITO), indium zinc oxide (IZO), zinc oxide (ZnO), indium tin zinc oxide (ITZO), or magnesium oxide (MgO). According to an embodiment, the first pixel electrode PE1 may be formed in a multi-layer structure of ITO/Ag/ITO.

Referring to FIG. 7, in an embodiment, the lower electrode layer P1 may be eliminated from the first pixel electrode PE1. The first pixel electrode PE1 may have a two-layer structure including a reflective electrode layer P2 and an upper electrode layer P3 disposed on the reflective electrode layer P2.

It should be noted that the lower electrode layer P1 and the upper electrode layer P3 may be in a polycrystalline phase according to an embodiment of FIG. 6. The first pixel electrode PE1 may be etched altogether during a process of forming a contact electrode 160 disposed on the upper electrode layer P3 in a fabrication process to be described later. The upper electrode layer P3 in the polycrystalline phase can protect the reflective electrode layer P2 thereunder from an etchant used in the process of forming the contact electrode 160. Accordingly, it is possible to prevent the reflective electrode layer P2 from being etched by the etchant. In an embodiment, the lower electrode layer P1 and the upper electrode layer P3 may be one of polycrystalline ITO, polycrystalline titanium oxide (TiO$_2$), polycrystalline indium zinc oxide (IZO), polycrystalline zinc oxide (ZnO), polycrystalline indium tin zinc oxide (ITZO), or polycrystalline magnesium oxide (MgO). In an embodiment of FIG. 7, the upper electrode layer P3 of the first pixel electrode PE1 may be in a polycrystalline phase.

A bank BNL may be disposed on the first pixel electrode PE1, the second pixel electrode PE2 and the third pixel electrode PE3. The bank BNL may include an opening exposing the first pixel electrode PE1, an opening exposing the second pixel electrode PE2 and an opening exposing the third pixel electrode PE3, and may define the first emission area EA1, the second emission area EA2, the third emission area EA3 and the non-emission area NEA. An area of the first pixel electrode PE1 that is not covered or overlapped by the bank BNL and is exposed may be the first emission area EA1. An area of the second pixel electrode PE2 that is not covered or overlapped by the bank BNL and is exposed may be the second emission area EA2. An area of the third pixel electrode PE3 that is not covered or overlapped by the bank BNL and is exposed may be the third emission area EA3. The other area where the bank BNL is located may be the non-emission area NEA.

The bank BNL may include an organic insulating material, for example, polyacrylate resin, epoxy resin, phenolic resin, polyamide resin, polyimide resin, unsaturated polyesters resin, poly 22henylene ether resin, poly phenylene sulfide resin, and benzocyclobutene (BCB).

According to an embodiment, the bank BNL may overlap color filters CF1, CF2 and CF3 of the wavelength converting portion 200 and a light-blocking member BK, which will be described later. According to an embodiment, the bank BNL may completely overlap the light-blocking member BK. The bank BNL may overlap the first color filter CF1, the second color filter CF2 and the third color filter CF3.

Light-emitting elements LE may be disposed on the first pixel electrode PE1, the second pixel electrode PE2 and the third pixel electrode PE3.

As shown in FIGS. 5 to 7, the light-emitting elements LE may be disposed in each of the first emission area EA1, the second emission area EA2 and the third emission area EA3. The light-emitting element LE may be a vertical light-emitting diode extended in the third direction DR3. For example, the length of the light-emitting element LE in the third direction DR3 may be larger than the length in the horizontal direction. The horizontal length refers to either the length in the first direction DR1 or the length in the second direction DR2. For example, the length of the light-emitting element LE in the third direction DR3 may be approximately 1 to approximately 5 μm.

The light-emitting element LE may be a micro light-emitting diode. The light-emitting element LE may include a connection electrode 150, a first semiconductor layer SEM1, an electron blocking layer EBL, an active layer MQW, a superlattice layer SLT, a second semiconductor layer SEM2 and a third semiconductor layer SEM3 in the thickness direction of the display substrate 100, for example, in the third direction DR3. The connection electrode 150, the first semiconductor layer SEM1, the electron blocking layer EBL, the active layer MQW, the superlattice layer SLT, the second semiconductor layer SEM2 and the third semiconductor layer SEM3 may be stacked each other in this order in the third direction DR3.

The light-emitting element LE may have a cylindrical shape, a disk shape, or a rod shape having the width longer than the height. It should be understood, however, that the disclosure is not limited thereto. The light-emitting element LE may have a shape of a rod, wire, tube, within the spirit and the scope of the disclosure, a shape of a polygonal column such as a cube, a cuboid and a hexagonal column, or may have a shape extended in a direction with partially inclined outer surface.

The connection electrode 150 may be disposed on each of the pixel electrodes PE1, PE2 and PE3. Hereinafter, the light-emitting elements LE disposed on the first pixel electrode PE1 will be described as an example, but the disclosure is not limited thereto. The light-emitting elements LE disposed on the second pixel electrode PE2 and the third pixel electrode PE3 may have a same structure.

The connection electrode 150 may include a reflective layer 151 and a connection layer 153. The reflective layer 151 may reflect light emitted from the active layer MQW of the light-emitting element LE. The reflective layer 151 may be disposed adjacent to the active layer MQW of the light-emitting element LE. The reflective layer 151 may include a metal material having high light reflectance while having conductivity. The reflective layer 151 may include, for example, aluminum (Al), silver (Ag), or an alloy thereof. In an embodiment, the reflective layer 151 may further include ITO in addition to the above-described metal materials.

The connection layer 153 may transmit an emission signal from the first pixel electrode PE1 to the light-emitting element LE. The connection layer 153 may be an ohmic connection electrode. It is, however, to be understood that the disclosure is not limited thereto. The connection electrodes 150 may be Schottky connection electrodes. The connection layer 153 may be disposed at the bottom of the light-emitting element LE and may be disposed farther from the active layer MQW than the reflective layer 151 is. The connection layer 153 may include at least one of gold (Au), copper (Cu), tin (Sn), silver (Ag), aluminum (Al) and titanium (Ti). For example, the connection layer 153 may include a 9:1 alloy, an 8:2 alloy or a 7:3 alloy of gold and tin, or an alloy of copper, silver and tin (SAC305).

Although the connection electrode 150 of the light-emitting element LE has a double-layer structure of one reflective layer 151 and a connection layer 153 in the example shown in FIG. 6, the disclosure is not limited thereto. In some implementations, the light-emitting element LE may include the connection electrode 150 having more than two layers, or some or a number of layers may be eliminated therefrom. In an embodiment, the reflective layer 151 may be disposed at the bottom of the light-emitting element LE, and the connection layer 153 may be disposed closer to the active layer MQW than the reflective layer 151 is.

The first semiconductor layer SEM1 may be disposed on the connection electrode 150. The first semiconductor layer SEM1 may be p-type semiconductor, and may include a semiconductor material having the following chemical formula: $Al_xGa_yIn_{1-x-y}N$ ($0 \leq x \leq 1$, $0 \leq y \leq 1$ and $0 \leq x+y \leq 1$). For example, it may be at least one of p-type doped AlGaInN, GaN, AlGaN, InGaN, AlN and InN. The first semiconductor layer SEM1 may be doped with a p-type dopant, and the p-type dopant may be Mg, Zn, Ca, Se, Ba, within the spirit and the scope of the disclosure. For example, the first semiconductor layer SEM1 may be p-GaN doped with p-type Mg. The thickness of the first semiconductor layer SEM1 may range, but is not limited to, from about 30 nm to about 200 nm.

The electron blocking layer EBL may be disposed on the first semiconductor layer SEM1. The electron blocking layer EBL may suppress or prevent too many electrons from flowing into the active layer MQW. For example, the electron blocking layer EBL may be p-AlGaN doped with p-type Mg. The thickness of the electron blocking layer may be in a range of about 10 nm to about 50 nm, but the disclosure is not limited thereto. the electron blocking layer EBL may be eliminated.

The active layer MQW may be disposed on the electron blocking layer EBL. The active layer MQW may emit light as electron-hole pairs are combined therein in response to an electrical signal applied through the first semiconductor layer SEM1 and the second semiconductor layer SEM2. The active layer MQW may emit first light having a central wavelength range of about 450 nm to about 495 nm, for example, light of the blue wavelength range.

The active layer MQW may include a material having a single or multiple quantum well structure. In case that the active layer MQW may include a material having the multiple quantum well structure, well layers and barrier layers may be alternately stacked each other in the structure.

The well layers may be made of InGaN, and the barrier layers may be made of GaN or AlGaN, but the disclosure is not limited thereto.

For example, the active layer MQW may have a structure in which a semiconductor material having a large band gap energy and a semiconductor material having a small band gap energy are alternately stacked each other, and may include other Group III to Group V semiconductor materials depending on the wavelength range of the emitted light. The light emitted by the active layer MQW is not limited to the first light. In some implementations, the second light (light in the green wavelength range) or the third light (light in the red wavelength range) may be emitted by the active layer MQW. According to an embodiment, in case that indium is included among the semiconductor materials included in the active layer MQW, the color of emitted light may vary depending on the content of indium. For example, in case that the content of indium is approximately 15%, light of a blue wavelength range may be emitted. In case that the content of indium is approximately 25%, light of a green wavelength range may be emitted. In case that the content of indium is approximately 35% or more, light of a red wavelength range may be emitted.

The superlattice layer SLT may be disposed on the active layer MQW. The superlattice layer SLT may relieve stress between the second semiconductor layer SEM2 and the active layer MQW. For example, the superlattice layer SLT may be made of InGaN or GaN. The thickness of the superlattice layer SLT may be approximately 50 to approximately 200 nm. The superlattice layer SLT may be eliminated.

The second semiconductor layer SEM2 may be disposed on the superlattice layer SLT. The second semiconductor layer SEM2 may be an n-type semiconductor. The second semiconductor layer SEM2 may include a semiconductor material having the following chemical formula: $Al_xGa_yIn_{1-x-y}N$ ($0 \leq x \leq 1$, $0 \leq y \leq 1$, $0 \leq x+y \leq 1$). For example, it may be at least one of n-type doped AlGaInN, GaN, AlGaN, InGaN, AlN and InN. The second semiconductor layer SEM2 may be doped with an n-type dopant, and the n-type dopant may be Si, Ge, Sn, within the spirit and the scope of the disclosure. For example, the second semiconductor layer SEM2 may be n-GaN doped with n-type Si. The thickness of the second semiconductor layer SEM2 may range, but is not limited to, from about 2 μm to about 4 μm.

The third semiconductor layer SEM3 may be disposed on the second semiconductor layer SEM2. The third semiconductor layer SEM3 may be disposed between the second semiconductor layer SEM2 and the common electrode CE. The third semiconductor layer SEM3 may be an undoped semiconductor. The third semiconductor layer SEM3 may include a same material or a similar material as the second semiconductor layer SEM2, but may not be doped with an n-type or p-type dopant. In an embodiment, the third semiconductor layer SEM3 may be, but is not limited to, at least one of undoped InAlGaN, GaN, AlGaN, InGaN, AlN, and InN.

A planarization layer PLL may be disposed on the bank BNL and the pixel electrodes PE1, PE2 and PE3. The planarization layer PLL may provide a flat surface so that a common electrode CE, which will be described later, may be formed. The planarization layer PLL may be formed to have a height so that at least a part, for example, an upper portion of the light-emitting elements LE, may protrude above the planarization layer PLL. For example, the height of the planarization layer PLL from the upper surface of the first pixel electrode PE1 may be less than the height of the light-emitting elements LE.

The planarization layer PLL may include an organic material to provide a flat surface. For example, the planarization layer PLL may include polyacrylate resin, epoxy resin, phenolic resin, polyamide resin, polyimide resin, unsaturated polyesters resin, poly 27henylene ether resin, poly phenylene sulfide resin, benzocyclobutene (BCB), within the spirit and the scope of the disclosure.

The common electrode CE may be disposed on the planarization layer PLL and the light-emitting elements LE. The common electrode CE may be disposed on one surface or a surface of the first substrate 110 on which the light-emitting element LE is formed, and may be disposed entirely on the display area DPA and the non-display area NDA. The common electrode CE may be disposed to overlap the emission areas EA1, EA2 and EA3 in the display area DPA, and may have a small thickness to allow light to exit.

The common electrode CE may be disposed on or directly disposed on upper and side surfaces of the light-emitting elements LE. The common electrode CE may be in direct contact with the second semiconductor layer SEM2 and the third semiconductor layer SEM3 among side surfaces of the light-emitting elements LE. As shown in FIG. 6, the common electrode CE may be a common layer that covers or overlaps the light-emitting elements LE and commonly connects the light-emitting elements LE with one another. Since the conductive second semiconductor layer SEM2 has a patterned structure in each of the light-emitting elements LE, the common electrode CE may be in direct contact with the side surfaces of the second semiconductor layer SEM2 of each of the light-emitting elements LE so that a common voltage can be applied to each of the light-emitting elements LE.

Since the common electrode CE is disposed entirely on the first substrate 110 to apply the common voltage, the common electrode CE may include a material having a low resistance. The common electrode CE may be formed to have a small thickness to allow light to exit. For example, the common electrode CE may include a material having a low resistance, such as aluminum (Al), silver (Ag) and copper (Cu). The thickness of the common electrode CE may be, but is not limited to, approximately 10 Å to 200 Å.

The contact electrode 160 may be disposed between the light-emitting elements LE and the pixel electrodes PE1, PE2 and PE3. The contact electrode 160 can improve adhesive properties and/or interface properties between the light-emitting element LE and the pixel electrodes PE1, PE2 and PE3. The size of the contact electrode 160 may be equal to the size of the light-emitting element LE when viewed from the top (or in a plan view). According to an embodiment, the side surfaces of the contact electrode 160 may be aligned with and coincide with the side surfaces of the light-emitting elements LE. At least one side or a side of the contact electrode 160 may be aligned with at least one side or a side of the connection electrode 150 of the light-emitting elements LE. It should be understood, however, that the disclosure is not limited thereto. The size of the contact electrode 160 may be smaller than the size of the light-emitting elements LE when viewed from the top (or in a plan view).

The contact electrode 160 may include a first contact layer 161 and a second contact layer 165. The first contact layer 161 may form the lower portion of the contact electrode 160 and may be disposed on or directly disposed on the first pixel electrode PE1 to be in contact with the first pixel electrode PE1. The first contact layer 161 can improve adhesive properties with the first pixel electrode PE1. In an embodiment, the first contact layer 161 may be in direct contact with the upper electrode layer P3 of the first pixel electrode PE1, and may have excellent adhesive properties with the upper electrode layer P3. The first contact layer 161 may include a metal material having excellent adhesive properties with the upper electrode layer P3. According to an embodiment, the first contact layer 161 may include titanium (Ti). It should be understood, however, that the disclosure is not limited thereto. The first contact layer 161 may include any other metal material as long as it has excellent adhesive properties with the upper electrode layer P3. According to an embodiment, the upper electrode layer P3 may be ITO, and the first contact layer 161 may be titanium.

The second contact layer 165 may be disposed on the first contact layer 161, and may form the upper portion in the contact electrode 160. The second contact layer 165 may be disposed on or directly disposed on the lower surface of the light-emitting element LE to be in contact with the light-emitting element LE. According to an embodiment, the second contact layer 165 may be in direct contact with the connection electrode 150 of the light-emitting element LE and may be in direct contact with the connection layer 153 of the connection electrode 150.

The second contact layer 165 can adhere the light-emitting element LE. The light-emitting element LE may be adhered to the pixel electrodes PE1, PE2 and PE3 through the second contact layer 165. The second contact layer 165 may include a metal material having excellent adhesion with the light-emitting element LE. The second contact layer 165 may include a metal material having excellent adhesive properties with the connection layer 153 of the light-emitting element LE. The second contact layer 165 may include copper (Cu) or gold (Au). It should be understood, however, that the disclosure is not limited thereto. The second contact layer 165 may include any other metal material as long as it has excellent adhesive properties with the connection layer 153. According to an embodiment, the connection layer 153 may be an alloy of copper, silver and tin (SAC305), and the second contact layer 165 may be copper (Cu). According to an embodiment, the connection layer 153 may be an alloy of copper, silver and tin (SAC305), and the second contact layer 165 may be gold (Au).

The above-described light-emitting elements LE may receive a pixel voltage or an anode voltage from the pixel electrodes PE1, PE2 and PE3 through the contact electrodes 160, and may receive a common voltage through the common electrode CE. The light-emitting elements LE may emit light with a luminance according to a voltage difference between the pixel voltage and the common voltage.

Referring to FIG. 9, some of the lights emitted from the active layers MQW of the light-emitting elements LE may be reflected upward at the reflective layers 151 of the light-emitting elements LE, while others of the lights may proceed toward the pixel electrode PE1. According to this embodiment, each of the pixel electrodes PE1, PE2 and PE3 may include the reflective electrode layer P2, so that lights emitted from the light-emitting elements LE can be reflected upward to improve out-coupling efficiency. For example, the contact electrodes 160 disposed between the light-emitting elements LE and the pixel electrodes PE1, PE2 and PE3 have a same size as the light-emitting elements LE when viewed from the top (or in a plan view), and thus it is possible to prevent the lights emitted from the light-emitting elements LE from being absorbed by the contact electrodes 160.

According to an embodiment, by disposing light-emitting elements LE, for example, inorganic light-emitting diodes on the pixel electrodes PE1, PE2 and PE3, it is possible to eliminate the disadvantages of organic light-emitting diodes, which are vulnerable to external moisture or oxygen, and to improve the lifetime and the reliability of the organic light-emitting diodes.

The wavelength converting portion 200 may be disposed on the light-emitting element portion LEP. The wavelength converting portion 200 may include partition walls PW, wavelength conversion layers QDL, color filters CF1, CF2 and CF3, a light-blocking member BK, and a protective layer PTL.

The partition walls PW may be disposed on the common electrode CE in the display area DPA, and may partition the emission areas EA1, EA2 and EA2 together with the bank BNL. The partition walls PW may be extended in the first direction DR1 and the second direction DR2, and may be formed in a lattice pattern throughout the display area DPA. The partition walls PW may not overlap the emission areas EA1, EA2 and EA3, and may overlap the non-emission area NEA.

The partition walls PW may include openings OP1, OP2 and OP3 exposing the common electrode CE thereunder. The openings OP1, OP2 and OP3 may include a first opening OP1 overlapping the first emission area EA1, a second opening OP2 overlapping the second emission area EA2, and a third opening OP3 overlapping the third emission area EA3. The openings OP1, OP2 and OP3 may be in line with the emission areas EA1, EA2 and EA3, respectively. In other words, the first opening OP1 may be in line with the first emission area EA1, the second opening OP2 may be in line with the second emission area EA2, and the third opening OP3 may be in line with the third emission area EA3.

The partition walls PW may provide a space where the wavelength conversion layers QDL can be formed. To this end, the partition walls PW may have a thickness, for example, the thickness of the partition wall PW may be in the range of about 1 μm to about 10 μm. The partition walls PW may include an organic insulating material to have a thickness. The organic insulating material may include, for example, an epoxy-based resin, an acrylic-based resin, a cardo-based resin, an imide-based resin, within the spirit and the scope of the disclosure.

The wavelength conversion layers QDL may be disposed on the openings OP1, OP2 and OP3, respectively. The wavelength conversion layers QDL may convert or shift the peak wavelength of the incident light into light of another peak wavelength. The wavelength conversion layers QDL may convert some of the blue first lights emitted from the light-emitting elements LE into a yellow fourth light. In the wavelength conversion layers QDL, the first light and the fourth light may be mixed to emit a white fifth light. The fifth light may be converted into the first light through the first color filter CF1, may be converted into the second light through the second color filter CF2, and may be converted into the third light through the third color filter CF3.

The wavelength conversion layers QDL may be disposed in the openings OP1, OP2 and OP3, respectively, and may be spaced apart from one another. For example, the wavelength conversion layers QDL may be formed in a pattern of dot-shaped islands spaced apart from one another. For example, the wavelength conversion layers QDL may be disposed in the first opening OP1, the second opening OP2 and the third opening OP3, respectively, and the number of the wavelength conversion layers QDL may be equal to the number of the openings. The wavelength conversion layer QDL may be disposed to overlap each of the first emission area EA1, the second emission area EA2 and the third emission area EA3. According to an embodiment, the wavelength conversion layers QDL may completely overlap the first emission area EA1, the second emission area EA2 and the third emission area EA3.

The wavelength conversion layer QDL may include a first base resin BRS1 and first wavelength converting particles WCP1. The first base resin BRS1 may include a light-transmitting organic material. For example, the first base resin BRS1 may include an epoxy-based resin, an acrylic-based resin, a cardo-based resin, an imide-based resin, within the spirit and the scope of the disclosure.

The first wavelength converting particles WCP1 may convert the first light incident from the light-emitting element LE into the fourth light. For example, the first wavelength converting particles WCP1 may convert light in the blue wavelength range into light in the yellow wavelength range. The first wavelength converting particles WCP1 may be quantum dots (QD), quantum rods, fluorescent material, or phosphorescent material. For example, quantum dots may be particulate matter that emits a color as electrons transition from the conduction band to the valence band.

The quantum dots may be semiconductor nanocrystalline material. The quantum dots have a specific or given band gap depending on their compositions and size, and can absorb light and emit light having an intrinsic wavelength. Examples of the semiconductor nanocrystals of the quantum dots may include Group IV nanocrystals, Groups II-VI compound nanocrystals, Groups III-V compound nanocrystals, Groups IV-VI nanocrystals, or combinations thereof.

The group II-VI compounds may be selected from the group consisting of: binary compounds selected from the group consisting of CdSe, CdTe, ZnS, ZnSe, ZnTe, ZnO, HgS, HgSe, HgTe, MgSe, MgS and a mixture thereof; ternary compounds selected from the group consisting of InZnP, AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and a mixture thereof; and quaternary compounds selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe and a mixture thereof.

The group III-V compounds may be selected from the group consisting of: binary compounds selected from the group consisting of GaN, GaP, GaAs, GaSb, AlN, AlP, AlAs, AlSb, InN, InP, InAs, InSb and a mixture thereof; ternary compounds selected from the group consisting of GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP and a mixture thereof; and quaternary compounds selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and a mixture thereof.

The group IV-VI compounds may be selected from the group consisting of: binary compounds selected from the group consisting of SnS, SnSe, SnTe, PbS, PbSe, PbTe and a mixture thereof; ternary compounds selected from the group consisting of SnSeS, SnSeTe, SnSTe, PbSeS, PbSeTe, PbSTe, SnPbS, SnPbSe, SnPbTe and a mixture thereof; and quaternary compounds selected from the group consisting of SnPbSSe, SnPbSeTe, SnPbSTe and a mixture thereof. The group IV elements may be selected from the group consisting of Si, Ge and a mixture thereof. The group IV compounds may be binary compounds selected from the group consisting of SiC, SiGe and a mixture thereof.

The binary compounds, the ternary compounds or the quaternary compounds may be present in the particles at a uniform concentration, or may be present in the same particles at partially different concentrations. They may have a core/shell structure in which one quantum dot surrounds another quantum dot. At the interface between the core and the shell, the gradient of the concentrate of atoms in the shell may decrease toward the center.

According to an embodiment, the quantum dots may have a core-shell structure including a core comprising the nanocrystals and a shell surrounding the core. The shell of the quantum-dots may serve as a protective layer for maintaining the semiconductor properties by preventing chemical denaturation of the core and/or as a charging layer for imparting electrophoretic properties to the quantum dots. The shell may be either a single layer or multiple layers. Examples of the shell of the quantum dot may include an oxide of a metal or a non-metal, a semiconductor compound, a combination thereof, within the spirit and the scope of the disclosure.

For example, examples of the metal or non-metal oxide may include, but is not limited to, binary compounds such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$ and $NiO$ or ternary compounds such as $MgAl_2O_4$, $CoFe_2O_4$, $NiFe_2O_4$ and $CoMn_2O_4$.

Examples of the semiconductor compound may include, but is not limited to, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, within the spirit and the scope of the disclosure.

The wavelength conversion layer QDL may further include scatterers for scattering the light of the light-emitting element LE in random directions. The scatterers may have a refractive index different from that of the first base resin BRS1 and may form an optical interface with the first base resin BRS1. For example, the scatterers may be light-scattering particles. The material of the scatterers is not particularly limited as long as they can scatter at least some of the transmitted lights. For example, the scatterers may be metal oxide particles or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), within the spirit and the scope of the disclosure. Examples of the material of the organic particles may include an acrylic resin, a urethane resin, within the spirit and the scope of the disclosure. The scatterers can scatter light in random directions regardless of the incident direction of the incident lights without substantially converting the wavelengths of the lights.

As the thickness of the wavelength conversion layers QDL increases in the third direction DR3, the content of the first wavelength converting particles WCP1 contained in the wavelength conversion layers QDL increases, so that light conversion efficiency of the wavelength conversion layers QDL can be increased. Therefore, it is desired that the thickness of the wavelength conversion layers QDL is determined based on the light conversion efficiency of the wavelength conversion layers QDL.

In the above-described wavelength conversion portion 200, some of the first lights emitted from the light-emitting elements LE may be converted into the fourth light in the wavelength conversion layers QDL. In the wavelength conversion layers QDL, the first light and the fourth light may be mixed to emit the white fifth light. In case that the fifth light is emitted from the wavelength conversion layers QDL, only the first light may transmit the first color filter CF1, only the second light may transmit the second color filter CF2, and only the third light may transmit the third color filter CF3. Accordingly, the light emitted from the wavelength conversion portion 200 may be blue, red and green light of the first light, the second light and the third light, thereby achieving a full color.

The color filters CF1, CF2 and CF3 may be disposed on the partition walls PW and the wavelength conversion layers QDL. The color filters CF1, CF2 and CF3 may be disposed to overlap the openings OP1, OP2 and OP3 and the wavelength conversion layers QDL. The color filters CF1, CF2 and CF3 may include the first color filter CF1, the second color filter CF2 and the third color filter CF3.

The first color filter CF1 may overlap the first emission area EA1. The first color filter CF1 may be disposed on the first opening OP1 of the partition wall PW to overlap the first opening OP1. The first color filter CF1 may transmit the first light emitted from the light-emitting element LE and may absorb or block the second light and the third light. For example, the first color filter CF1 may transmit light in the blue wavelength range and may absorb or block light in the green and red wavelength ranges.

The second color filter CF2 may overlap the second emission area EA2. The second color filter CF2 may be disposed on the second opening OP2 of the partition wall PW to overlap the second opening OP2. The second color filter CF2 may transmit the second light and may absorb or block the first light and the third light. For example, the second color filter CF2 may transmit light in the green wavelength range and may absorb or block light in the blue and red wavelength ranges.

The third color filter CF3 may overlap the third emission area EA3. The third color filter CF3 may be disposed on the third opening OP3 of the partition wall PW to overlap the third opening OP3. The third color filter CF3 may transmit the third light and may absorb or block the first light and the second light. For example, the third color filter CF3 may transmit light in the red wavelength range and may absorb or block light in the blue and green wavelength ranges.

As shown in FIG. 10, the area of the color filters CF1, CF2 and CF3 may be greater than the area of the emission areas EA1, EA2 and EA3 when viewed from the top (or in a plan view). For example, the first color filter CF1 may have a larger area than the first emission area EA1 when viewed from the top (or in a plan view). The second color filter CF2 may have a larger area than the second emission area EA2 when viewed from the top (or in a plan view). The third color filter CF3 may have a larger area than the third emission area EA3 when viewed from the top (or in a plan view). It should be understood, however, that the disclosure is not limited thereto. The area of the color filters CF1, CF2 and CF3 may be equal to the area of the emission areas EA1, EA2 and EA3 when viewed from the top (or in a plan view).

Referring to FIGS. 4 and 5, the light-blocking member BK may be disposed on the partition walls PW. The light-blocking member BK may overlap the non-emission area NEA to block transmission of light. The light-blocking member BK may be disposed in a substantially lattice shape when viewed from the top (or in a plan view), similar to the bank BNL or the partition walls PW. The light-blocking member BK may overlap the bank BNL, a first organic layer and the partition wall PW, and may not overlap the emission areas EA1, EA2 and EA3.

According to an embodiment, the light-blocking member BK may include an organic light-blocking material and may be formed via processes of coating and exposing the organic light-blocking material to light. The light-blocking member BK may include a dye or pigment having light-blocking properties, and may be a black matrix. At least a portion of the light-blocking member BK may overlap adjacent color filters CF1, CF2 and CF3, and the color filters CF1, CF2 and CF3 may be disposed on at least a portion of the light-blocking member BK.

External light incident from the outside of the display device 10 may result in a problem that the color gamut of the wavelength converting portion 200 is distorted. According to this embodiment where the light-blocking member BK is disposed on the wavelength conversion portion 200, at least a portion of external light is absorbed by the light-blocking member BK. By doing so, it is possible to reduce color distortion due to the reflection of the external light. The light-blocking member BK can prevent the color mixture occurring in case that light leaks between adjacent emission areas, thereby further improving the color gamut.

The protective layer PTL may be disposed on the color filters CF1, CF2 and CF3 and the light-blocking member BK. The first protective layer PTL may be disposed at the top of the display device 10 to protect the color filters CF1, CF2 and CF3 and the light-blocking member BK. One surface or a surface, for example, the lower surface of the protective layer PTL may be in contact with the color filters CF1, CF2 and CF3 and the upper surface of the light-blocking member BK.

The protective layer PTL may include an inorganic insulating material to protect the color filters CF1, CF2 and CF3 and the light-blocking member BK. For example, the first protective layer PTL may include, but is not limited to, silicon oxide (SiOx), silicon nitride (SiNx), silicon oxynitride (SiOxNy), aluminum oxide (AlxOy), aluminum nitride (AlN), within the spirit and the scope of the disclosure. The first protective layer PTL may have a thickness, for example, in a range of about 0.01 to about 1 μm. It is, however, to be understood that the disclosure is not limited thereto.

According to the above-described embodiment, each of the pixel electrodes PE1, PE2 and PE3 may include the reflective electrode layer P2, so that lights emitted from the light-emitting elements LE can be reflected upward to improve out-coupling efficiency. The contact electrodes 160 may be disposed between the light-emitting elements LE and the pixel electrodes PE1, PE2 and PE3 and may have a same size as the light-emitting elements LE when viewed from the top (or in a plan view), and thus it is possible to prevent the lights emitted from the light-emitting elements LE from being absorbed by the contact electrodes 160. By forming the lower and upper electrode layers P1 and P3 in a polycrystalline phase in the pixel electrodes PE1, PE2 and PE3, it is possible to prevent that the reflective electrode layer P2 of each of the pixel electrodes PE1, PE2 and PE3 is etched from the etchant for the contact electrode 160.

Hereinafter, a display device 10 according to an embodiment will be described with reference to other drawings.

Figure 11:
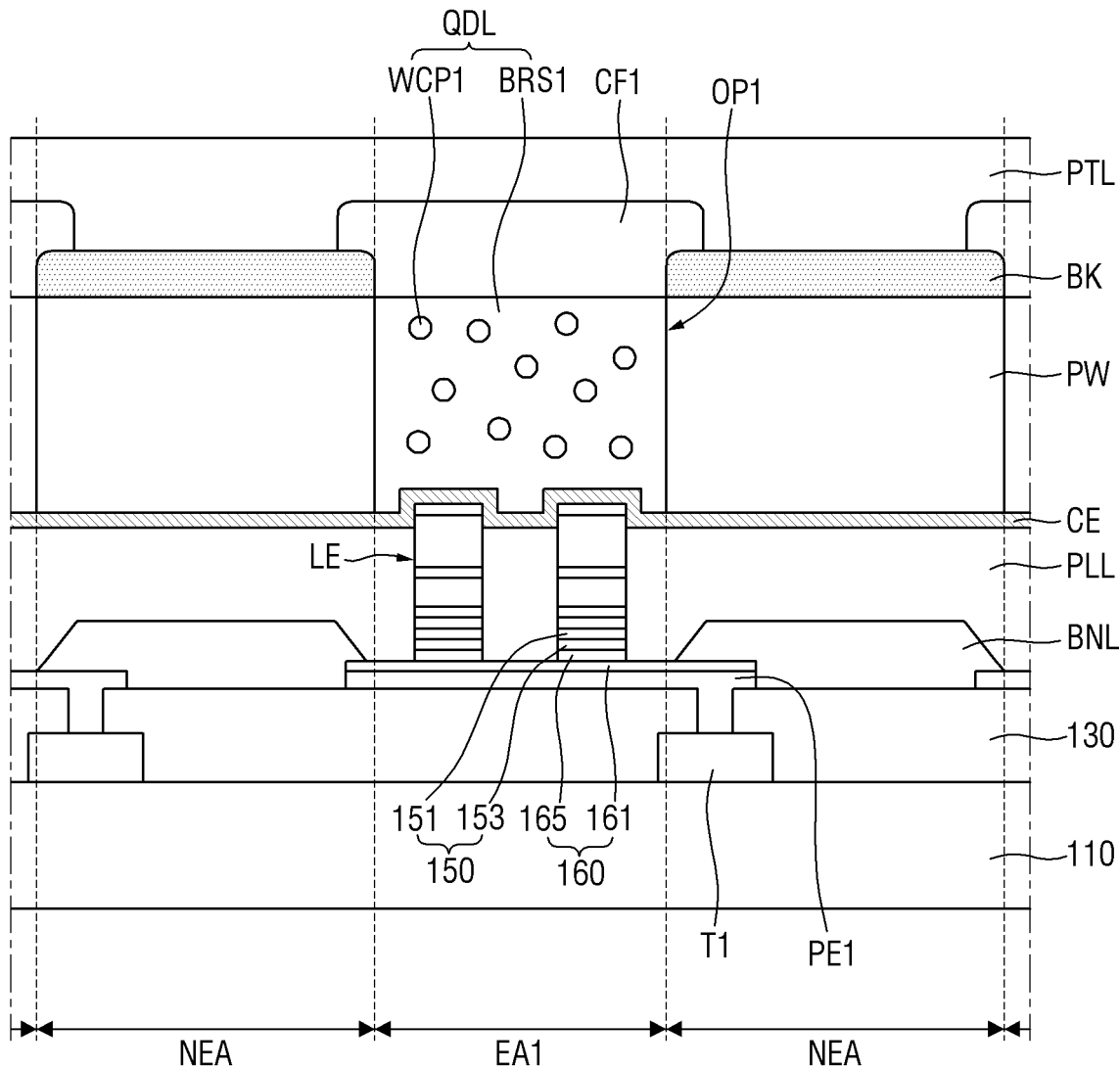
FIG. 11 is an enlarged view schematically showing a first emission area according to an embodiment.
Figure 12:
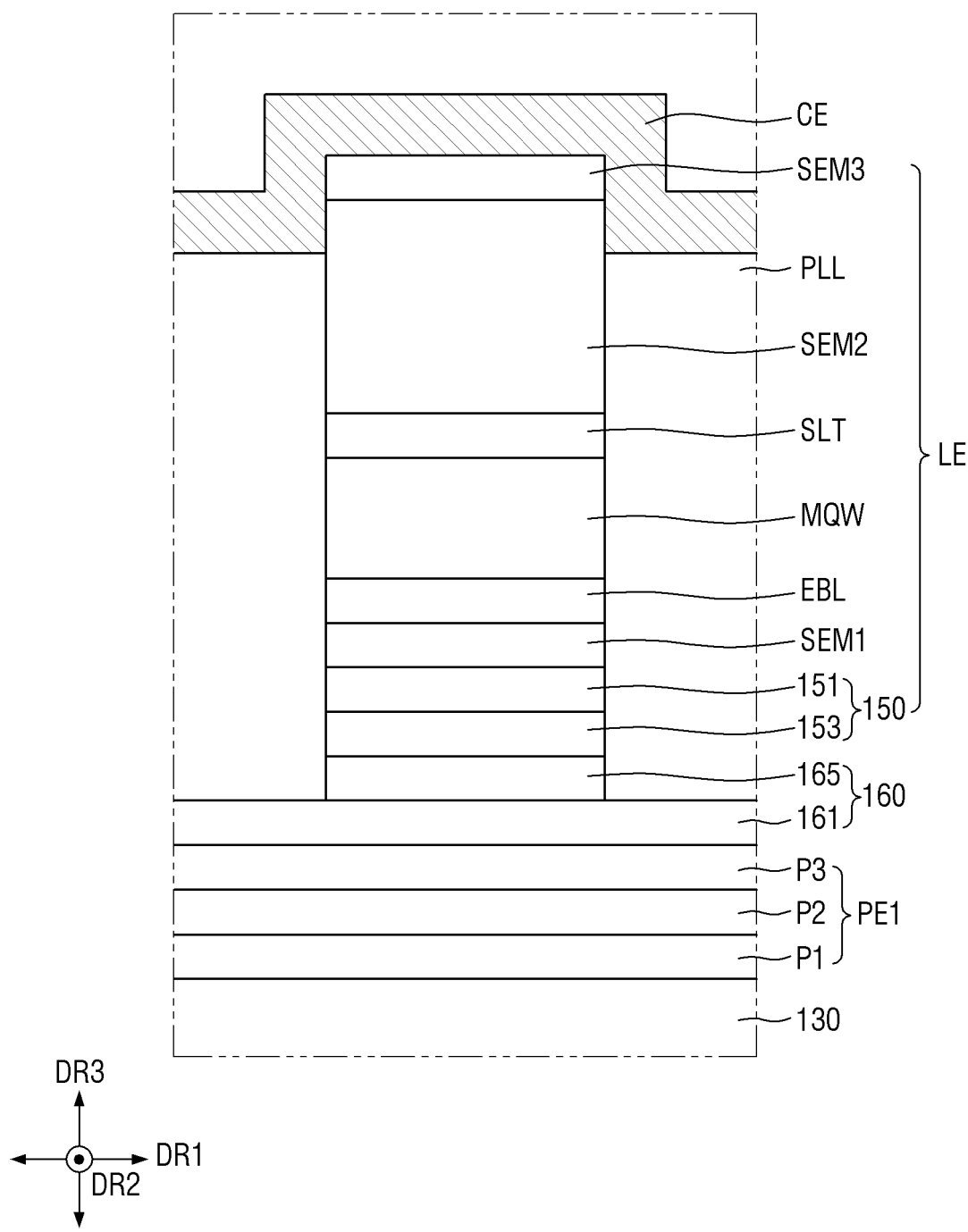
FIG. 12 is a schematic cross-sectional view of a light-emitting element according to an embodiment.
Figure 13A:
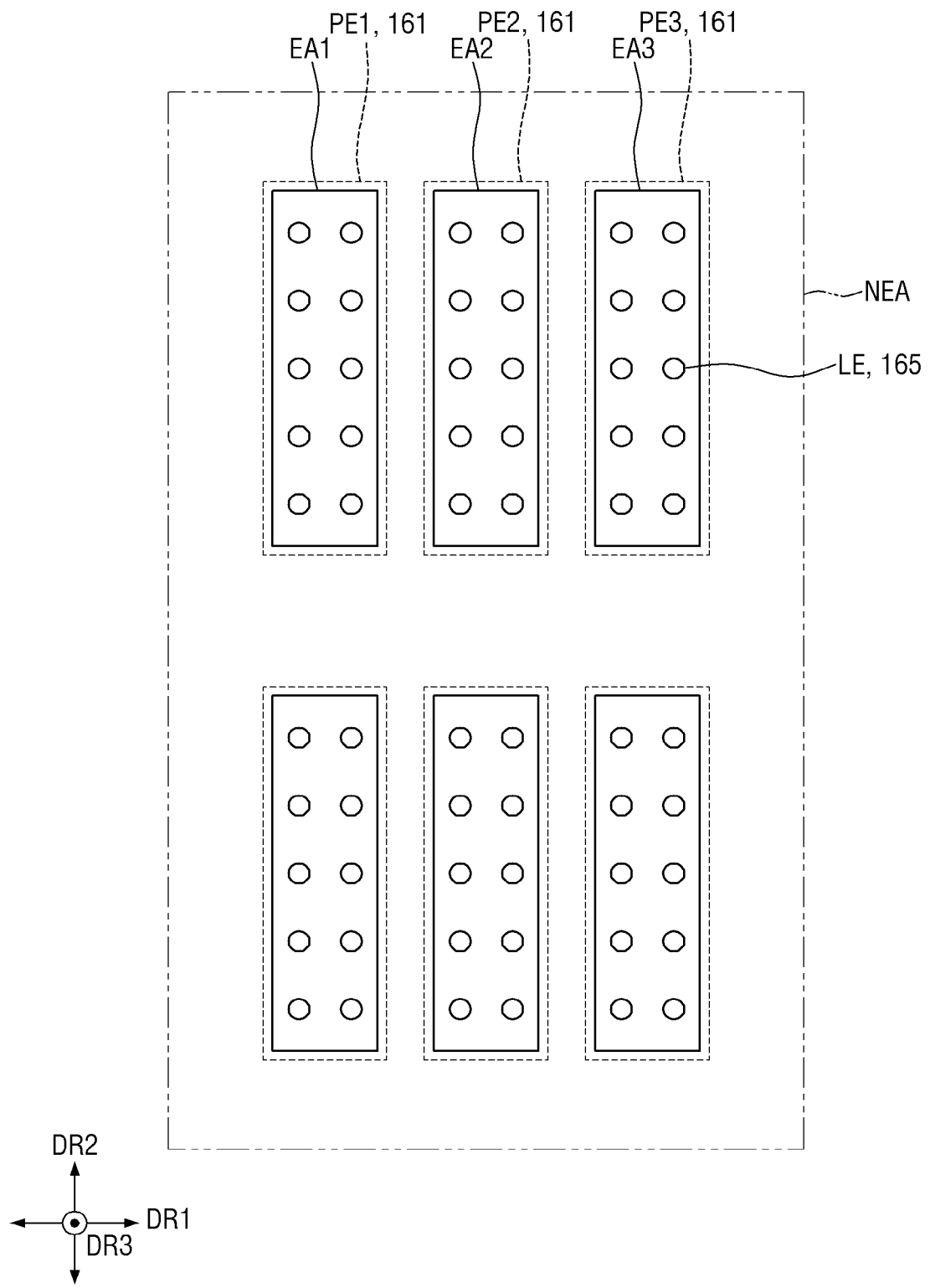
FIGS. 13A and 13B are schematic plan views schematically showing emission areas according to other embodiments.
Figure 13B:
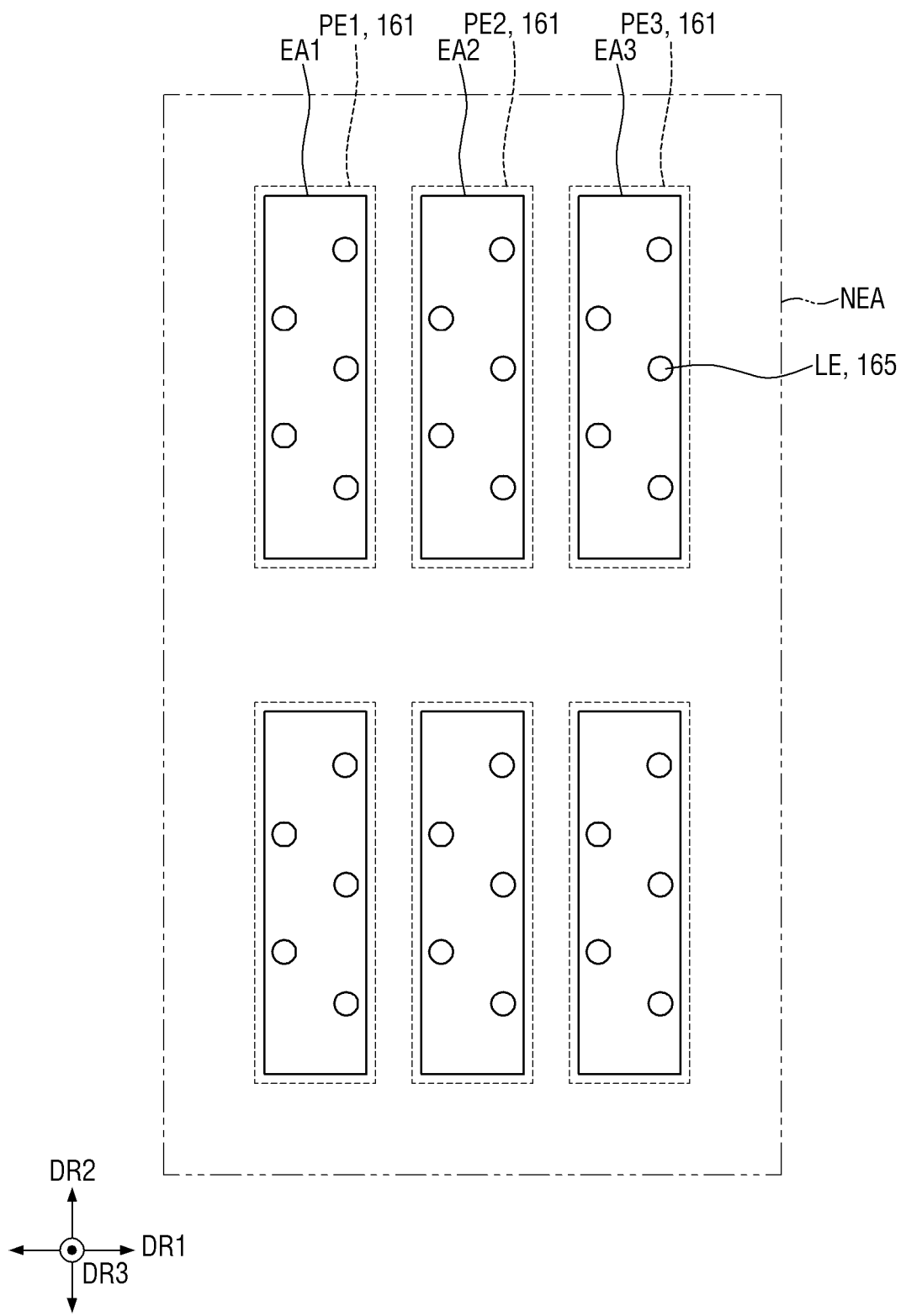
Figure 14:
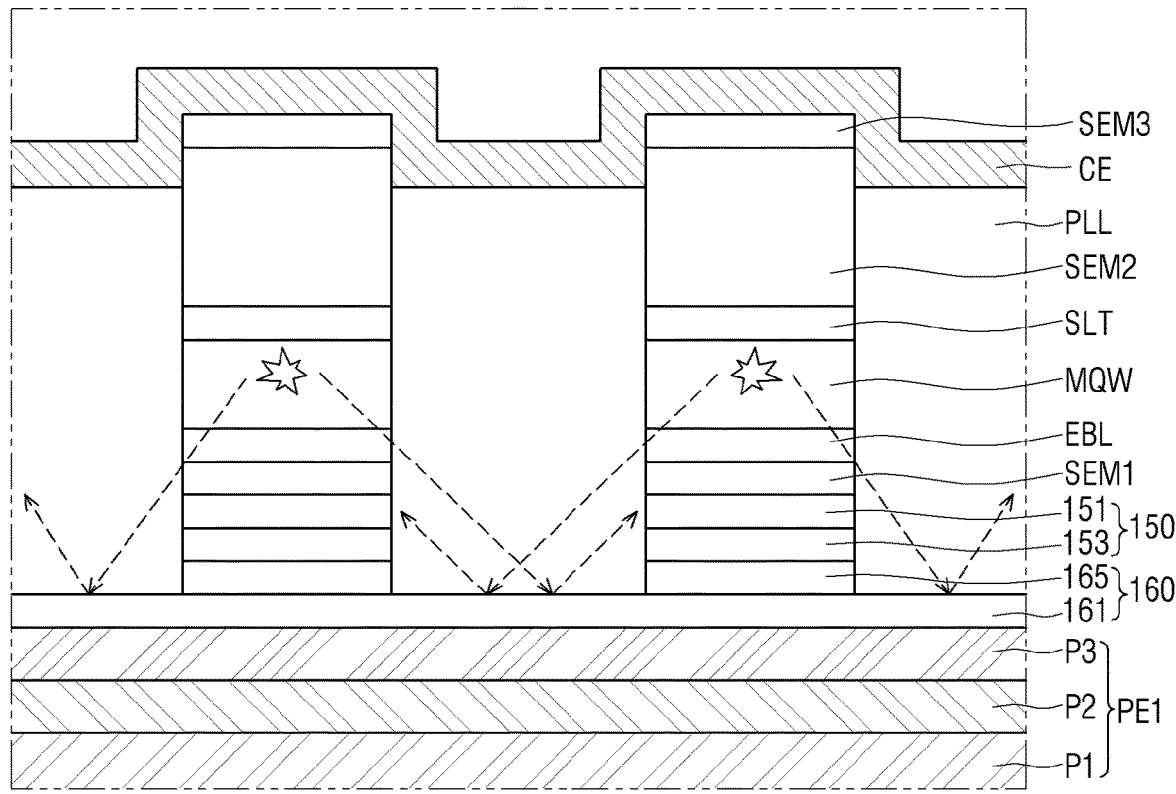
FIG. 14 is a schematic cross-sectional view schematically showing light-emitting elements.
Figure 15:
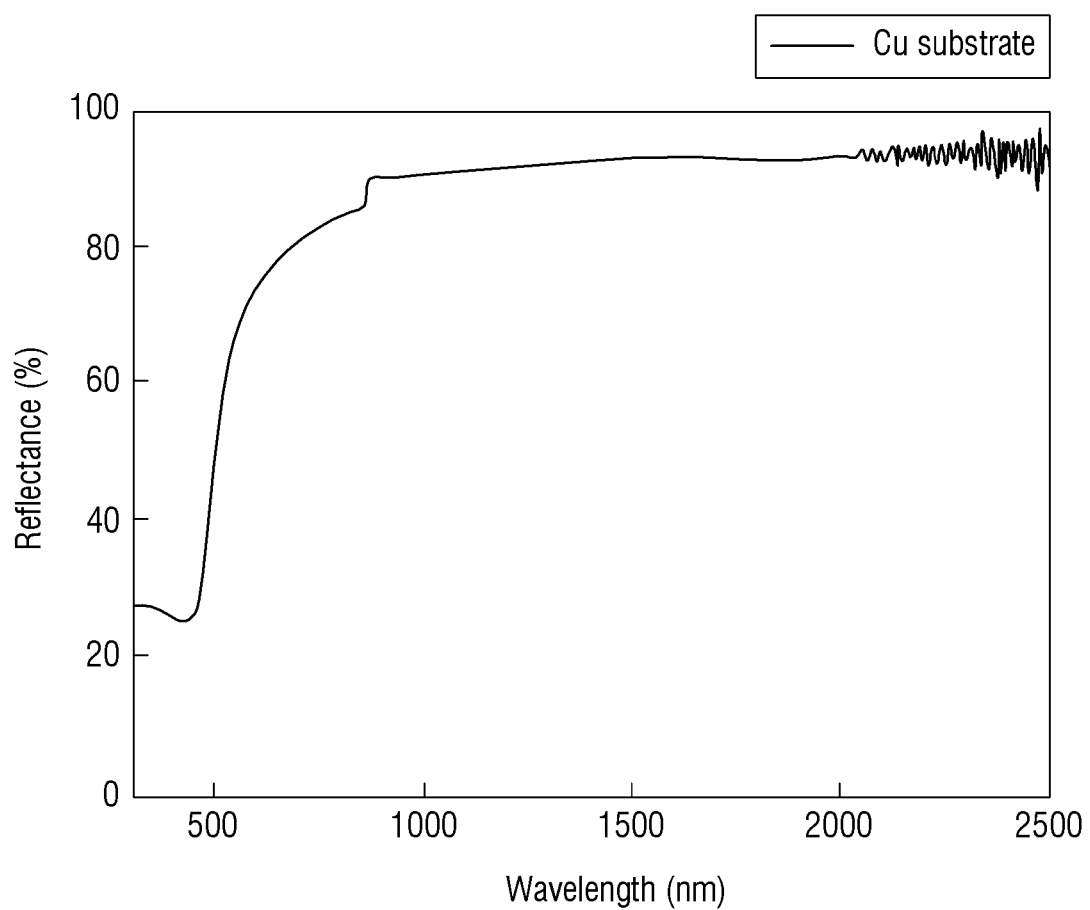
FIG. 15 is a graph showing the reflectance of copper versus wavelength of light.

FIG. 11 is an enlarged view schematically showing a first emission area according to an embodiment. FIG. 12 is a schematic cross-sectional view of a light-emitting element according to an embodiment. FIGS. 13A and 13B are schematic plan views schematically showing emission areas according to other embodiments. FIG. 14 is a schematic cross-sectional view schematically showing light-emitting elements. FIG. 15 is a graph showing the reflectance of copper versus wavelength of light.

An embodiment of FIGS. 11 to 15 may be different from the above-described embodiment of FIGS. 4 to 10 in that the size of a first contact layer 161 of a contact electrode 160 may be equal to the size of each of the pixel electrodes PE1, PE2 and PE3 when viewed from the top (or in a plan view). In the following description, descriptions will focus on the difference from the above embodiments; and, therefore, the redundant descriptions will be omitted.

The contact electrode 160 may be disposed between the light-emitting elements LE and the pixel electrodes PE1, PE2 and PE3. The contact electrode 160 may include a first contact layer 161 and a second contact layer 165. The first contact layer 161 can improve adhesive properties and/or interface properties between the light-emitting elements LE and the pixel electrodes PE1, PE2 and PE3. The size of the first contact electrode 161 may be equal to the size of the pixel electrodes PE1, PE2 and PE3 when viewed from the top (or in a plan view). According to an embodiment, at least one side or a side of the first contact layer 161 may be aligned with and coincide with at least one side or a side of each of the pixel electrodes PE1, PE2 and PE3.

According to an embodiment, the second contact layer 165 of the contact electrode 160 may be made of copper (Cu). As shown in FIG. 15, copper exhibits a very low reflectance on light having blue wavelengths in the range of approximately 440 to approximately 480 nm, which is equal to or less than about 30%.

According to this embodiment, the size of the second contact layer 165 may be equal to the size of the light-emitting elements LE when viewed from the top (or in a plan view) so that light emitted from the light-emitting elements LE is not absorbed by the second contact layer 165.

According to an embodiment, the first contact layer 161 may have a higher reflectance than the second contact layer 165. The size of the first contact layer 161 may be greater than the size of the second contact layer 165 when viewed from the top (or in a plan view). In an embodiment, at least one side or a side of the first contact layer 161 may protrude outward than at least one side or a side of the second contact layer 165. Accordingly, as shown in FIG. 14, lights emitted from the active layers MQW of the light-emitting elements LE are reflected off the first contact layer 161 and proceeds upward, thereby improving the out-coupling efficiency.

Incidentally, as shown in FIG. 13A, the light-emitting elements LE may be arranged in a matrix shape in the first direction DR1 and the second direction DR2 on each of the emission areas EA1, EA2 and EA3. In an embodiment, as shown in FIG. 13B, the light-emitting elements LE may be arranged in a matrix shape inclined by approximately 45 degrees. As will be described later, transfer films in which the light-emitting elements LE are arranged are stretched and they are transferred to support films, and they may be slightly inclined relative to each pixel electrode PE1, PE2 and PE3 of the first substrate 110 and bonded thereto.

Hereinafter, processing steps of fabricating the display device 10 will be described with reference to other drawings.

Figure 16:
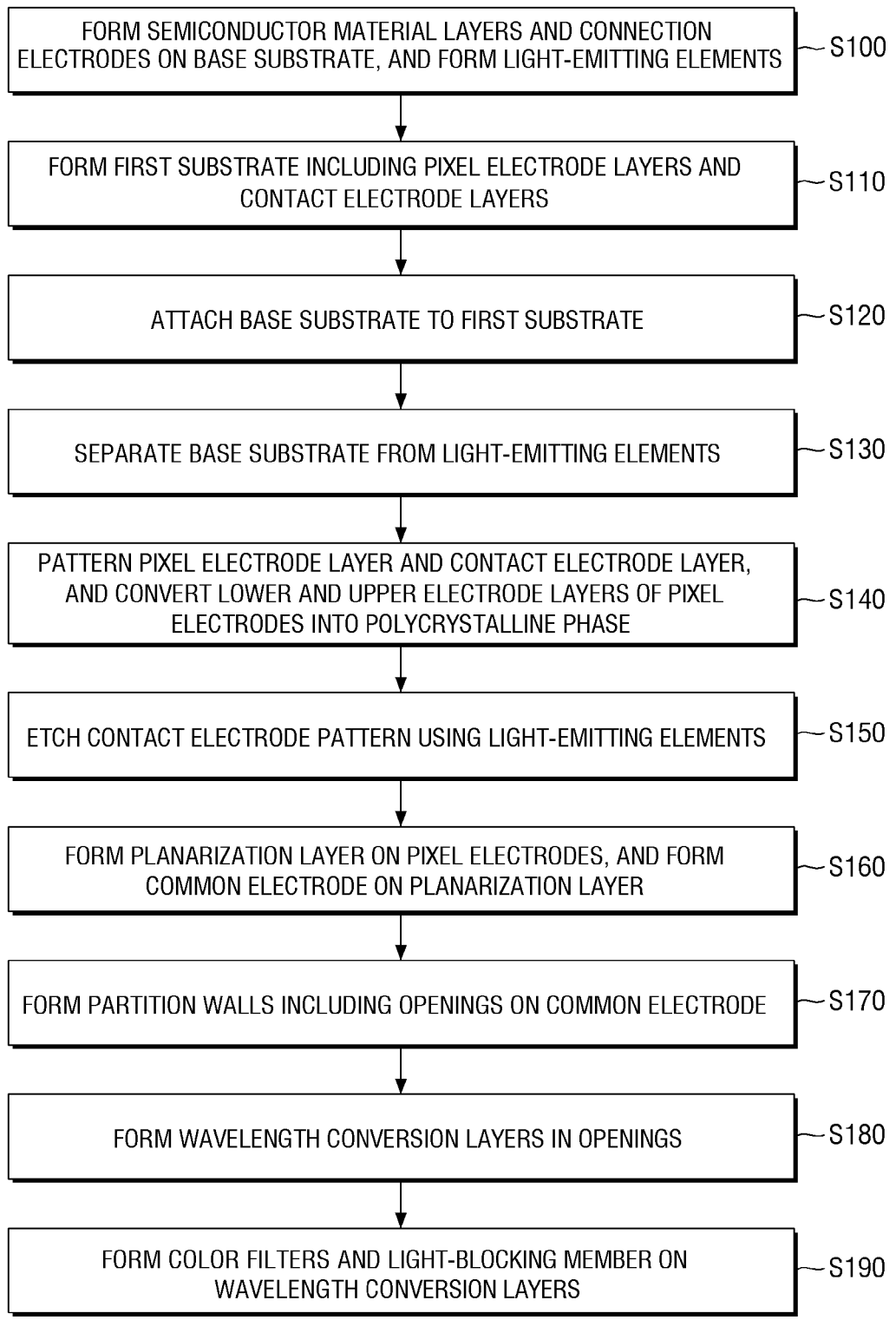
FIG. 16 is a flowchart for illustrating a method of fabricating a display device according to an embodiment.

FIG. 16 is a flowchart for illustrating a method of fabricating a display device according to an embodiment. FIGS. 17 to 27 are schematic cross-sectional views for illustrating the method of fabricating a display device according to an embodiment.

Figure 17:
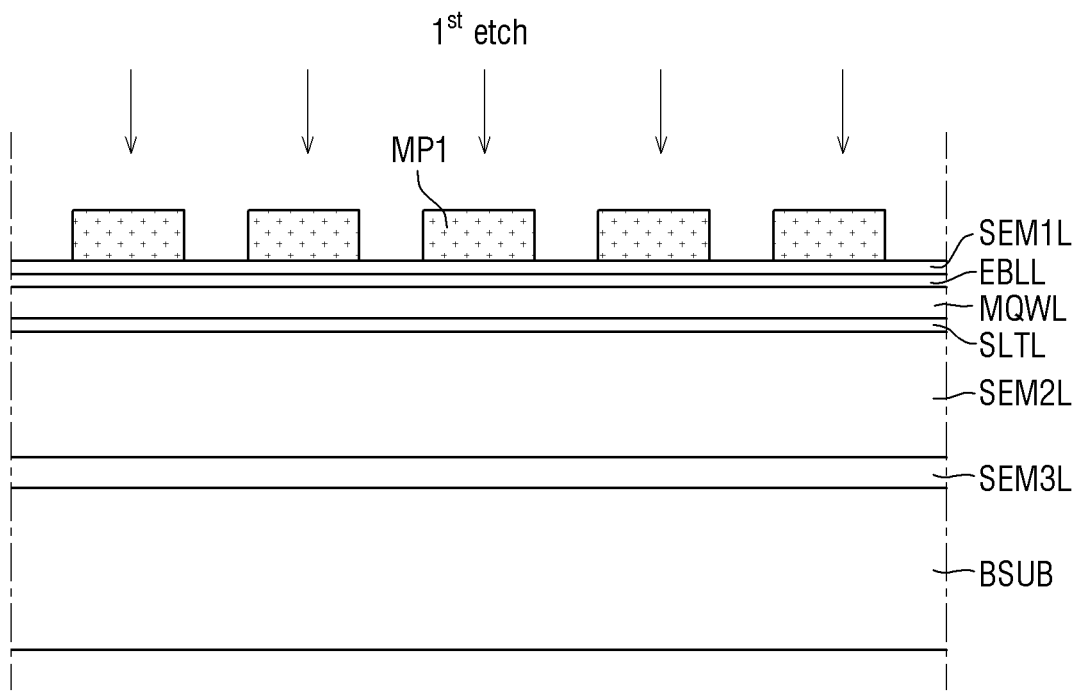

FIGS. 17 to 27 are schematic cross-sectional views showing structures of layers of the display device 10 according to the order in which they are formed. FIGS. 17 to 27 show a process of fabricating the light-emitting element portion LEP and the wavelength converting portion 200, which may correspond to the schematic cross-sectional view of FIG. 5. In the following description, the first emission area EA1 of the display device 10 will be illustrated. Hereinafter, a method of fabricating the display device shown in FIGS. 17 to 27 will be described in conjunction with FIG. 16. Referring to FIG. 17, semiconductor material layers SEM3L, SEM2L, SLTL, MQWL, EBLL and SEM1L is formed on a base substrate BSUB and light-emitting elements LE is formed (step S100 in FIG. 16).

Initially, a base substrate BSUB is prepared. The base substrate BSUB may be a sapphire substrate ($Al_2O_3$) or a silicon wafer including silicon. It should be understood, however, that the disclosure is not limited thereto. According to an embodiment, the base substrate BSUB is a sapphire substrate.

Semiconductor material layers SEM3L, SEM2L, SLTL, MQWL, EBLL and SEM1L is formed on the base substrate BSUB. The semiconductor material layers grown by the epitaxial method may be formed by growing a seed crystal. The method of forming the semiconductor material layers may include an electron beam deposition method, physical vapor deposition (PVD), chemical vapor deposition (CVD), plasma laser deposition (PLD), dual-type thermal evaporation, sputtering, metal-organic chemical vapor deposition (MOCVD), within the spirit and the scope of the disclosure. The method may be carried out by metal-organic chemical vapor deposition (MOCVD). It is, however, to be understood that the disclosure is not limited thereto.

A precursor material for forming the semiconductor material layers is not particularly limited and any suitable material may be selected as long as it can form a target material. For example, the precursor material may be a metal precursor including an alkyl group such as a methyl group or an ethyl group. For example, it may be, but is not limited to, a compound such as trimethyl gallium ($Ga(CH_3)_3$), trimethyl aluminum ($Al(CH_3)_3$), or triethyl phosphate ($(C_2H_5)_3PO_4$).

A third semiconductor material layer SEM3L is formed on the base substrate BSUB. Although the third semiconductor layer SEM3 is a single layer in the drawings, the disclosure is not limited thereto. The third semiconductor layer SEM3 may form layers. The third semiconductor material layer SEM3L may be disposed to reduce a lattice constant difference between the second semiconductor material layer SEM2L and the base substrate BSUB. For example, the third semiconductor material layer SEM3L may include an undoped semiconductor, and may be a material not doped into an n-type or p-type. In an embodiment, the third semiconductor material layer SEM3L may be, but is not limited to, at least one of undoped InAlGaN, GaN, AlGaN, InGaN, AlN, and InN.

The second semiconductor material layer SEM2L, the superlattice material layer SLTL, the active material layer MQWL, the electron blocking material layer EBLL and the first semiconductor material layer SEM1L are sequentially formed on the third semiconductor material layer SEM3L using the above-described method.

Subsequently, the semiconductor material layers SEM3L, SEM2L, SLTL, MQWL, EBLL and SEM1L are etched to form light-emitting elements LE.

First mask patterns MP1 may be formed on the first semiconductor material layer SEM1L. The first mask pattern MP1 may be a hard mask including an inorganic material or a photoresist mask including an organic material. The first mask pattern MP1 prevents the semiconductor material layers SEM3L, SEM2L, SLTL, MQWL, EBLL and SEM1L from being etched. Subsequently, parts of the semiconductor material layers are etched ($1^{st}$ etch) using the first mask patterns MP1 as a mask, to form light-emitting elements LE.

Figure 18:
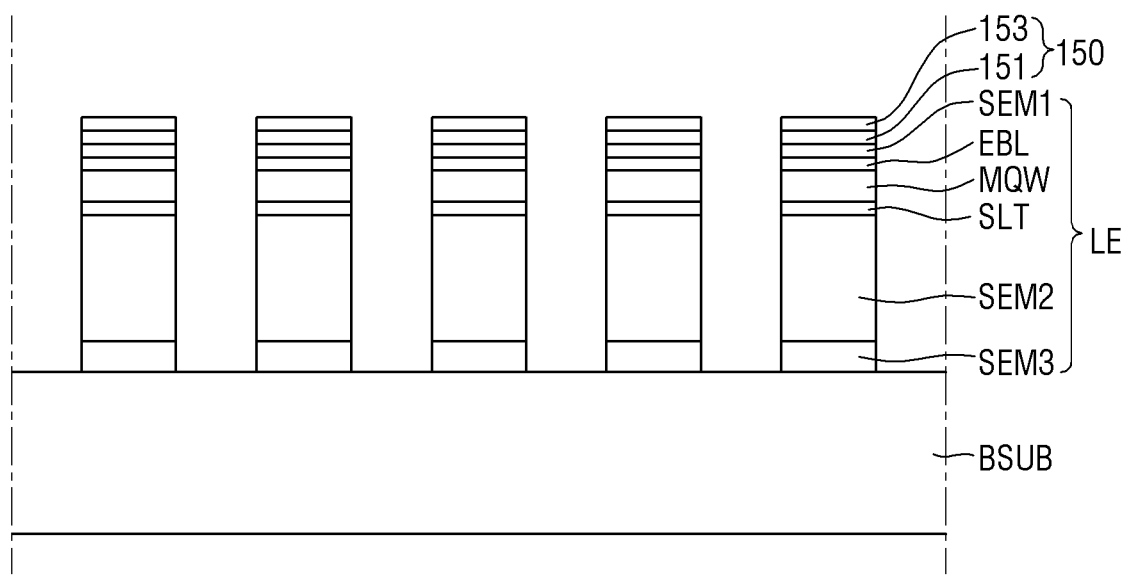

As shown in FIG. 18, semiconductor material layers SEM3L, SEM2L, SLTL, MQWL, EBLL and SEM1L which does not overlap the first mask pattern MP1 are etched and removed from the base substrate BSUB. The other parts thereof which overlap the first mask pattern MP1 and thus are not etched may be formed as light-emitting elements LE.

The semiconductor material layers may be etched by suitable methods. For example, the process of etching the semiconductor material layers may include dry etching, wet etching, reactive ion etching (RIE), deep reactive ion etching (DRIE), inductively-coupled-plasma reactive ion etching (ICP-RIE), within the spirit and the scope of the disclosure. The dry etching allows for anisotropic etching, and thus it may be suitable for vertical etching. In case that any of the above-described etching methods is used, the etching etchant may be $Cl_2$ or $O_2$. It is, however, to be understood that this is merely illustrative.

The semiconductor material layers SEM3L, SEM2L, SLTL, MQWL, EBLL and SEM1L overlapping the first mask pattern MP1 are not etched and formed as the light-emitting elements LE. Accordingly, each of the light-emitting elements LE may include the third semiconductor layer SEM3, the second semiconductor layer SEM2, the superlattice layer SLT, the active layer MQW, the electron blocking layer EBL and the first semiconductor layer SEM1.

Subsequently, the connection electrodes 150 are formed on the light-emitting elements LE by stacking connection electrode material layers on the base substrate BSUB and etching them. A reflective layer material layer and a connection layer material layer may be sequentially stacked on the base substrate BSUB, and they are etched altogether, such that the connection electrode 150 including the reflective layer 151 and the connection layer 153 may be formed. The connection electrode 150 may be formed on or directly formed on the upper surface of the first semiconductor layer SEM1 of the light-emitting element LE. According to an embodiment, the reflective layer 151 of the connection electrode 150 may be in direct contact with the upper surface of the first semiconductor layer SEM1 of the light-emitting element LE. The light-emitting element LE may include the connection electrode 150.

Subsequently, referring to FIG. 19, a first substrate 110 including a pixel electrode layer PEL and a contact electrode layer 160L is formed (step S110 of FIG. 16).

A first switching element T1 may be formed on the first substrate 110, and an insulating layer 130 is formed over the first switching element T1. The first substrate 110 may be a transparent insulating substrate, or a glass or quartz substrate. The first switching element T1 may include thin-film transistors and capacitors. In the insulating layer 130, a contact hole exposing the first switching element T1 may be formed.

A transparent conductive material may be stacked on the insulating layer 130 to form a lower electrode material layer P1L, a metal material may be stacked thereon to form a reflective material layer P2L, and a transparent conductive material may be stacked thereon again to form an upper electrode material layer P3L, to form a pixel electrode layer PEL. A first contact layer material layer 161L and a second contact layer material layer 165L may be stacked on the pixel electrode layer PEL, to form the contact electrode layer 160L. The pixel electrode layer PEL may be connected to the first switching element T1 through a contact hole formed in the insulating layer 130.

The base substrate BSUB is attached to the first substrate 110 (step S120 of FIG. 16).

The base substrate BSUB is aligned on the first substrate 110. In doing so, the connection electrodes 150 of the light-emitting elements LE formed on the base substrate BSUB are aligned so that they are oriented toward the first substrate 110.

Subsequently, the first substrate 110 and the base substrate BSUB are attached together. The connection electrodes 150 of the light-emitting elements LE formed on the base substrate BSUB are brought into contact with the second contact layer material layer 165L of the first substrate 110. In doing so, the connection layers 153 of the light-emitting elements LE are in contact with the second contact layer material layer 165L. Subsequently, the first substrate 110 and the base substrate BSUB are attached together by fusion bonding the connection layers 153 of the light-emitting elements LE with the second contact layer material layer 165L. The light-emitting elements LE is adhered to the upper surface of the second contact layer material layer 165L. For fusion bonding, a laser may be irradiated to the second contact layer material layer 165L from above the base substrate BSUB. High heat of the laser is conducted to the second contact layer material layer 165L irradiated with the laser, so that the interface with the connection layers 153 of the light-emitting elements LE can be adhered to the second contact layer material layer 165L. For example, since the second contact layer material layer 165L is made of copper (Cu) having excellent thermal conductivity, adhesive properties with the connection layer 153 of the light-emitting element LE may be excellent. An yttrium aluminum garnet (YAG) laser may be used as the source of laser used for the fusion bonding.

Subsequently, the base substrate BSUB is separated from the light-emitting elements LE (step S130 of FIG. 16).

Figure 20:
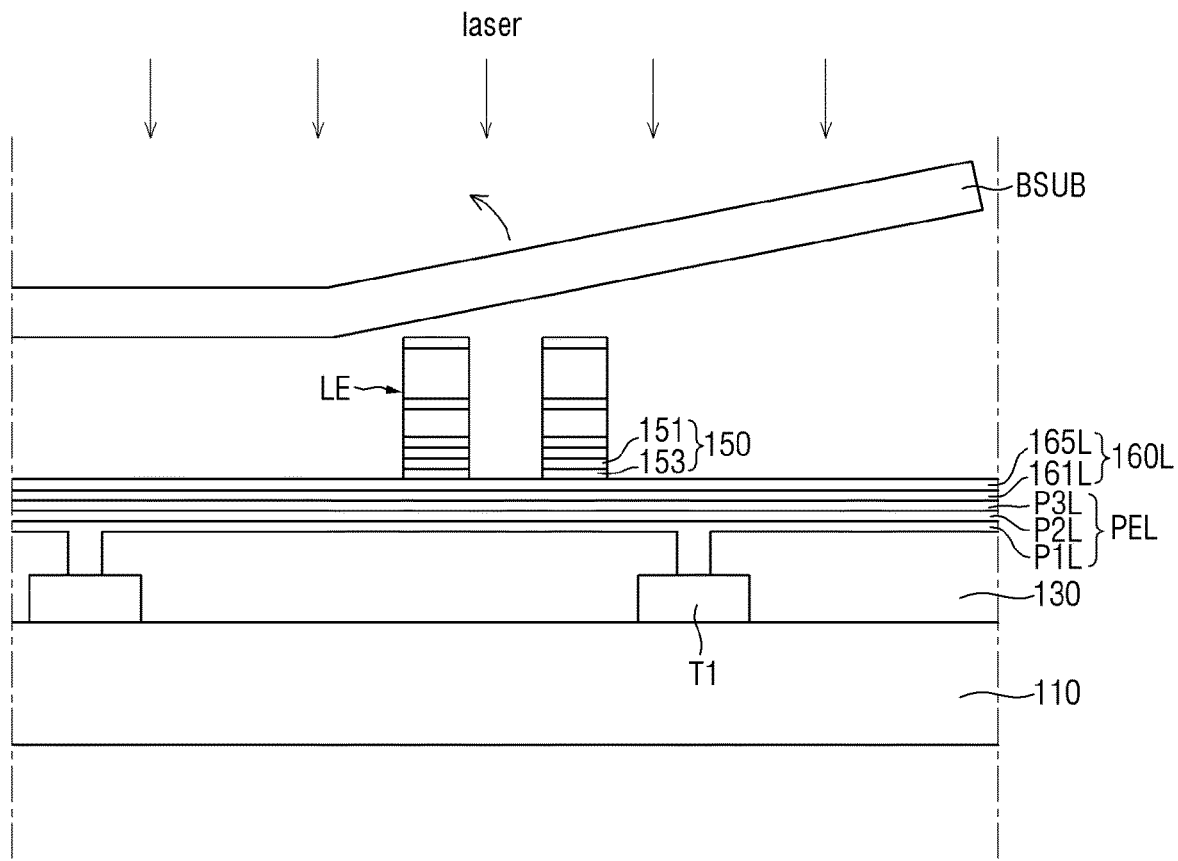

Referring to FIG. 20, the base substrate BSUB is separated from the third semiconductor layer SEM3 of the light-emitting elements LE. The process of separating the base substrate BSUB may be carried out by using a laser lift-off (LLO) technology. The laser lift-off process uses a laser, and a KrF excimer laser (wavelength of about 248 nm) may be used as the source. The energy density of the excimer laser is irradiated in the range of approximately 550 mJ/cm$^2$ to approximately 950 mJ/cm$^2$, and the incident area may be in the range of about 50×50 μm$^2$ to about 1×1 cm$^2$. It should be understood, however, that the disclosure is not limited thereto. In case that the laser is irradiated onto the base substrate BSUB, the base substrate BSUB may be separated from the light-emitting elements LE.

Subsequently, the pixel electrode layer PEL and the contact electrode layer 160L are patterned, and the lower electrode layer P1 and the upper electrode layer P3 of the first pixel electrode PE1 are converted into a polycrystalline phase (step S140 of FIG. 16).

Figure 21:
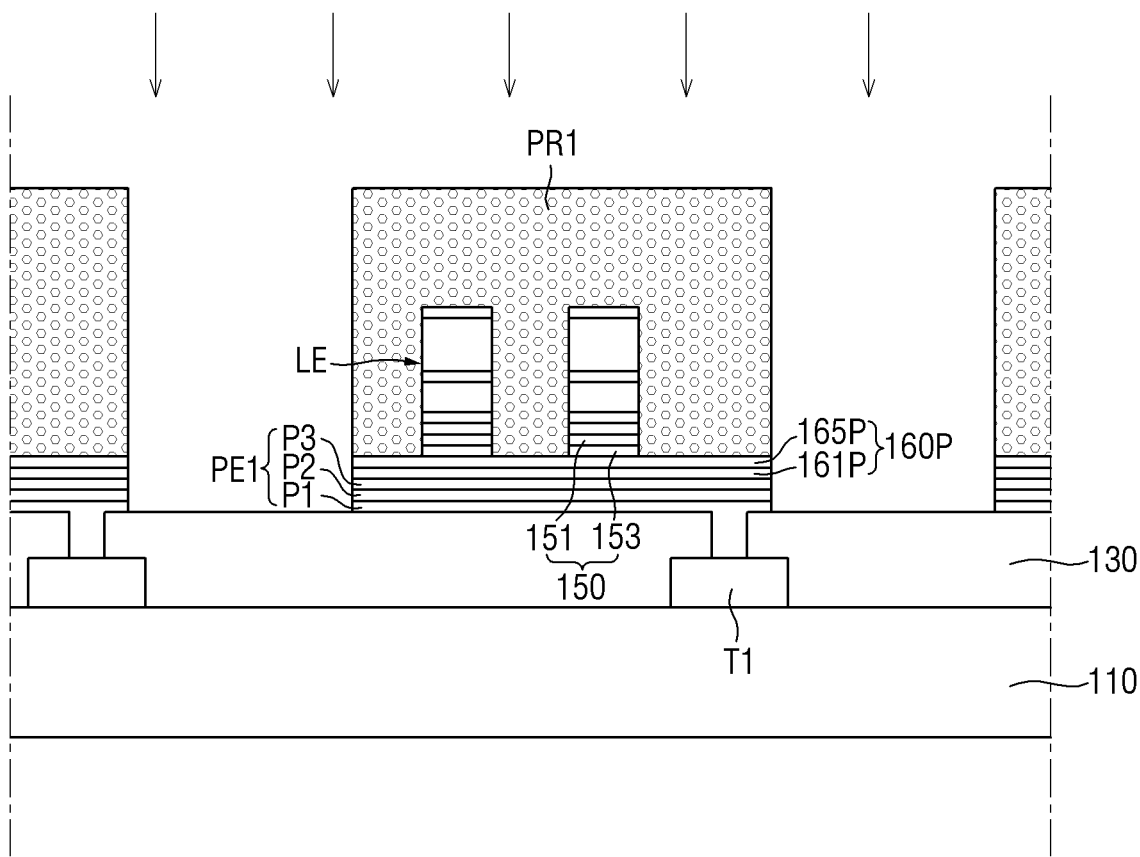

Referring to FIG. 21, a first photoresist pattern PR1 is formed by applying a photoresist on the first substrate 110 on which the light-emitting elements LE are formed, and exposing and developing it. The first photoresist pattern PR1 may cover or overlap the light-emitting elements LE and a portion of the pixel electrode layer PEL. An etchant is sprayed onto the first substrate 110 to etch the pixel electrode layer PEL, the first contact layer material layer 161L, and the second contact layer material layer 165L altogether. Accordingly, the pixel electrode layer PEL is formed into the first pixel electrode PE1 including the lower electrode layer P1, the reflective electrode layer P2 and the upper electrode layer P3. The first contact layer material layer 161L is formed into a first contact layer pattern 161P, and the second contact layer material layer 165L is formed into a second contact layer pattern 165P, so that the contact electrode pattern 160P is formed.

Subsequently, referring to FIG. 22, the first photoresist pattern PR1 is removed by stripping or ashing it. Subsequently, heat treatment is carried out on the first substrate 110 on which the light-emitting elements LE and the first pixel electrode PE1 are formed, to convert the lower electrode layer P1 and the upper electrode layer P3 of the first pixel electrode PE1 is into a polycrystalline phase.

The heat treatment on the first substrate 110 may be carried out at approximately 150 to approximately 200 degrees Celsius or in a range of about 150 to about 200 degrees Celsius for several minutes to several tens of minutes. The lower electrode layer P1 and the upper electrode layer P3 may be in an amorphous phase and may be convert into a polycrystalline phase by heat treatment. As the phase of the lower electrode layer P1 and the upper electrode layer P3 changes, their physical properties may change accordingly.

Subsequently, the contact electrode pattern 160P is etched using the light-emitting elements LE (step S150 of FIG. 16).

Figure 23:
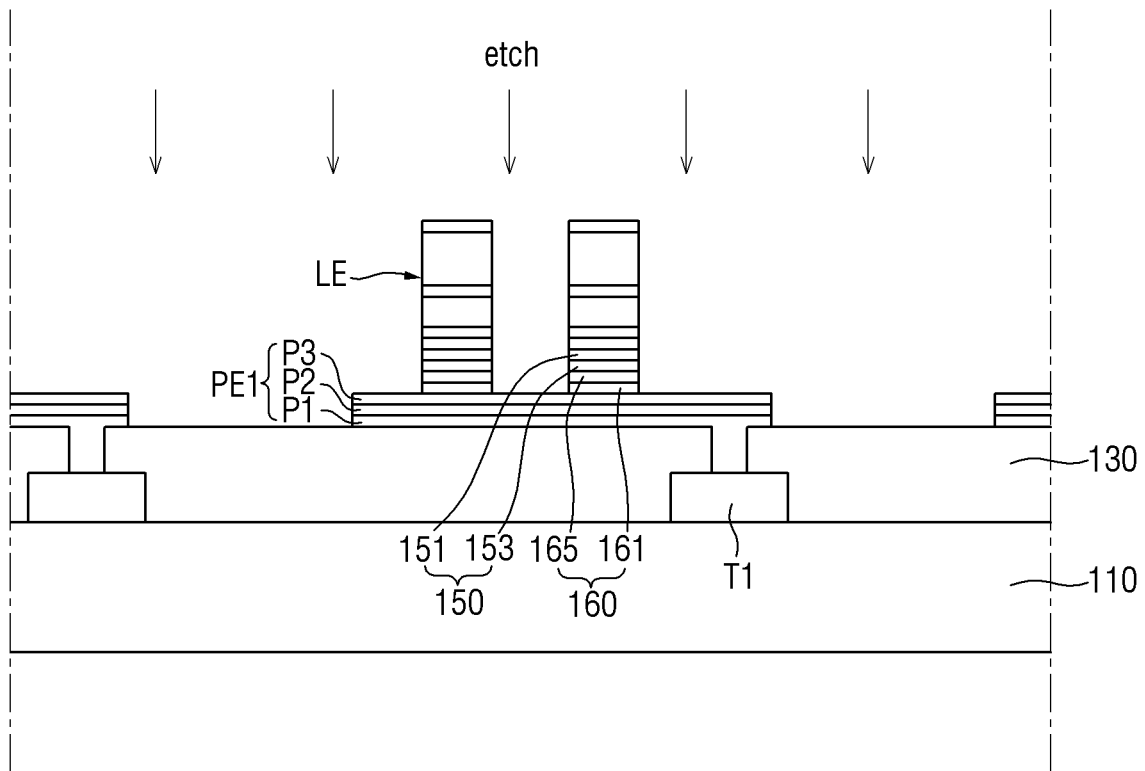

Referring to FIG. 23, the first contact layer pattern 161P and the second contact layer pattern 165P, which are the contact electrode patterns 160P, are etched using the light-emitting elements LE as a mask. An etchant capable of etching the first contact layer pattern 161P and the second contact layer pattern 165P is sprayed onto the first substrate 110. Parts of the first contact layer pattern 161P and the second contact layer pattern 165P masked by the light-emitting elements LE are not etched, while the other parts not masked by the light-emitting elements LE are etched. Accordingly, the first contact layer pattern 161P may be formed as the first contact layer 161, and the second contact layer pattern 165P may be formed as the second contact layer 165, thereby forming the contact electrode 160. In this instance, the size of the contact electrode 160 may be equal to the size of the light-emitting elements LE when viewed from the top (or in a plan view). According to an embodiment, the side surfaces of the contact electrode 160 may be aligned with and coincide with the side surfaces of the light-emitting elements LE. The contact electrode 160 may completely overlap the light-emitting elements LE.

According to this embodiment, the upper electrode layer P3 of the first pixel electrode PE1 is converted into the polycrystalline phase, and thus it is not etched by the etchant. Accordingly, the upper electrode layer P3 disposed on the reflective electrode layer P2 can mask the reflective electrode layer P2 thereunder from the etchant, thereby preventing the reflective electrode layer P2 from being etched.

Subsequently, a bank BNL covering or overlapping edges of the first pixel electrode PE1 is formed, a planarization layer PLL is formed on the first pixel electrode PE1, and a common electrode CE is formed on the planarization layer PLL (step S160 in FIG. 16).

Referring to FIG. 24, a bank BNL is formed by applying an organic material over the first substrate 110. The bank BNL may cover or overlap the edges of the first pixel electrode PE1 to partition the emission area EA1 and the non-emission area NEA. Accordingly, the light-emitting elements LE may be disposed in the emission area EA1 and may not overlap the bank BNL.

Subsequently, the planarization layer PLL is formed on the first pixel electrode PE1 and the bank BNL. The planarization layer PLL is formed to have a thickness smaller than the height of the light-emitting elements LE so that the second semiconductor layer SEM2 and the third semiconductor layer SEM3 of the light-emitting elements LE are exposed.

The common electrode CE is formed by depositing a transparent conductive material on the planarization layer PLL. The common electrode CE is formed to cover or overlap the light-emitting elements LE and the planarization layer PLL. The common electrode CE is in contact with the second semiconductor layer SEM2 and the third semiconductor layer SEM3 of each of the light-emitting elements LE which are exposed from the planarization layer PLL.

Subsequently, partition walls PW including openings OP1 are formed on the common electrode CE (step S170 of FIG. 16).

Referring to FIG. 25, an organic material is applied onto the display substrate 100 including the common electrode CE and is patterned, to form the partition walls PW. The openings, for example, the first opening OP1 may be formed in line with the first emission area EA1. Although not shown in the drawings, other openings may be formed in line with other emission areas, respectively.

Subsequently, wavelength conversion layers QDL are formed in openings OP1, respectively. (Step S180 of FIG. 16).

Figure 26:
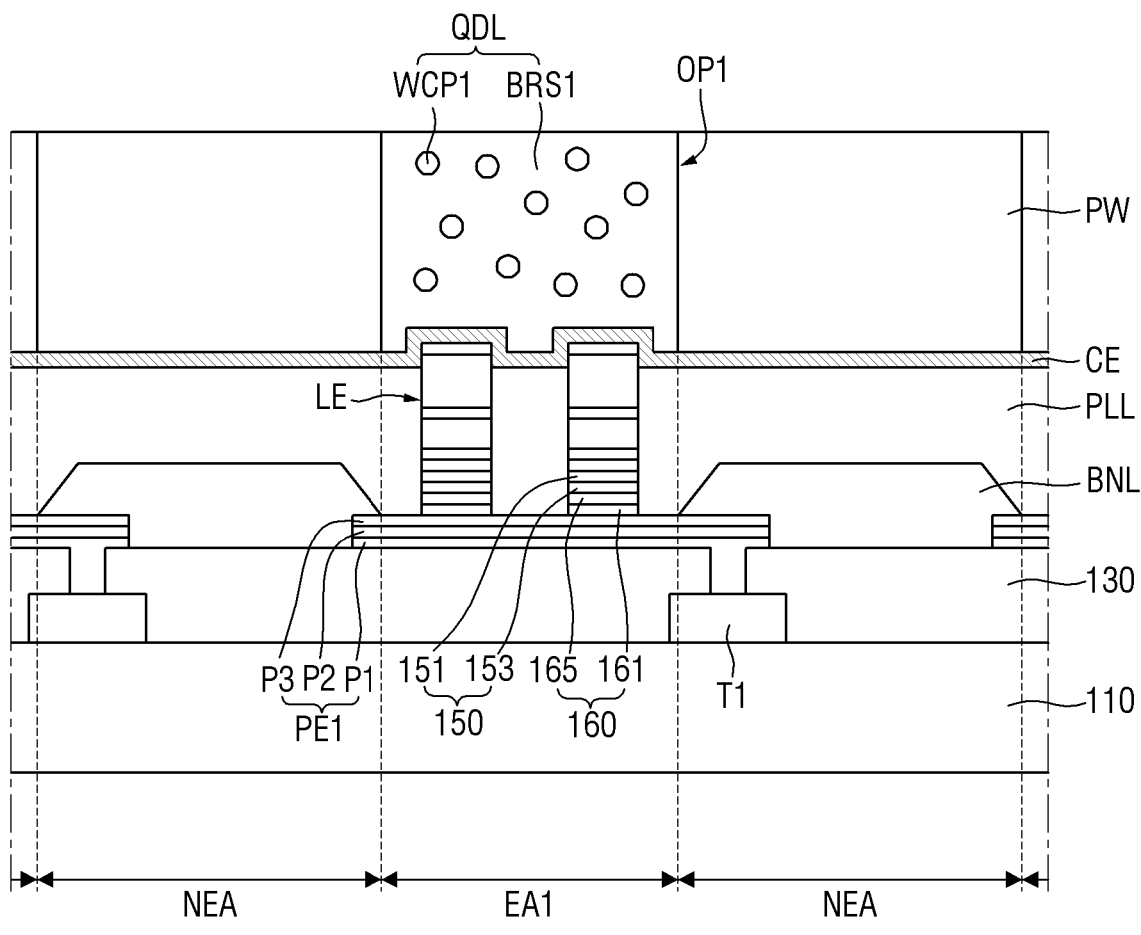

Referring to FIG. 26, the openings OP1 may be filled with the wavelength conversion layers QDL, respectively. The wavelength conversion layers QDL may be formed by a solution process such as inkjet printing and imprinting with a solution in which the first wavelength converting particles WCP1 are mixed in a first base resin BRS1, but the disclosure is not limited thereto. The wavelength conversion layers QDL may be formed in the openings OP1, respectively, and may be formed to overlap the emission areas EA1.

Subsequently, a color filter CF1 and a light-blocking member BK are formed on the wavelength conversion layer QDL (step S190 of FIG. 16).

Figure 27:
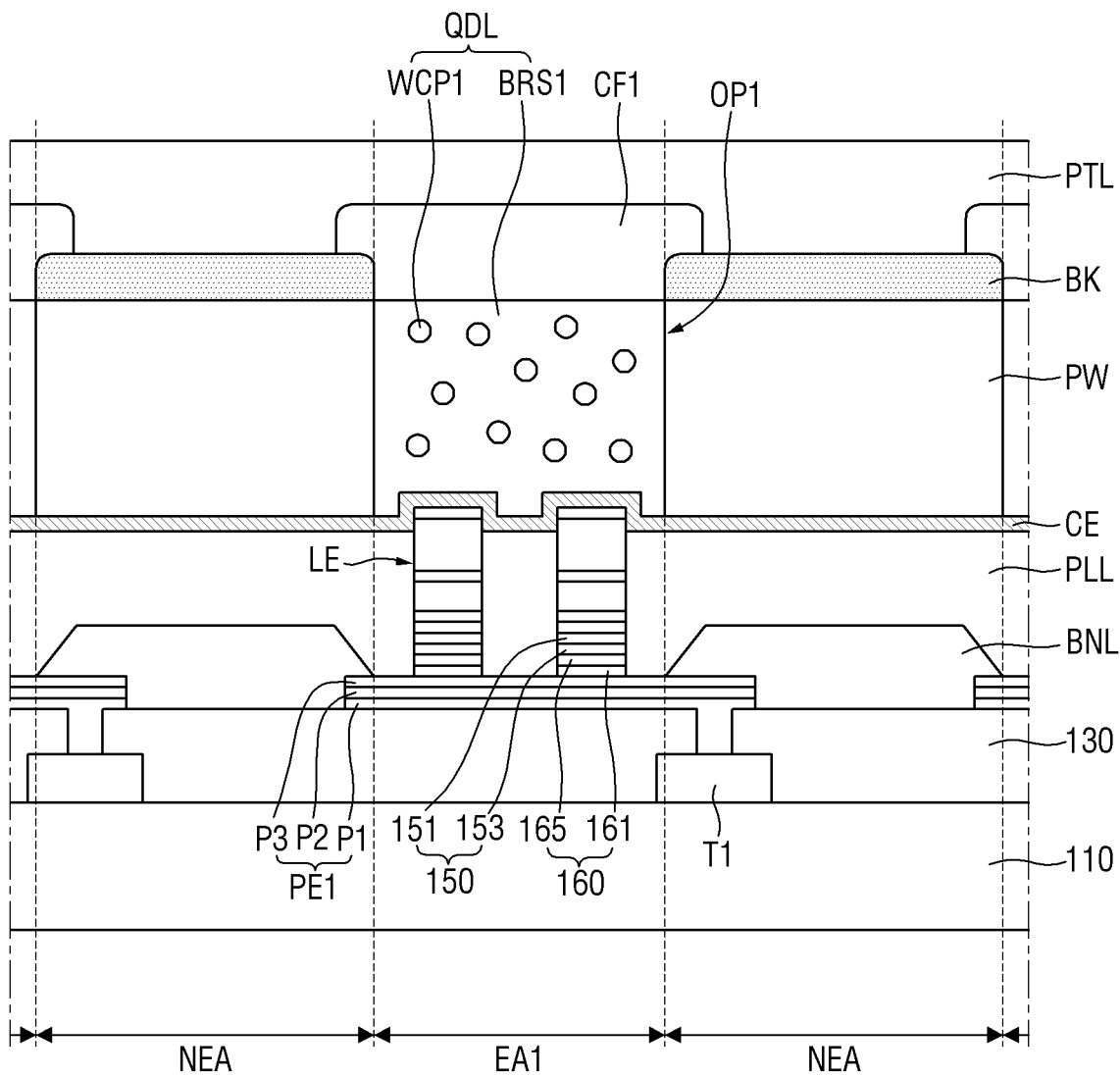

Referring to FIG. 27, the light-blocking member BK is formed on the partition wall PW. The light-blocking member BK is formed by applying a light-blocking material and patterning it. The light-blocking member BK may overlap the non-emission area NEA and may not overlap the emission area EA1.

Subsequently, the color filter CF1 is formed on the wavelength conversion layer QDL partitioned by the light-blocking member BK. The color filter CF1 may be formed via a photolithography process. The color filter CF1 may have, but is not limited to, a thickness of 1 µm or less.

A first color filter material layer is applied onto the partition wall PW and the wavelength conversion layer QDL and patterned via the photo process, to form the first color filter CF1 overlapping the first opening OP1. Likewise, other color filters are also formed to overlap the openings via a patterning process.

A protective layer PTL is formed on the light-blocking member BK and the color filter CF1, such that a display device 10 according to an embodiment is fabricated.

As described above with reference to FIGS. 16 to 27, in the display device 10 according to an embodiment, the contact electrodes 160 may be formed using the light-emitting elements LE as a mask, so that the lights emitted from the light-emitting elements LE may be reflected off the pixel electrodes PE1, PE2 and PE3 to improve the out-coupling efficiency.

It is possible to prevent the reflective electrode layer P2 thereunder from being etched by the etchant forming the contact electrode 160 by converting the upper electrode layer P3 of the pixel electrode into a polycrystalline phase.

FIGS. 28 to 40 are schematic cross-sectional views showing processing steps of fabricating a display panel according to an embodiment.

An embodiment of FIGS. 28 to 40 may be different from an embodiment of FIGS. 16 to 27 in that films may be attached on light-emitting elements LE formed on a base substrate BSUB and the films may be stretched and detached, thereby attaching the light-emitting elements LE to the display substrate 100. The different processes will be described and the other processes identical to those described above with reference to FIGS. 16 to 27 will not be described.

Figure 28:
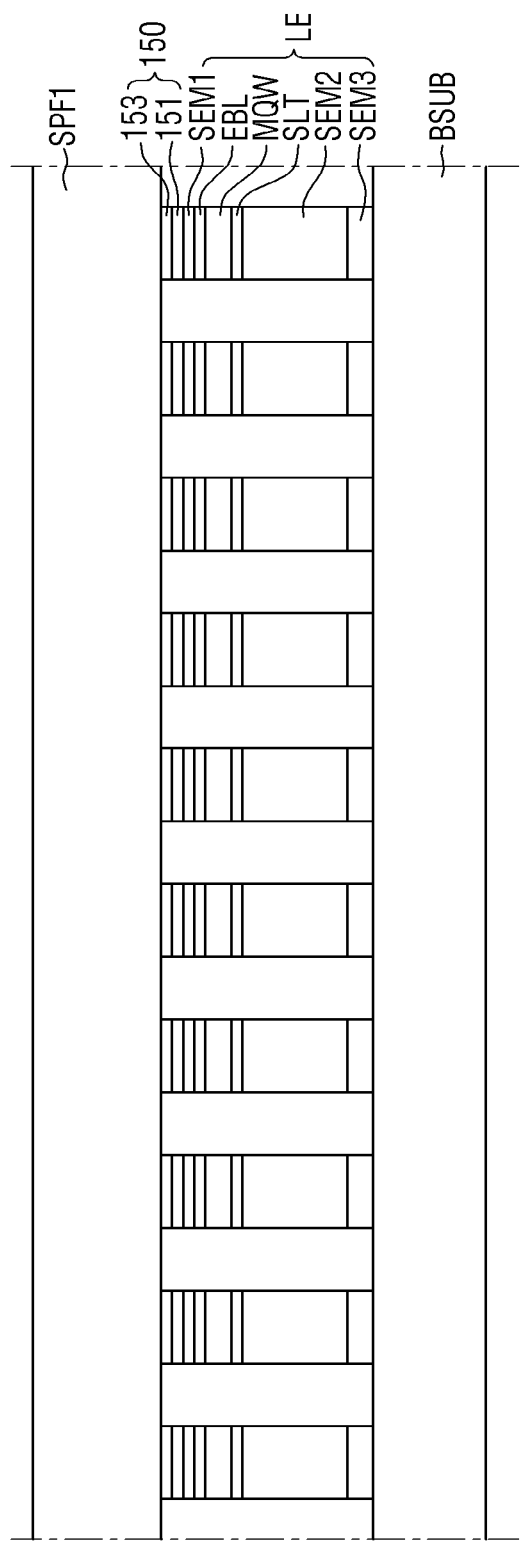
FIGS. 28 to 40 are schematic cross-sectional views showing processing steps of fabricating a display panel according to an embodiment.

Referring to FIG. 28, a first support film SPF1 is attached on light-emitting elements LE of the base substrate BSUB fabricated in the example shown in FIG. 18.

The first support film SPF1 is attached on the light-emitting elements LE. The first support film SPF1 may be aligned on the light-emitting elements LE and attached to the connection electrodes 150 of the light-emitting elements LE. As a number of light-emitting elements LE are attached to the first support film SPF1, the first support film SPF1 can be attached reliably without being detached.

The first support film SPF1 may include a support layer and an adhesive layer disposed on the support layer. The support layer may be made of a material that is transparent and has mechanical stability to allow light to pass therethrough. For example, the support layer may include a transparent polymer such as polyester, polyacrylic, polyepoxy, polyethylene, polystyrene, polyethylene terephthalate, within the spirit and the scope of the disclosure. The adhesive layer may include an adhesive material for bonding the light-emitting elements LE. For example, the adhesive material may include urethane acrylate, epoxy acrylate, polyester acrylate, within the spirit and the scope of the disclosure. The adhesive material may be a material whose adhesive strength changes as ultraviolet (UV) light or heat is applied, and thus the adhesive layer can be readily separated from the light-emitting elements LE.

Figure 29:
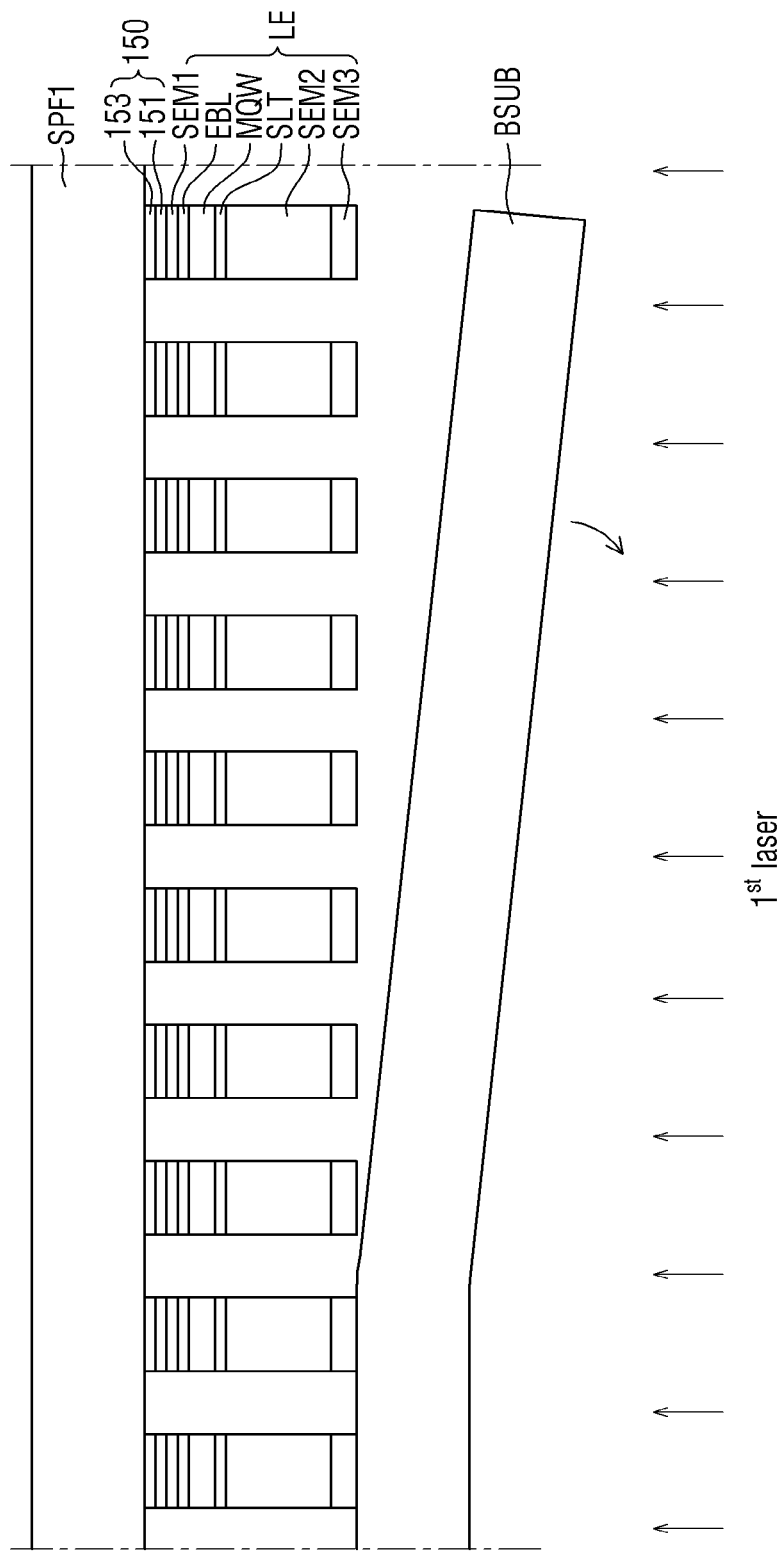

Subsequently, referring to FIG. 29, the base substrate BSUB is separated by irradiating it with a laser ($1^{st}$ laser). The base substrate BSUB is separated from the third semiconductor layers SEM3 of the light-emitting elements LE. The process of separating the base substrate BSUB has been described above; and, therefore, the redundant descriptions will be omitted.

Figure 30:
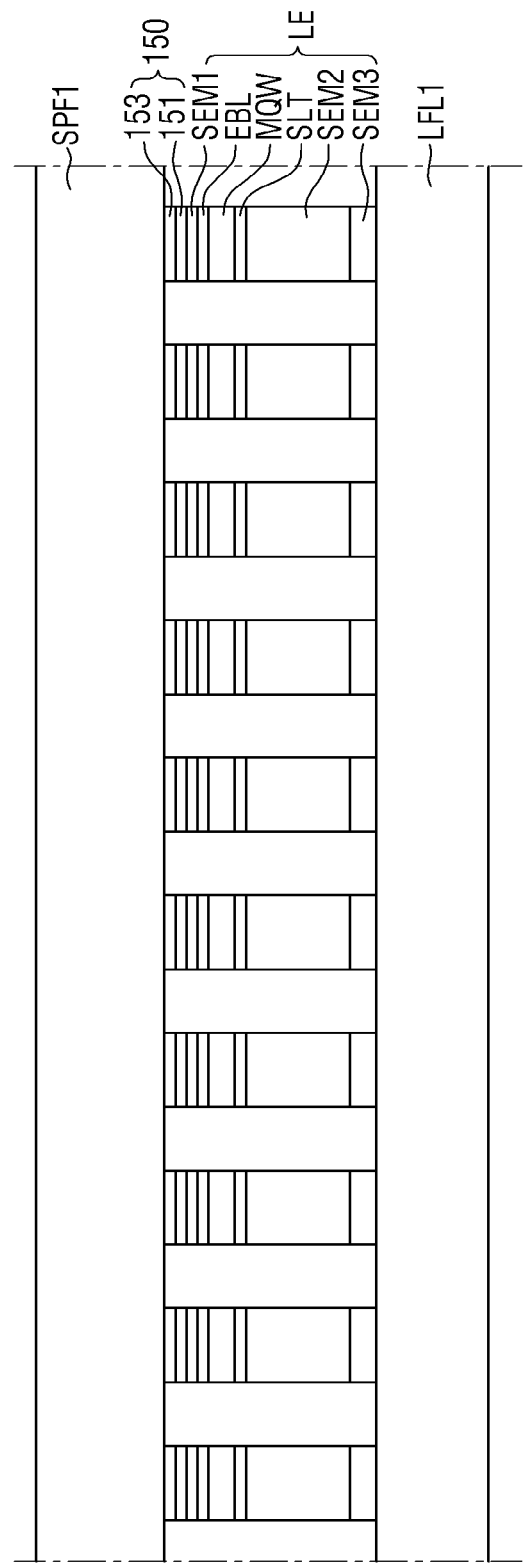

Subsequently, referring to FIG. 30, a first transfer film LFL1 is attached to the light-emitting elements LE after the base substrate BSUB has been separated.

The first transfer film LFL1 is attached on the third semiconductor layers SEM3 of the light-emitting elements LE. The first transfer film LFL1 may be aligned on the light-emitting elements LE and may be attached to the third semiconductor layers SEM3 of the light-emitting elements LE.

The first transfer film LFL1 may include a stretchable material. Examples of the stretchable material may include, for example, polyolefine, polyvinyl chloride (PVC), elastomeric silicone, elastomeric polyurethane, elastomeric polyisoprene, within the spirit and the scope of the disclosure. Like the above-described first support film SPF1, the first transfer film LFL1 may also include a support layer and an adhesive layer, to adhere and support the light-emitting elements LE.

Figure 31:
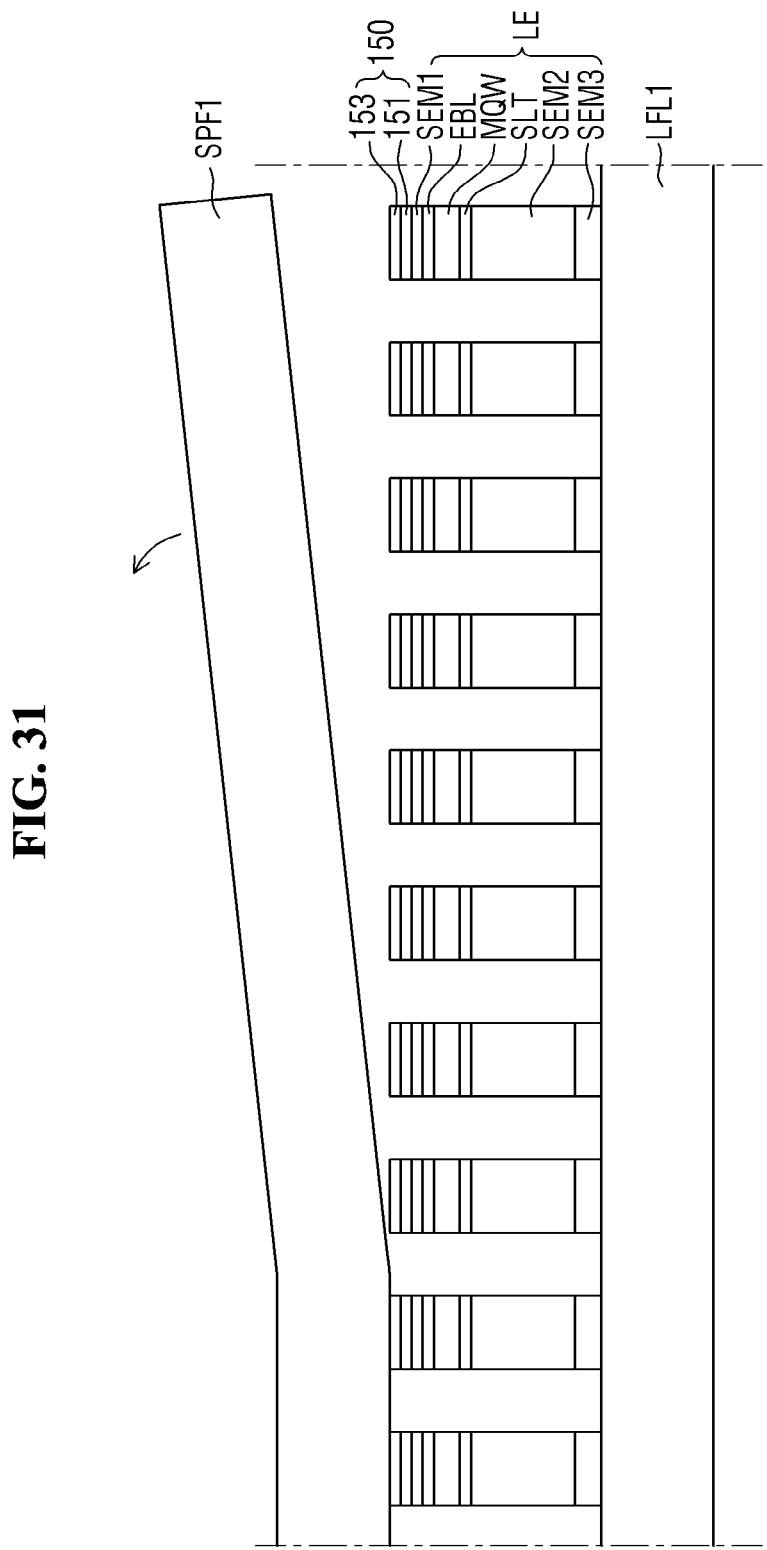
Figure 32:
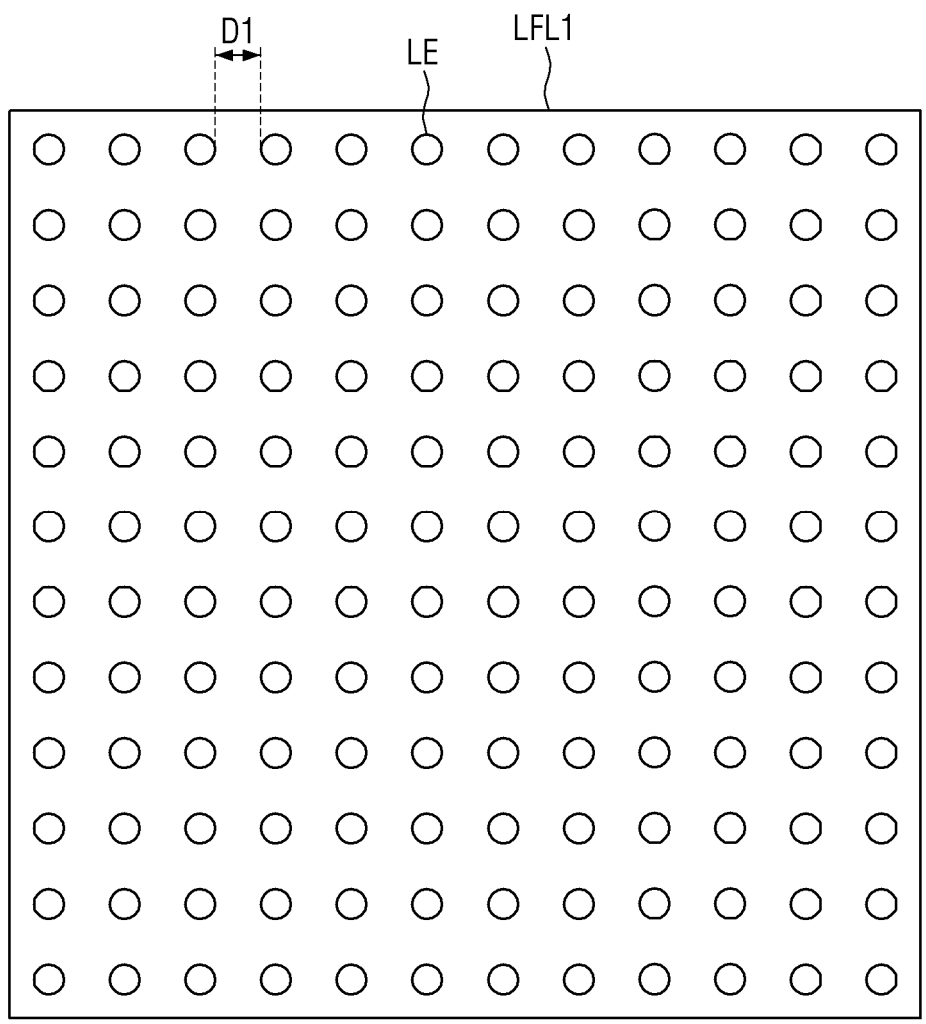

Subsequently, referring to FIGS. 31 and 32, the first support film SPF1 is separated from the light-emitting elements LE. After UV light or heat is applied to the first support film SPF1 to reduce the adhesive strength of the adhesive layer of the first support film SPF1, the first support film SPF1 may be physically or naturally separated. The light-emitting elements LE may be spaced apart from one another by a first distance D1 on the first transfer film LFL1 and may be arranged in a dot pattern.

Figure 33:
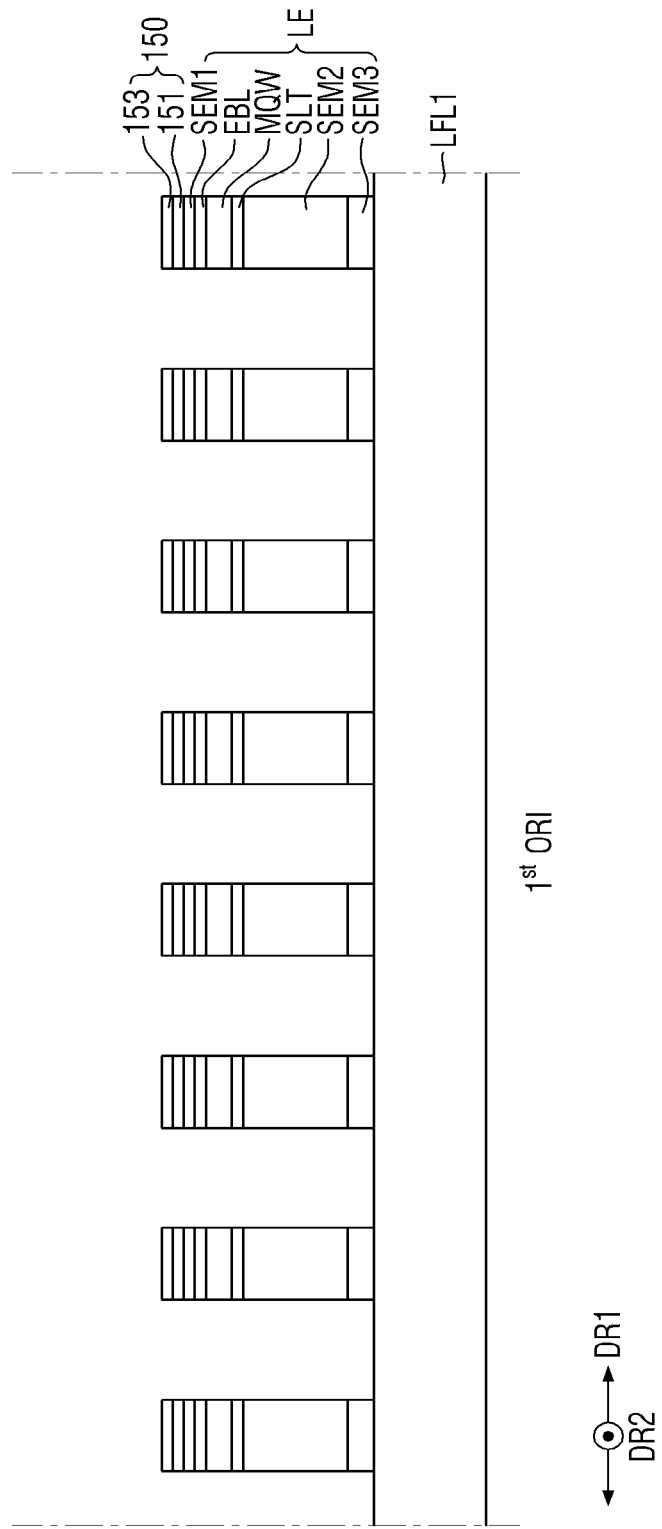
Figure 34:
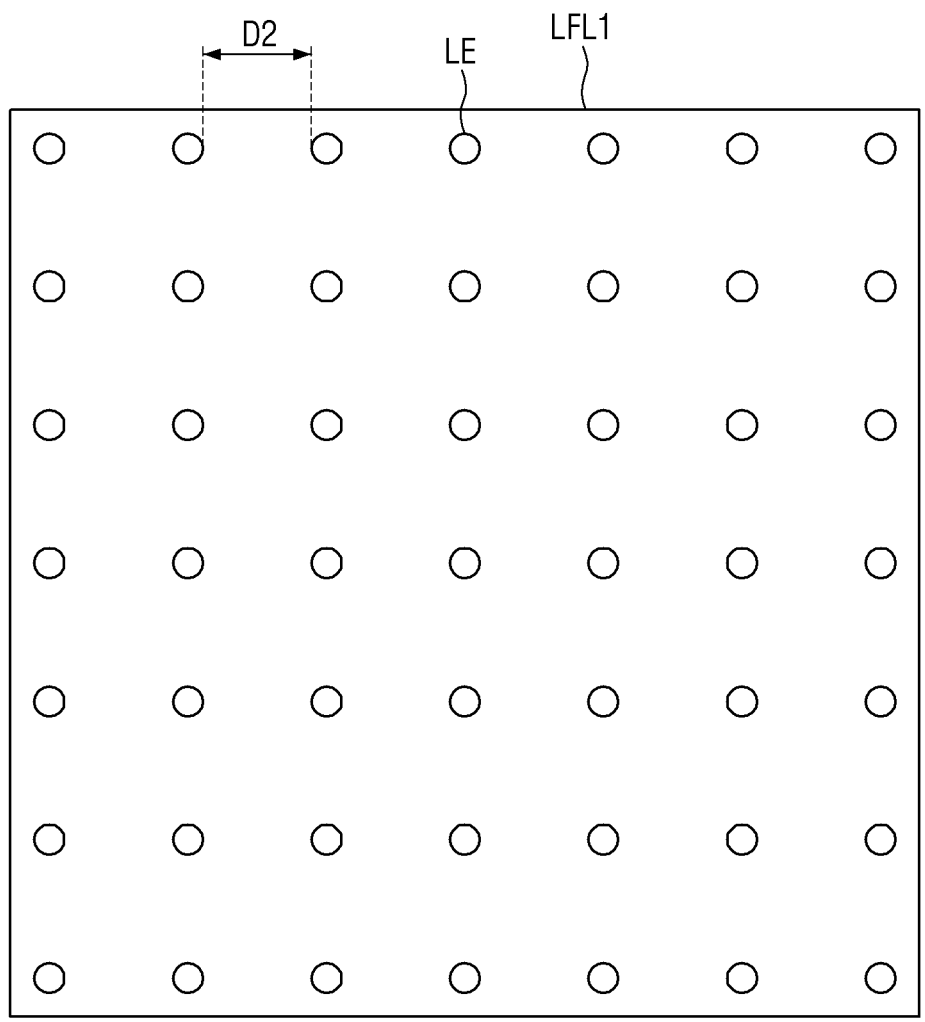

Subsequently, referring to FIGS. 33 and 34, the first transfer film LFL1 is stretched ($1^{st}$ ORI). The first transfer film LFL1 may be two-dimensionally stretched in the first direction DR1 and the second direction DR2. As the first transfer film LFL1 is stretched, the light-emitting elements LE attached to the first transfer film LFL1 may be spaced apart from one another by a second distance D2. The light-emitting elements LE may be uniformly spaced apart from one another by the second distance D2 greater than the first distance D1.

The stretching strength (or tensile strength) of the first transfer film LFL1 may be adjusted depending on the desired second distance D2 of the light-emitting elements LE, for example, approximately 120 gf/inch. It should be understood, however, that the disclosure is not limited thereto. The stretching strength (or tensile strength) may be adjusted according to the second distance D2.

Figure 35:
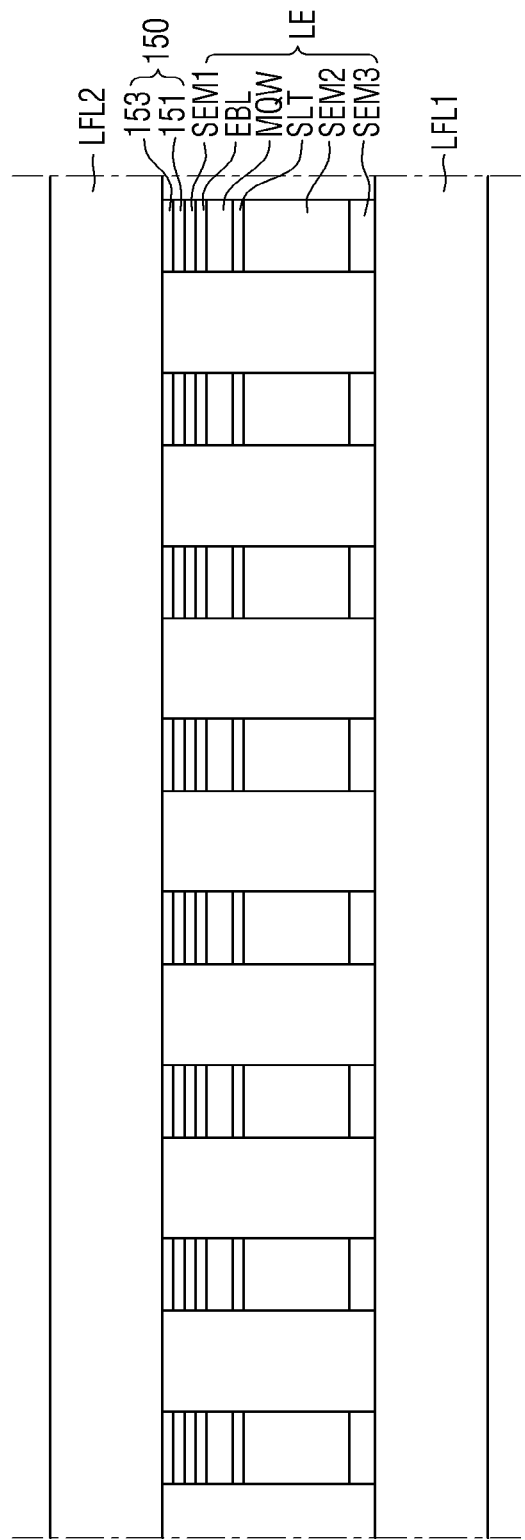

Subsequently, referring to FIG. 35, a second transfer film LFL2 is attached on the light-emitting elements LE from which the first support film SPF1 has been separated. The second transfer film LFL2 may be aligned on the light-emitting elements LE and may be attached to the connection electrodes 150 of the light-emitting elements LE. The second transfer film LFL2 may include a support layer and an adhesive layer like the above-described first transfer film LFL1, and a detailed description thereon will be omitted because it has been described above.

Figure 36:
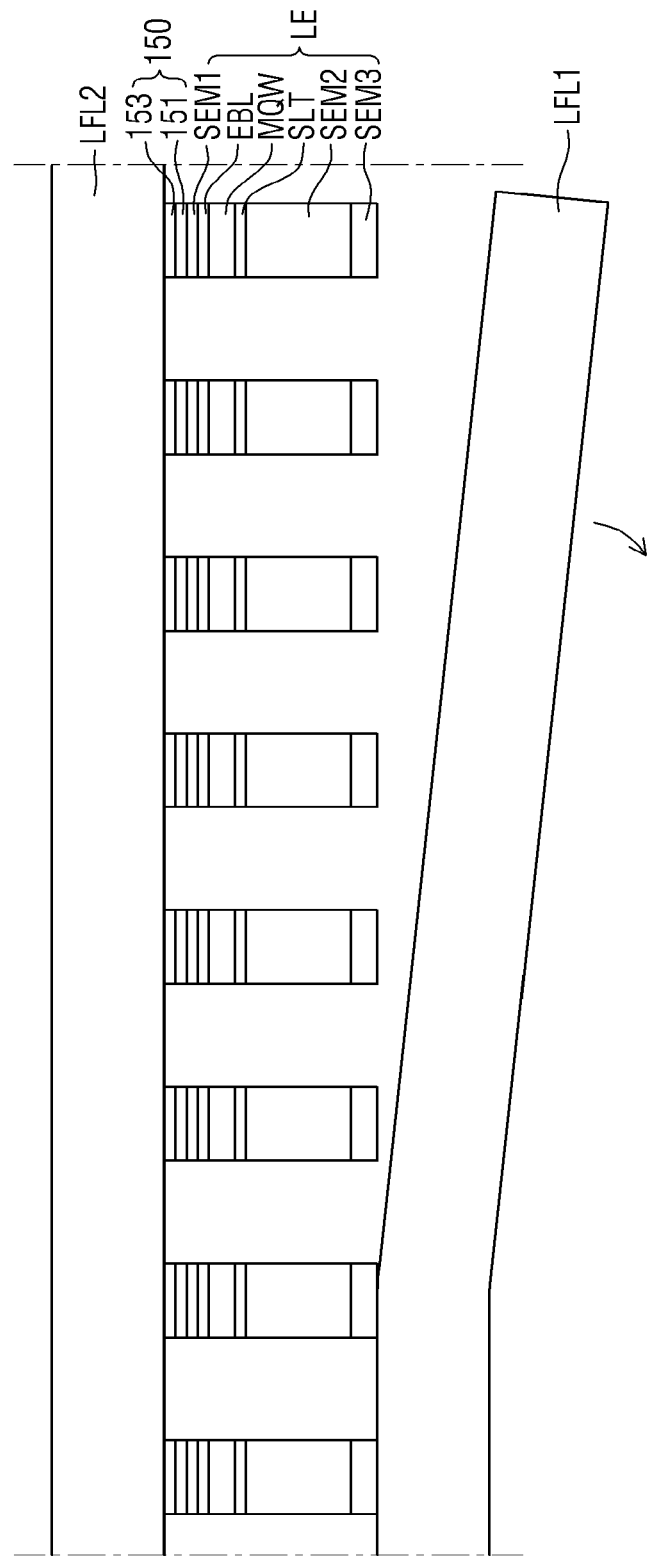

Subsequently, referring to FIG. 36, the first transfer film LFL1 is separated from the light-emitting elements LE. After UV light or heat is applied to the first transfer film LFL1 to reduce the adhesive strength of the adhesive layer of the first transfer film LFL1, the first transfer film LFL1 may be physically or naturally separated.

Figure 37:
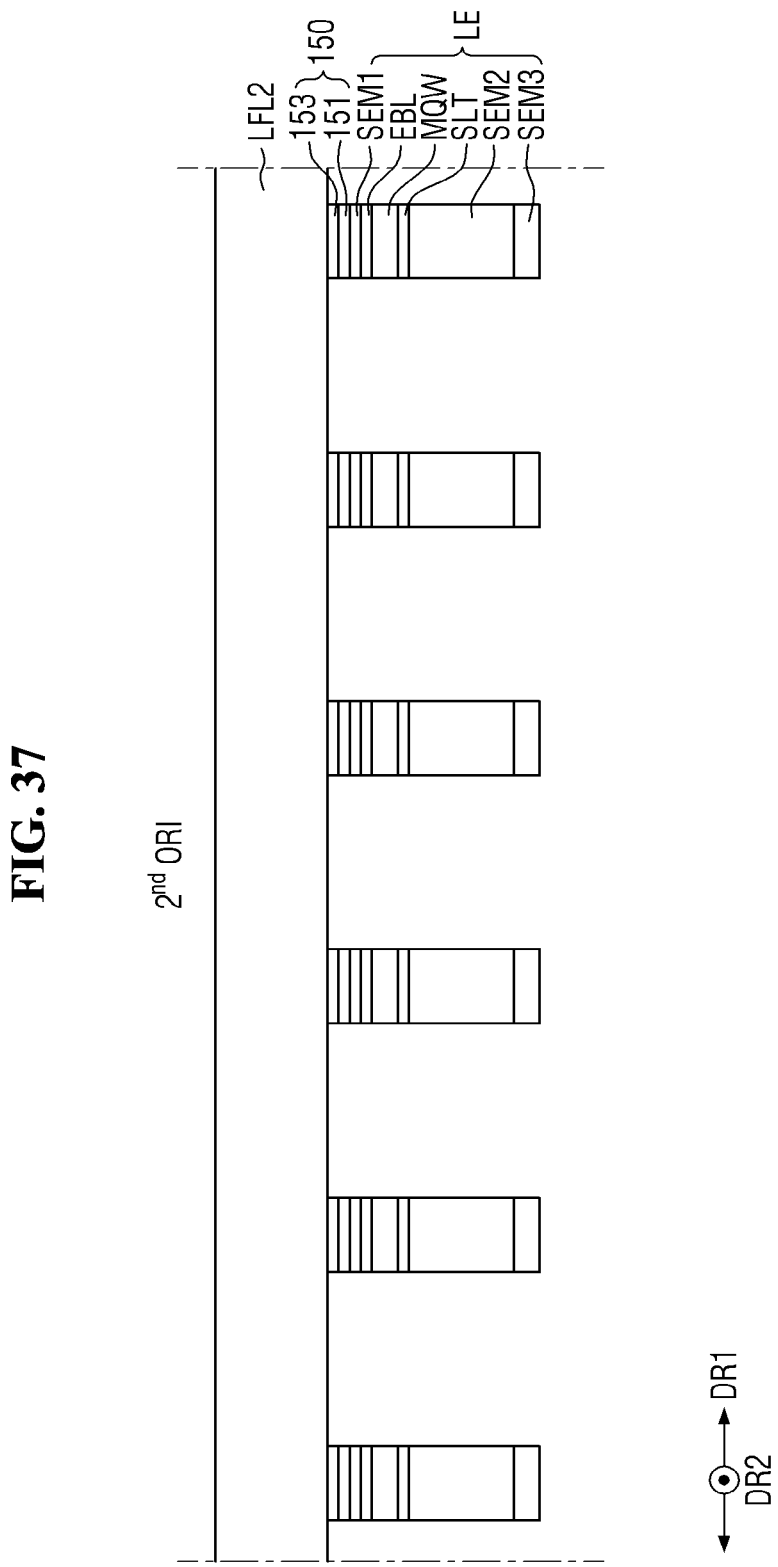
Figure 38:
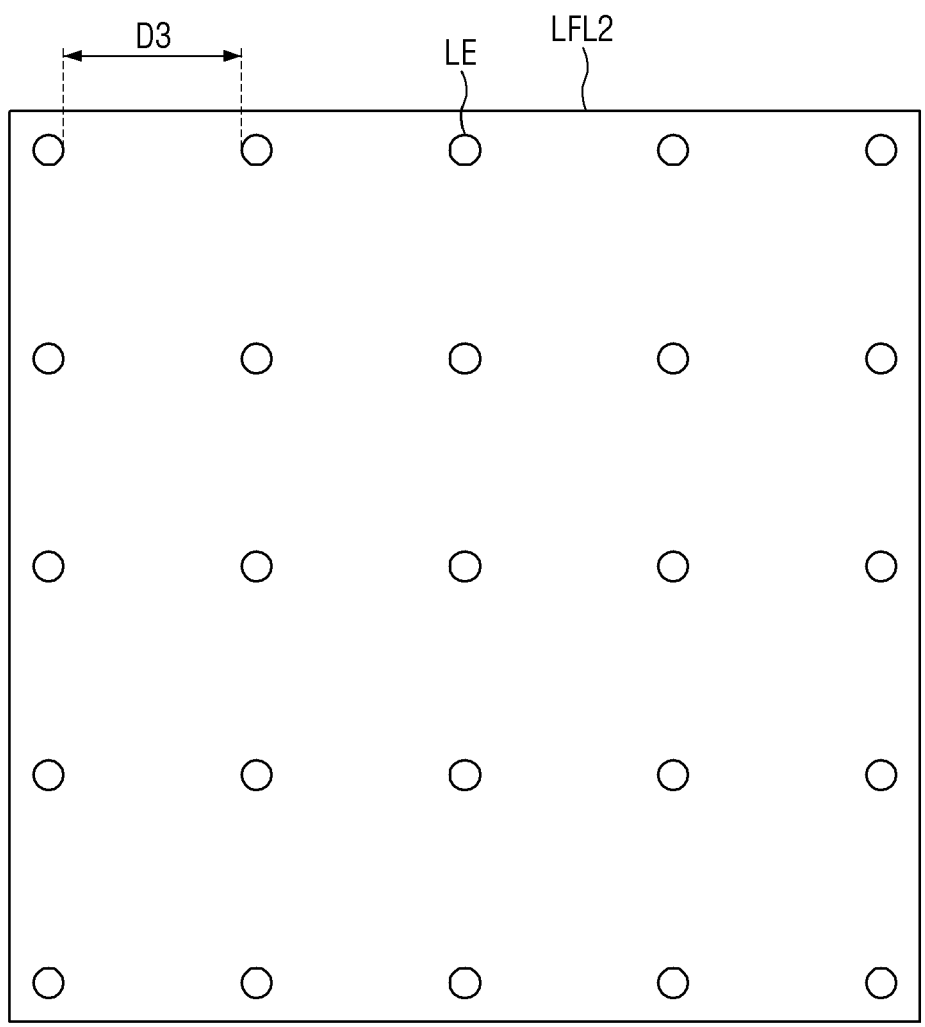

Subsequently, referring to FIGS. 37 and 38, the second transfer film LFL2 is stretched ($2^{nd}$ ORI). The second transfer film LFL2 may be two-dimensionally stretched in the first direction DR1 and the second direction DR2. As the second transfer film LFL2 is stretched, the light-emitting elements LE attached to the second transfer film LFL2 may be spaced apart from one another by a third distance D3. The light-emitting elements LE may be uniformly spaced apart from one another by the third distance D3 greater than the second distance D2.

The stretching strength (or tensile strength) of the second transfer film LFL2 may be adjusted depending on the desired third distance D3 of the light-emitting elements LE, for example, approximately 270 gf/inch. It should be understood, however, that the disclosure is not limited thereto. The stretching strength (or tensile strength) may be adjusted according to the third distance D3.

Figure 39:
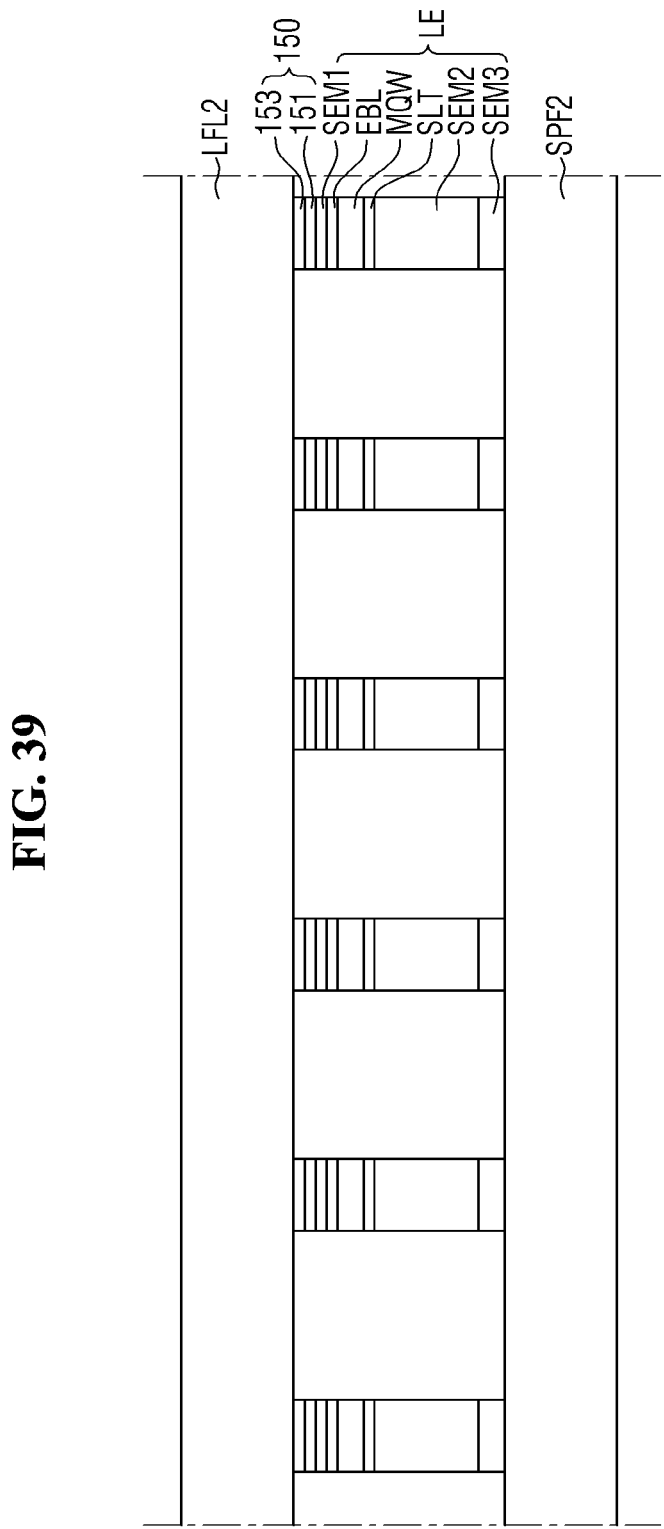

Subsequently, referring to FIG. 39, a second support film SPF2 is attached on the light-emitting elements LE from which the first transfer film LFL1 has been separated. The second support film SPF2 may be aligned on the light-emitting elements LE and may be attached to the third semiconductor layers SEM3 of the light-emitting elements LE. The second support film SPF2 is identical to the first support film SPF1; and, therefore, the redundant descriptions will be omitted.

Figure 40:
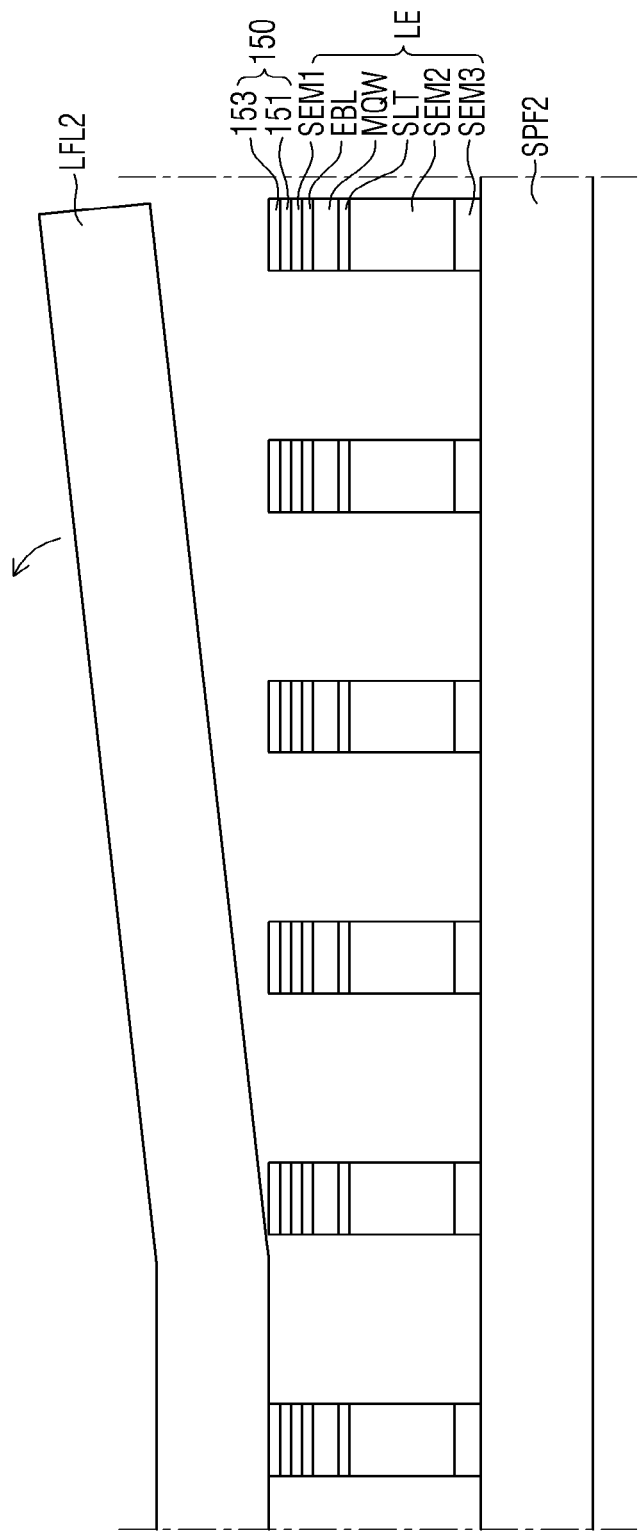

Subsequently, referring to FIG. 40, the second transfer film LFL2 is separated. The second transfer film LFL2 attached to the connection electrodes 150 of the light-emitting elements LE are separated. The process of separating the second transfer film LFL2 is identical to that of the first transfer film LFL1 described above; and, therefore, the redundant descriptions will be omitted. The second transfer film LFL2 may be separated and removed from the connection electrodes 150 of the light-emitting elements LE.

Subsequently, the second support film SPF2 is attached on the first substrate 110 to adhere the light-emitting elements LE on the first substrate 110, and the processes described above with reference to FIGS. 18 to 25 are carried out, to fabricate the display device 10.

According to this embodiment, by fabricating the display device 10 using the transfer films, the density of the light-emitting elements LE can be adjusted appropriately for the pixel size. Accordingly, it is possible to readily form a display device by disposing the light-emitting elements LE that can be arranged differently for different pixel sizes.

Figure 41:
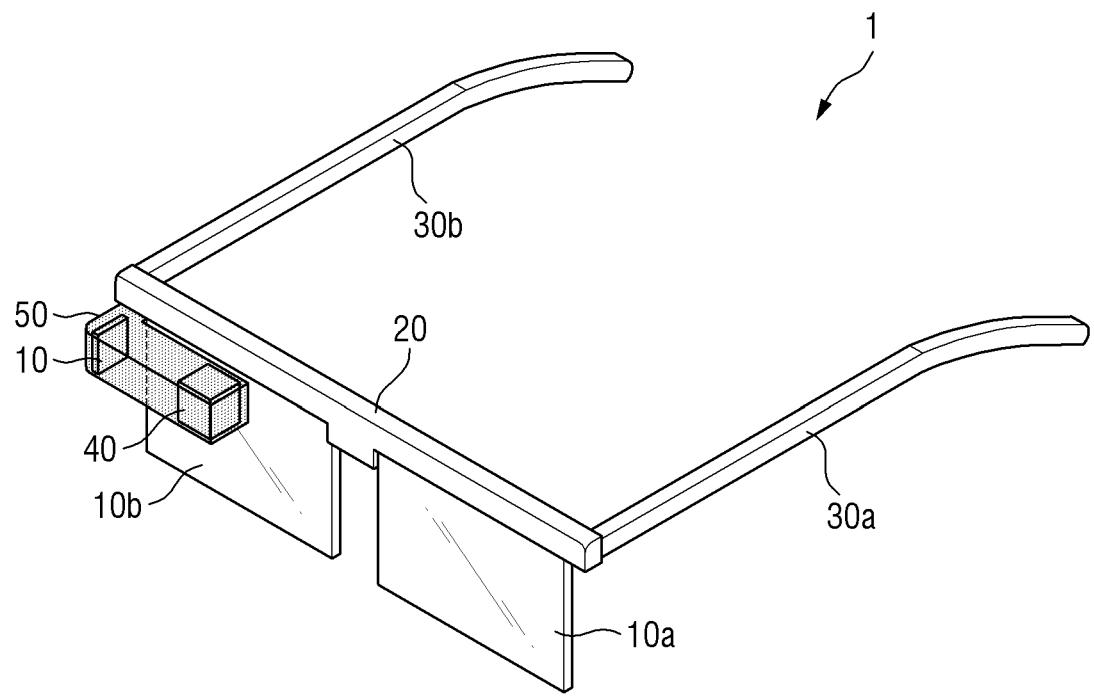
FIG. 41 is a view showing an example of a virtual reality device including a display device according to an embodiment.

FIG. 41 is a view showing an example of a virtual reality device including a display device according to an embodiment. FIG. 41 shows a virtual reality device 1 employing a display device 10 according to an embodiment.

Referring to FIG. 41, the virtual reality device 1 according to an embodiment may be a device in the form of glasses. The virtual reality device 1 according to an embodiment may include the display device 10, a left eye lens 10a, a right eye lens 10b, a support frame 20, eyeglass temples 30a and 30b, a reflective member 40, and a display case 50.

Although FIG. 41 shows the virtual reality device 1 including the eyeglass temples 30a and 30b, a head mounted display with a head strap, instead of the eyeglass temples 30a and 30b, may be employed as the virtual reality device 1 according to an embodiment. For example, the virtual reality device 1 is not limited to that shown in FIG. 41 but may be applied in a variety of electronic devices in a variety of forms.

The display device case 50 may include the display device 10 and the reflective member 40. An image displayed on the display device 10 may be reflected by the reflective member 40 and provided to the user's right eye through the right eye lens 10b. Accordingly, the user may watch a virtual reality image displayed on the display device 10 through the right eye.

Although the display case 50 is disposed at the right end of the support frame 20 in the example shown in FIG. 41, embodiments are not limited thereto. For example, the display case 50 may be disposed at the left end of the support frame 20. An image displayed on the display device 10 is reflected by the reflective member 40 and provided to the user's left eye through the left eye lens 10a. Accordingly, the user may watch a virtual reality image displayed on the display device 10 through the left eye. For example, the display device cases 50 may be disposed at both the left and right ends of the support frame 20, respectively. The user can watch a virtual reality image displayed on the display device 10 through both the left and right eyes.

Figure 42:
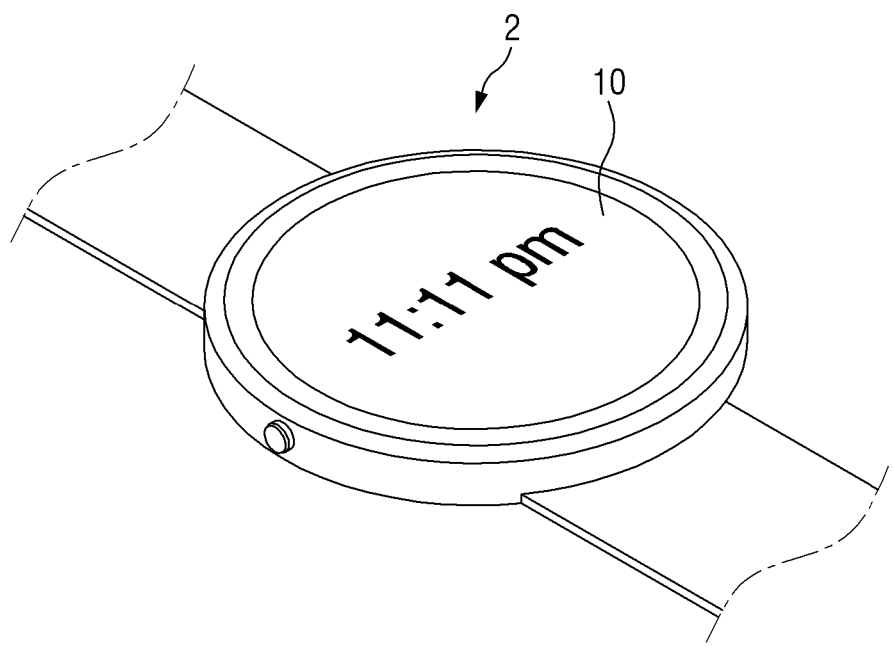
FIG. 42 is a view showing an example of a smart device including a display device according to an embodiment.

FIG. 42 is a view showing an example of a smart device including a display device according to an embodiment.

Referring to FIG. 42, a display device 10 according to an embodiment may be applied to a smart watch 2 which is a kind of smart devices.

Figure 43:
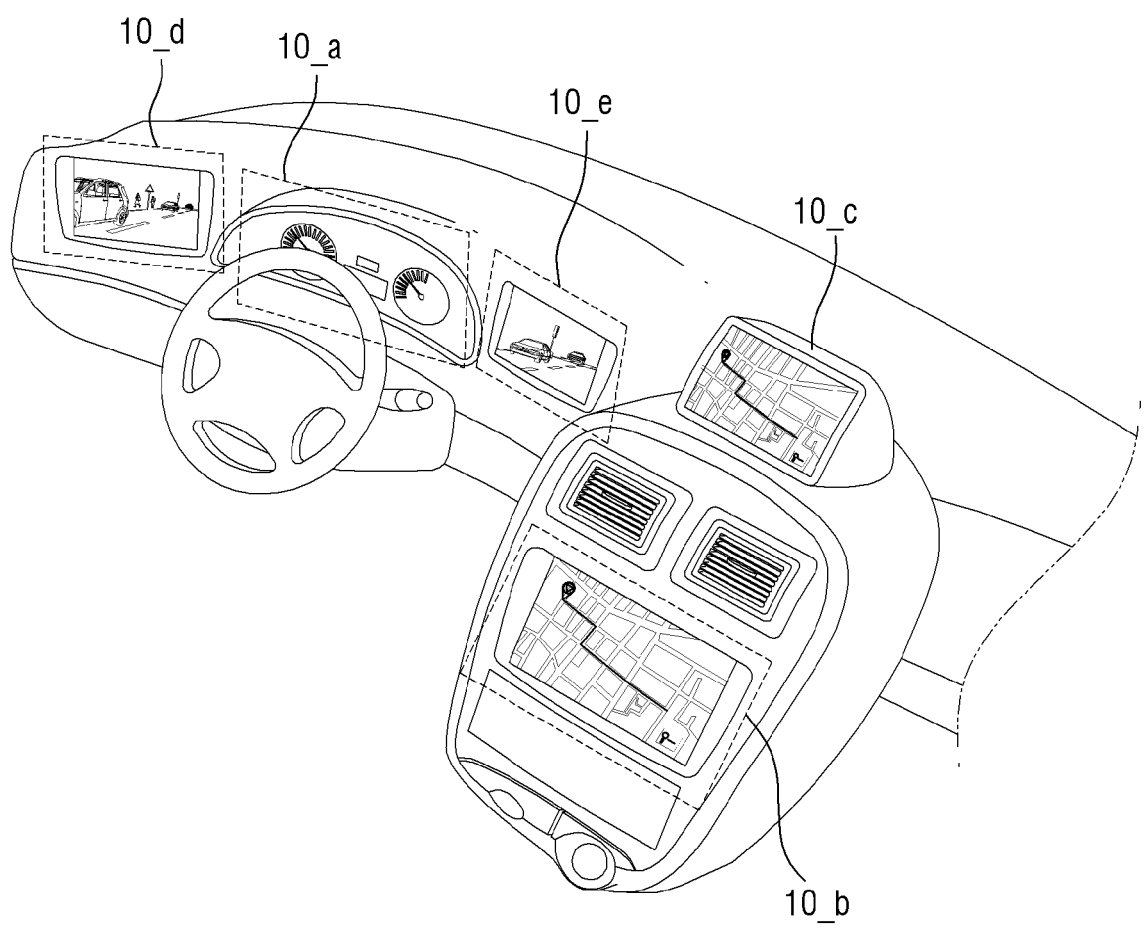
FIG. 43 is a view showing an example of a vehicle including a display device according to an embodiment.

FIG. 43 is a view showing an example of a vehicle including a display device according to an embodiment. FIG. 43 shows a vehicle in which display devices 10 according to an embodiment are employed.

Referring to FIG. 43, display devices 10_a, 10_b and 10_c according to an embodiment may be applied to the instrument cluster of a vehicle, may be applied to the center fascia of a vehicle, or may be applied to a center information display (CID) disposed on the dashboard of a vehicle. The display devices 10_d and 10_e according to an embodiment may be applied to room mirror displays, which can replace side mirrors of the vehicle.

Figure 44:
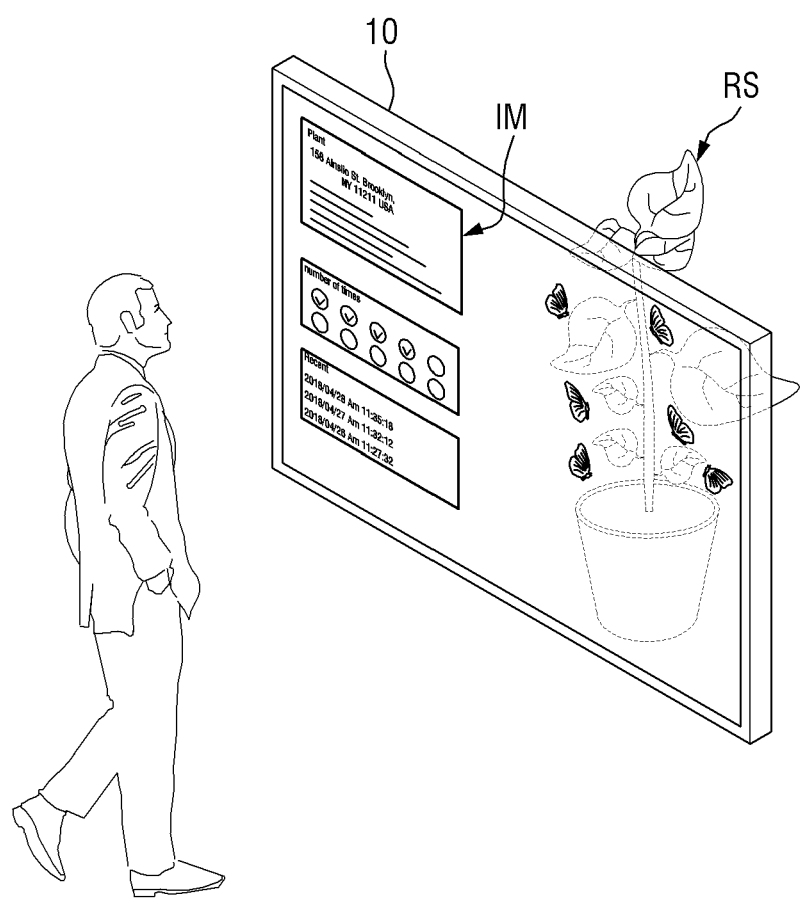
FIG. 44 is a view showing an example of a transparent display device including a display device according to an embodiment.

FIG. 44 is a view showing an example of a transparent display device including a display device according to an embodiment.

Referring to FIG. 44, a display device 10 according to an embodiment may be applied to a transparent display device. The transparent display device may transmit light while displaying images IM. Therefore, a user located on the front side of the transparent display device can not only watch the images IM displayed on the display device 10 but also watch an object RS or the background located on the rear side of the transparent display device. In case that the display device 10 is applied to the transparent display device, the first substrate 110 of the display device 10 shown in FIG. 4 may include a light-transmitting portion that can transmit light or may be made of a material that can transmit light.

In concluding the detailed description, those skilled in the art will appreciate that many variations and modifications can be made to the embodiments without substantially departing from the principles of the disclosure. Therefore, the disclosed embodiments are used in a generic and descriptive sense only and not for purposes of limitation.

What is claimed is:

1. A display device comprising:
   a pixel electrode disposed on a substrate and comprising:
      a reflective electrode layer; and
      an upper electrode layer;
   a contact electrode disposed on the pixel electrode;
   light-emitting elements disposed on the contact electrode and disposed perpendicular to the pixel electrode;
   a planarization layer disposed on the pixel electrode, planarization layer filling a space between the light-emitting elements; and
   a common electrode disposed on the planarization layer and the light-emitting elements, wherein
   a size of the contact electrode is equal to a size of each of the light-emitting elements in a plan view, and
   the upper electrode layer is disposed on the reflective electrode layer and is in a polycrystalline phase.

2. The display device of claim 1, wherein the contact electrode comprises:
   a first contact layer electrically contacting the upper electrode layer; and
   a second contact layer disposed on the first contact layer and electrically contacting the light-emitting elements.

3. The display device of claim 2, wherein
   the upper electrode layer comprises at least one of polycrystalline ITO, polycrystalline IZO, polycrystalline ZnO, polycrystalline ITZO, polycrystalline MgO and polycrystalline TiO$_2$, and
   the first contact layer comprises titanium, and the second contact layer comprises copper or gold.

4. The display device of claim 1, wherein
   each of the light-emitting elements comprises a connection electrode, and
   the connection electrode comprises a connection layer electrically contacting the contact electrode and a reflective layer disposed on the connection layer.

5. The display device of claim 4, wherein
   the connection layer comprises an alloy of copper, silver and tin, and
   the reflective layer comprises aluminum.

6. The display device of claim 4, wherein a size of the connection electrode is equal to a size of the contact electrode in a plan view.

7. The display device of claim 1, further comprising:
a bank overlapping an edge of the pixel electrode in a plan view and partitioning between an emission area and a non-emission area.

8. The display device of claim 1, wherein sides of the contact electrode are aligned with and coincide with sides of the light-emitting elements.

9. The display device of claim 1, wherein
the pixel electrode comprises a lower electrode layer disposed below the reflective electrode layer, and
the lower electrode layer and the upper electrode layer comprise a same material.

10. A display device comprising:
a pixel electrode disposed on a substrate and comprising:
a reflective electrode layer; and
an upper electrode layer;
a contact electrode disposed on the pixel electrode and comprising:
a first contact layer; and
a second contact layer;
light-emitting elements disposed on the contact electrode and disposed perpendicular to the pixel electrode;
a planarization layer disposed on the pixel electrode, the planarization layer filling a space between the light-emitting elements; and
a common electrode disposed on the planarization layer and the light-emitting elements, wherein
a size of the first contact layer is equal to a size of the pixel electrode in a plan view, and
a size of the second contact layer is equal to a size of each of the light-emitting elements in a plan view.

11. The display device of claim 10, wherein the upper electrode layer is disposed on the reflective electrode layer and is in a polycrystalline phase.

12. The display device of claim 10, wherein
the first contact layer electrically contacts the upper electrode layer, and
the second contact layer electrically contacts the light-emitting elements.

13. The display device of claim 10, wherein
the upper electrode layer comprises at least one of polycrystalline ITO, polycrystalline IZO, polycrystalline ZnO, polycrystalline ITZO, polycrystalline MgO, and polycrystalline $TiO_2$, and
the first contact layer comprises titanium, and the second contact layer comprises copper or gold.

14. The display device of claim 10, wherein
each of the light-emitting elements comprises a connection electrode, and
the connection electrode comprises a connection layer electrically contacting the contact electrode and a reflective layer disposed on the connection layer.

15. The display device of claim 14, wherein each of the light-emitting elements comprises
a first semiconductor layer disposed on the reflective layer;
an active layer disposed on the first semiconductor layer;
a second semiconductor layer disposed on the active layer; and
a third semiconductor layer disposed on the second semiconductor layer.

16. The display device of claim 10, wherein the light-emitting elements at least partially protrude above the planarization layer.

17. A method of fabricating a display device, the method comprising:
forming light-emitting elements on a base substrate;
forming a first substrate comprising a pixel electrode layer and a contact electrode layer;
adhering the light-emitting elements to the contact electrode layer by attaching the base substrate to the first substrate;
separating the base substrate from the light-emitting elements by irradiating the base substrate with a laser;
forming a pixel electrode comprising a reflective electrode layer and an upper electrode layer and a contact electrode pattern by patterning the pixel electrode layer and the contact electrode layer, and converting the upper electrode layer into a polycrystalline phase;
forming a contact electrode by etching the contact electrode pattern using the light-emitting elements as a mask;
forming a planarization layer on the pixel electrode; and
forming a common electrode on the planarization layer.

18. The method of claim 17, wherein the converting of the upper electrode layer into the polycrystalline phase comprises performing heat treatment on the first substrate at a temperature in a range of about 150 to about 200 degrees Celsius.

19. The method of claim 17, wherein the forming of the contact electrode comprises masking the reflective electrode layer from an etchant using the polycrystalline upper electrode layer.

20. The method of claim 17, wherein the light-emitting elements at least partially protrude above the planarization layer and are electrically connected to the common electrode.

* * * * *